(12) United States Patent
Nagahama et al.

(10) Patent No.: US 7,105,857 B2
(45) Date of Patent: Sep. 12, 2006

(54) NITRIDE SEMICONDUCTOR DEVICE COMPRISING BONDED SUBSTRATE AND FABRICATION METHOD OF THE SAME

(75) Inventors: Shinichi Nagahama, Anan (JP); Masahiko Sano, Anan (JP); Tomoya Yanamoto, Anan (JP); Keiji Sakamoto, Anan (JP); Masashi Yamamoto, Anan (JP); Daisuke Morita, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/614,342

(22) Filed: Jul. 8, 2003

(65) Prior Publication Data

US 2004/0072383 A1    Apr. 15, 2004

(30) Foreign Application Priority Data

| Jul. 8, 2002 | (JP) | P 2002-198761 |
| Jul. 26, 2002 | (JP) | P 2002-218199 |
| Sep. 20, 2002 | (JP) | P 2002-276309 |
| Jan. 10, 2003 | (JP) | P 2002-004919 |
| Jul. 2, 2003 | (JP) | P 2003-190549 |

(51) Int. Cl.
   *H01L 31/12*   (2006.01)
(52) U.S. Cl. .......................... 257/86; 257/31; 257/103; 257/E33.028; 257/E33.03
(58) Field of Classification Search .................. 257/31, 257/86, 103, E33.026, E33.041
   See application file for complete search history.

(56) References Cited

U.S. PATENT DOCUMENTS

| 5,376,580 A | 12/1994 | Kish et al. |
| 5,502,316 A | 3/1996 | Kish et al. |
| 5,599,403 A * | 2/1997 | Kariya et al. ............... 136/258 |
| 5,909,081 A | 6/1999 | Eida et al. |
| 5,959,316 A | 9/1999 | Lowery ........................ 257/98 |
| 6,409,938 B1 | 6/2002 | Comanzo |

(Continued)

FOREIGN PATENT DOCUMENTS

EP    1 061 590    12/2000

(Continued)

OTHER PUBLICATIONS

Morita et al. "High Output Power 365nm Ultraviolet Light Emitting Diode of GaN-Free Structure", Jpn. J. Appln. Phys. vol. 41, Part 2, No. 12B Dec. 2002, pp. L1434-L1436.

(Continued)

*Primary Examiner*—Allan R. Wilson
(74) *Attorney, Agent, or Firm*—Morrison & Foerster LLP

(57) ABSTRACT

A substrate 1 for growing nitride semiconductor has a first and second face and has a thermal expansion coefficient that is larger than that of the nitride semiconductor. At least n-type nitride semiconductor layers 3 to 5, an active layer 6 and p-type nitride semiconductor layers 7 to 8 are laminated to form a stack of nitride semiconductor on the first face of the substrate 1. A first bonding layer including more than one metal layer is formed on the p-type nitride semiconductor layer 8. A supporting substrate having a first and second face has a thermal expansion coefficient that is larger than that of the nitride semiconductor and is equal or smaller than that of the substrate 1 for growing nitride semiconductor. A second bonding layer including more than one metal layer is formed on the first face of the supporting substrate. The first bonding layer 9 and the second bonding layer 11 are faced with each other and, then, pressed with heat to bond together. After that, the substrate 1 for growing nitride semiconductor is removed from the stack of nitride semiconductor so that a nitride semiconductor device is provided.

16 Claims, 21 Drawing Sheets

U.S. PATENT DOCUMENTS

| | | |
|---|---|---|
| 6,455,340 B1 * | 9/2002 | Chua et al. .................. 438/31 |
| 6,495,862 B1 | 12/2002 | Okazaki et al. ............. 257/103 |
| 6,661,030 B1 | 12/2003 | Komoto et al. |
| 6,692,136 B1 * | 2/2004 | Marshall et al. ............ 362/231 |
| 6,756,731 B1 | 6/2004 | Sano |
| 2001/0015443 A1 | 8/2001 | Komoto ....................... 257/81 |
| 2001/0017874 A1 | 8/2001 | Ishida ......................... 372/45 |
| 2001/0042866 A1 | 11/2001 | Coman et al. ............. 257/103 |
| 2003/0062530 A1 | 4/2003 | Okazaki et al. ............. 257/79 |
| 2003/0189215 A1 * | 10/2003 | Lee et al. ..................... 257/94 |
| 2004/0021407 A1 | 2/2004 | Baillie et al. |

FOREIGN PATENT DOCUMENTS

| | | |
|---|---|---|
| JP | 50-091292 | 7/1975 |
| JP | 52-004175 | 1/1977 |
| JP | 58-195276 | 11/1983 |
| JP | 61-007671 | 1/1986 |
| JP | 61-059886 | 3/1986 |
| JP | 61-182256 | 8/1986 |
| JP | 61-182292 | 8/1986 |
| JP | 61-183986 | 8/1986 |
| JP | 4-010418 | 1/1992 |
| JP | 4-029374 | 1/1992 |
| JP | 4-057329 | 2/1992 |
| JP | 5-029663 | 2/1993 |
| JP | 5-198689 | 8/1993 |
| JP | 6-232510 | 8/1994 |
| JP | 6-302857 | 10/1994 |
| JP | 7-086640 | 3/1995 |
| JP | 7-263553 | 10/1995 |
| JP | 9-008403 | 1/1997 |
| JP | 9-129932 | 5/1997 |
| JP | 10-117016 | 5/1998 |
| JP | 10-163525 A | 6/1998 |
| JP | 10-270761 | 10/1998 |
| JP | 11-068157 | 3/1999 |
| JP | 11-506872 | 6/1999 |
| JP | 11-214744 | 8/1999 |
| JP | 11-340518 | 12/1999 |
| JP | 2000-067673 | 3/2000 |
| JP | 2000-077723 | 3/2000 |
| JP | 2000-183408 | 6/2000 |
| JP | 2000-277804 | 6/2000 |
| JP | 2000-196141 | 7/2000 |
| JP | 2000-196152 | 7/2000 |
| JP | 2000-228537 | 8/2000 |
| JP | 2000-299503 | 10/2000 |
| JP | 2001-007394 | 1/2001 |
| JP | 2001-015817 | 1/2001 |
| JP | 2001-085747 | 3/2001 |
| JP | 2001-144331 | 5/2001 |
| JP | 2001-196645 | 7/2001 |
| JP | 2001-203385 | 7/2001 |
| JP | 2001-203392 | 7/2001 |
| JP | 2001-206710 | 7/2001 |
| JP | 2001-253294 | 9/2001 |
| JP | 2001-284641 | 10/2001 |
| JP | 2001-298214 | 10/2001 |
| JP | 2001-313422 | 11/2001 |
| JP | 2002-154900 | 5/2002 |
| WO | WO 97/00535 | 1/1997 |
| WO | WO 03/34508 | 4/2003 |

OTHER PUBLICATIONS

Office Action mailed Jul. 14, 2005, directed to related U.S. Appl. No. 10/673,273.

Office Action mailed Nov. 4, 2005, directed to related U.S. Appl. No. 10/673,273.

Wong, W. S. et al. (2000) "$In_xGa_{1-x}N$ Light Emitting Diodes on Si Substrates Fabricated by Pd-In Metal Bonding and Laser Lift-Off," *Applied Physics Letters* 77(18), pp. 2822-2824.

Kneissl, Michael et al. (2001) "Continuous-Wave Operation of InGaN Multiple-Quantum-Well Laser Diodes on Copper Substrates Obtained by Laser Liftoff," IEEE Journal on Selected Topics in Quantum Electronics 7(2), pp. 188-191.

Japanese Office Action mailed Feb. 21, 2006, directed to counterpart JP Application No. 2003-190549.

Han, J. et al. (1998). "AlGaN/GaN Quantum Well Ultraviolet Light Emitting Diodes," *Applied Physics Letters* 73(12):1688-1690.

Iwaya, M. et al. (2002). "Suppression of Phase Separation of AlGaN During Lateral Growth and Fabrication of High-efficiency UV-LED on Optimized AlGaN," *Journal of Crystal Growth* 237-239:951-955.

Shatalov, M. et al. (2002). "Deep Ultraviolet Light-Emitting Diodes Using Quaternary AlInGaN Multiple Quantum Wells," *IEEE Journal on Selected Topics in Quantum Electronics* 8(2):302-309.

* cited by examiner

NITRIDE SEMICONDUCTOR DEVICE COMPRISING BONDED SUBSTRATE AND FABRICATION METHOD OF THE SAME

BACKGROUND OF THE INVENTION

1. Field of the Invention

The invention relates to a fabrication method of a nitride semiconductor device comprising a nitride semiconductor ($In_xAl_yGa_{1-x-y}N$, $0 \leq x$, $0 \leq y$, $x+y \leq 1$), such as a light emitting diode (LED), a laser diode (LD); light receiving devices such as a solar cell, a photosensor; or electronic devices such as a transistor, a power device; and the like.

2. Description of the Related Art

Owing to the stability in the high temperature ammonia atmosphere in its epitaxial growth process, it has been proved that sapphire is a desirable substrate for growing a light emitting device of a high efficiency made of nitride semiconductor. Practically, a nitride semiconductor device grown on a sapphire substrate is employed for a high brightness blue emitting LED, a pure green LED, and LD (laser diode) and it is applied for full color displays, signal display apparatus, image scanners, light sources such as a light source for optical disks and for media such as DVD that stores a large quantity of information, or printing apparatus. Further, applications to electronic devices such as field effect transistors (FET) are expected.

Although a nitride semiconductor is a promising semiconductor material, its bulk crystal production is difficult. For that, presently, hetero-epitaxial techniques for growing GaN by metal organic chemical vapor deposition (MOCVD) on a hetero-substrate of such as sapphire, SiC and the like are widely used. Especially, in the case of using a sapphire substrate, a method involving forming AlGaN as a buffer layer at a temperature as low as about 600° C. on a sapphire substrate and then growing a nitride semiconductor layer thereon is employed. Crystallinity of the nitride semiconductor layer is improved by such a method. Japanese Patent Application Laid-Open No. 2002-154900 discloses a structure comprising a $Ga_xAl_{1-x}N$ as a buffer layer and a crystal of a gallium nitride-based compound semiconductor grown thereon.

SUMMARY OF THE INVENTION

However, sapphire is an insulator with a low thermal conductivity and it limits the structure of a device. For example, in the case of a conductor substrate of such as GaAs and GaP, electric contact parts (electrode), one on the top face of a semiconductor apparatus and another in the bottom face, can be formed, whereas in the case of a light emitting device grown on sapphire, two electric contact parts should be formed on a top face (on a single face). Therefore, if an insulating substrate of such as sapphire is used, the effective light emitting surface area for the same substrate surface area is narrowed as compared with that of a conductor substrate. Further, in the case of using an insulating substrate, the number of devices (chips) that can be obtained from a wafer with the same Φ is low.

Further, there are face-up type and face-down type devices as nitride semiconductor devices using an insulating substrate of such as sapphire and since both electrodes exist in a single face, the current density is increased locally and heat is generated in devices (chips). Also, since wires are required respectively for both p and n electrodes in wire bonding process for the electrodes, the chip size becomes large to result in decrease of yield of the chips. Furthermore, sapphire has high hardness and a hexagonal crystal structure. Therefore, in the case of using sapphire as a growing substrate, it is required to subject the sapphire substrate to chip separation by scribing, and the fabrication steps are increased as compared with those in the case of other substrates.

On the other hand, in the case of a nitride semiconductor device using SiC as a substrate, since SiC is conductive, electrodes of a device can be formed in both top and bottom faces. However, in the case a nitride semiconductor device is grown on a SiC substrate, no electrode can be directly formed in the side of the nitride semiconductor layer where the layer contacts with the SiC substrate. That is, although one electrode can be formed directly in the nitride semiconductor while contacting with the semiconductor, the other electrode has to be formed in the rear face of the SiC substrate. This means that electric current flows through the SiC substrate. However, the conductivity and the thermal conductivity of SiC are not sufficient.

For that, in consideration of the foregoing problems, the invention aims to provide a nitride semiconductor device having an opposed electrode structure in which both electrodes are on the opposite to each other in such a manner that a p-electrode is formed in one main face of a stack of nitride semiconductors and an n-electrode is formed in the other main face and its fabrication method.

Further, recently, LED emitting light with short wavelength in an UV region or the like is made practically applicable. FIG. 18 shows a schematic illustration showing one example of the structure of a nitride semiconductor device emitting light in an UV region. A GaN buffer layer 52, an n-type GaN contact layer 53, an n-type AlGaN clad layer 54, an InGaN active layer 55, a p-type AlGaN clad layer 56, and a p-type GaN contact layer 57 are laminated on a sapphire substrate 51 and a p-electrode 58 is formed on the p-type GaN contact layer 57 and an n-electrode 59 is formed on the n-type GaN contact layer 53 exposed by etching. The luminescent wavelength can be changed by changing the In composition ratio of the active layer and the wavelength of the luminescence wavelength is shortened by lowering the In composition ratio.

However, if it is tried to shorten the luminescent wavelength, for example, to shorter than 365 nm, which is a band gap of GaN, it becomes difficult to utilize a quantum well structure of InGaN, which is conventionally used as an active layer to result in a problem that sufficient luminescence output cannot be obtained. Further, there is another problem that the light outputting efficiency is considerably decreased owing to absorption by a material having a band gap near to the luminescent wavelength.

Therefore, another aim of the invention is to solve the above-mentioned problems, suppress heat generation of a device by making the electric current distribution even, and provide a nitride semiconductor device having a high luminescence output even in the UV region and its fabrication method.

The fabrication method of the first embodiment of a nitride semiconductor device comprises:

(a) forming a stack of nitride semiconductor by growing at least one or more n-type nitride semiconductor layers, an active layer having a quantum well structure including at least a well layer of $Al_aIn_bGa_{1-a-b}N$, ($0 \leq a \leq 1$, $0 \leq b \leq 1$, $a+b \leq 1$) and a barrier layer of $Al_cIn_dGa_{1-c-d}N$, ($0 \leq c \leq 1$, $0 \leq d \leq 1$, $c+d \leq 1$), and one or more p-type nitride semiconductor layers on one main face of a substrate for growing nitride semiconductor that has two mutually opposed main faces and has a thermal expansion coefficient higher than those of said n-type and p-type nitride semiconductor layers;

(b) forming a first bonding layer including one or more metal layers on said p-type nitride semiconductor layers;

(c) forming a second bonding layer including one or more metal layers in one main face of a supporting substrate having two mutually opposed main faces and having a thermal expansion coefficient higher than those of said n-type and p-type nitride semiconductor layers and equal to or smaller than that of said substrate for growing nitride semiconductor;

(d) setting said first bonding layer and said second bonding layer face to face each other and pressing said stack of nitride semiconductor and said supporting substrate with heat to bond together; and (e) removing said substrate for growing nitride semiconductor from said stack of the nitride semiconductor.

The substrate is preferably conductive, more preferably made of a metal or a metal composite. Since a metal or a metal composite is not only highly conductive but also excellent in thermal conductivity, it can improve the heat releasing property of a nitride semiconductor device. Incidentally, a "conductive" substrate in this invention includes conductive metals and semiconductors as well.

According to the fabrication method of the first embodiment of the invention, the above-mentioned nitride semiconductor layers including the active layer are grown on the substrate for growing nitride semiconductor, the stack of nitride semiconductor for bonding and the substrate are bound each other and then the substrate for growing nitride semiconductor is removed, so that a p-type electrode and an n-type electrode can be formed on the p-type nitride semiconductor layers and on the exposed n-type nitride semiconductor layers, respectively. Consequently, the p-electrode and the n-electrode can be arranged face to face each other so that the electric current distribution can be made even and heat generation of the device can be suppressed. As a result, a nitride semiconductor device with a high luminescence output in the UV region can be provided.

Inventors have found a remarkable relation of thermal expansion coefficients of a supporting substrate and a substrate for growing nitride semiconductor in order to prevent chipping and cracking of the nitride semiconductor layers. That is, the chipping and cracking of the nitride semiconductor layers can be remarkably suppressed and a nitride semiconductor device with high reliability in production yield can be obtained by making the thermal expansion coefficient of the supporting substrate equal to or smaller than that of the substrate for growing nitride semiconductor. In other words, three thermal expansion coefficients A, B, and C of the substrate for growing nitride semiconductor, the nitride semiconductor layers, and the supporting substrate, respectively, are controlled to be as A=C>B or A>C>B.

The mechanism of the prevention of the chipping and cracking of the nitride semiconductor layers depending on the relation of the thermal expansion coefficients is supposed to be as follows. It will be described simply with reference to FIG. 2 to FIG. 4. As a simple example, the case that a GaN layer 23 is grown on a sapphire substrate 22 as a substrate for growing nitride semiconductor and a supporting substrate 24 is bound to the GaN layer 23 will be exemplified. The thermal expansion coefficient A of sapphire is about $7.5 \times 10^{-6}$ $K^{-1}$ and the thermal expansion coefficient B of GaN is about $3.17 \times 10^{-6}$ $K^{-1}$ in the c-axial direction and about $5.59 \times 10^{-6}$ $K^{-1}$ in the a-axial direction. Since the difference of the thermal expansion coefficient in the plane direction of the mutually bonding interface is concerned in this invention, in the case of GaN grown in the c-axial direction on the c-plane of the sapphire substrate, the difference of the thermal expansion coefficient of GaN in the a-axial direction should be investigated. Supporting substrates having a variety of thermal expansion coefficients C will be formed thereon.

First, the warping of a wafer in the case the relation of the thermal expansion coefficients is "C>A>B" is as shown in FIGS. 2A to 2B. When the GaN layer 23 is formed on the c-plane of the sapphire substrate 22, the warping occurs with the GaN layer 23 side being projected as shown in FIG. 2A. Next, when the supporting substrate 24 having a thermal expansion coefficient C larger than the thermal expansion coefficient A of the sapphire substrate is bound to the GaN layer 23, the warping direction is reversed as shown in FIG. 2B. At this time, due to large strain given to the GaN layer 23, the GaN layer is subject to problems such as craking or peeling.

Second, the warping of a wafer in the case the relation of the thermal expansion coefficients is "A>B>C" is shown in FIGS. 3A to 3D. In a first step, the GaN layer 23 is formed on the c-plane of the sapphire substrate 22, the warping occurs with the GaN layer 23 side being projected as shown in FIG. 3A. When the supporting substrate 24 having a thermal expansion coefficient C smaller than the thermal expansion coefficient B of the GaN layer is bound to the GaN layer 23, the warping direction is not changed as shown in FIG. 3B. Next, after the wafer is turned upside down as shown in FIG. 3C, the sapphire substrate 22 is removed as shown in FIG. 3D. In this case, the warping direction is not changed before and after removing the sapphire substrate 22. The warping shape is as the sapphire substrate 22 side being recessed. Therefore, it is difficult to remove the sapphire without causing cracking and peeling of the GaN layer 23. For example, if it is tried to remove the sapphire substrate 22 by polishing, the polishing is promoted only in the peripheral part and even polishing is difficult. If it is tried to remove the sapphire substrate 22 by laser beam, the sapphire substrate 22 is hardly floated up from the GaN layer. Accordingly, the removal of the sapphire substrate 22 is difficult and if it is tried to forcibly remove the sapphire substrate 22, cracking and peeling of the GaN layer 23 tend to take place.

Third, the warping of the wafer in the case the relation of the thermal expansion coefficients is "A≦C>B" is as shown in FIG. 4. When the GaN layer 23 is formed on the c-plane of the sapphire substrate 22, the warping shape is as the GaN layer 23 side being projected as shown in FIG. 4A. When the supporting substrate 24 having a thermal expansion coefficient C equal to or slightly smaller than the thermal expansion coefficient A of the sapphire substrate is bound to the GaN layer 23, the warping is reduced as shown in FIG. 4B. Next, after the wafer is turned upside down as shown in FIG. 4C, the sapphire substrate 22 is removed as shown in FIG. 4D. In this case, when the sapphire substrate 22 is removed, the warping shape is changed to a shape with the sapphire substrate 22 side being projected. Accordingly, in the case of removing the sapphire substrate 22 by polishing, polishing is easy to be carried out evenly. Also, in the case of removing the sapphire substrate 22 by laser beam, the sapphire substrate 22 is easy to be floated up from the GaN layer. Consequently, at the time of removing the sapphire substrate 22, occurrence of cracking and peeling in the GaN layer can be suppressed.

As described above, by controlling three thermal expansion coefficients A, B, and C of the substrate for growing semiconductor, the nitride semiconductor layers, and the supporting substrate, respectively, to be "A≦C>B", the chipping and cracking in the nitride semiconductor layers can be remarkably decreased and a nitride semiconductor device can be obtained at a high production yield. Further, keeping the thermal expansion coefficients in the above-mentioned relation is advantageous in a point that the process after removal of the sapphire substrate 22 is made easy. That is, as shown in FIG. 4D, since the warping is finally in a state that the nitride semiconductor layer 23 side is projected, the nitride semiconductor layer 23 is easy to be flat by vacuum adsorption adsorbing the supporting substrate 24 side. Accordingly, it is made possible to evenly polish the nitride semiconductor layer 23 and to evenly form a resist layer on the wafer in a photolithography step.

While the thermal expansion coefficient C of the supporting substrate in the invention may be any value as long as it satisfies the relation "A≦C>B", more preferably, the value of the thermal expansion coefficient C is adjusted corresponding to the thickness of the nitride semiconductor layers on the substrate for growing nitride semiconductor. That is, in the case the thickness of the nitride semiconductor layer is significantly thin as compared with that of the substrate for growing nitride semiconductor (for example, the thickness of the nitride semiconductor layer is 30 µm or thinner), the thermal expansion coefficient C of the supporting substrate is preferably adjusted to be approximately same as the thermal expansion coefficient A of the substrate for growing nitride semiconductor. In this case, the thermal expansion coefficient C of the supporting substrate is not necessarily completely same as the thermal expansion coefficient A of the substrate for growing nitride semiconductor, but the thermal expansion coefficient C of the supporting substrate is satisfactory to be within ±10% of the thermal expansion coefficient A of the substrate for growing nitride semiconductor. On the other hand, in the case the thickness of the nitride semiconductor layer is thick (for example, the thickness of the nitride semiconductor layer exceeds 30 µm), the thermal expansion coefficient C of the supporting substrate is changed to be closer to the thermal expansion coefficient B of the nitride semiconductor layer from the thermal expansion coefficient A of the substrate for growing nitride semiconductor, depending on the thickness of the nitride semiconductor layer.

In the fabrication method of the first embodiment of the invention, the foregoing first bonding layer preferably includes an ohmic electrode layer formed immediately above the p-type nitride semiconductor layers. Further, it is preferable for the first bonding layer to have a first eutectic-forming layer and the second bonding layer to have a second eutectic-forming layer. At the time of bonding, the metals respectively composing the first and the second eutectic-forming layers are diffused to form an eutectic and therefore the bonding force can be increased.

Next, the fabrication method of the second embodiment is a fabrication method of a nitride semiconductor device comprises:

(a) growing an under layer including a nitride semiconductor having a characteristic to absorb the light emitted from said device on one main face of a substrate for growing that has two mutually opposed main faces;

(b) forming at least one or more n-type nitride semiconductor layers, an active layer having a quantum well structure including at least a well layer of $Al_aIn_bGa_{1-a-b}N$, ($0 \leq a \leq 1$, $0 \leq b \leq 1$, $a+b \leq 1$) and a barrier layer of $Al_cIn_dGa_{1-c-d}N$, ($0 \leq c \leq 1$, $0 \leq d \leq 1$, $c+d \leq 1$), and one or more p-type nitride semiconductor layers as active layer on said under layer;

(c) bonding a supporting substrate to the surface of said p-type nitride semiconductor layers; and (d) removing said substrate for growing and said under layer.

With the respect to a nitride semiconductor device, for example, for a UV region with wavelength of 380 nm or shorter, under layers including a buffer layer of $Ga_eAl_{1-e}N$, ($0<e<1$) and a high-temperature-grown layer of either undoped GaN or GaN doped with an n-type impurity may be formed. The under layers have an effect to improve the crystallinity of the nitride semiconductor to be grown thereon. Further, by employing either undoped GaN or GaN doped with an n-type impurity as the high-temperature-grown layer, the crystallinity of the nitride semiconductor layer to be grown thereon can be significantly improved. In order to obtain a nitride semiconductor device with good crystallinity, it is preferable to grow a GaN layer at a high temperature on the substrate for growing intervening a buffer layer in between. If the active layer or the like is grown without growing such under layer, the crystallinity will be considerably inferior and a resulting nitride semiconductor device will be defective in the luminescence output and therefore not practically usable.

Although a nitride semiconductor device with good crystallinity can be obtained by forming such a high-temperature-grown layer such as GaN, a portion of luminescence from the active layer is absorbed in the GaN layer attributed to the self-absorption of GaN in the UV region. This results in decrease of the luminescence output. In the invention, the substrate for growing nitride semiconductor and the under layer including GaN are removed after bonding the conductive supporting substrate. Therefore, the self-absorption can be suppressed while keeping the crystallinity of the nitride semiconductor composing the device to be excellent.

When removing the under layer, the under layer is not necessarily removed completely if it is removed to such extent that the self-absorption of the luminescence can be suppressed sufficiently. For example, in the above-mentioned example, if the thickness of the GaN layer absorbing the luminescence is as thin as 0.1 µm or thinner (preferably, as thin as 0.01 µm or thinner), the self-absorption will be suppressed sufficiently. For example, in the case the thickness of the GaN layer is smaller than 0.1 µm, about 70% of the light can be pulled out from the device. In the case of the thickness is smaller than 0.01 µm, about 96% of the generated light can be pulled out. To remove the substrate for growing, it is preferable, for example, to radiate electromagnetic wave to the entire face of the other main face of the substrate for growing. To remove the buffer layer and the high-temperature-grown layer, it is preferable, to example, etch or grind the buffer and high-temperature-grown layer after removing the substrate for growing.

The under layer in the second embodiment of the invention is not limited to the case it includes GaN. The under layer may be a layer which improves the crystallinity of the n-type nitride semiconductor layers to be grown thereon and contains a nitride semiconductor self-absorbing the luminescence of the active layer. For example, even in the case a slight amount of In or Al is added to GaN, if the content of In or Al is significantly less than that of the layer to be grown thereon, the effect to improve the crystallinity can be attained. Removal of the under layer together with the substrate for growing nitride semiconductor after the device structure is formed through the under layer in such a manner suppresses the self-absorption while the crystallinity of the nitride semiconductor composing the device being kept excellent.

The phrase "a nitride semiconductor that absorbs the light emitted form the device" means a nitride semiconductor having a band gap energy close to or smaller than that of the active layer and accordingly absorbing the luminescence to a non-negligible extent. For example, in the case the band gap energy of a nitride semiconductor is smaller than a criteria value that is 0.1 eV larger than the luminescence peak, as shown in the following equation, it absorbs the luminescence of the active layer.

(The band gap energy of the nitride semiconductor layer)≦ (the luminescence peak energy +0.1 eV)

The relation of the band gap energy of the nitride semiconductor with the composition can be assumed as the case that the bowing parameter is set to be 1. For example, the band gap energy of a nitride semiconductor of ternary mixed crystal $A_{1-x}B_xC$ can be expressed as the following equation: $E_G(A_{1-x}B_xC)=(1-x)E_{G,AC}+xE_{G,BC}-(1-x)x$ wherein $E_{G,AC}$ and $E_{G,BC}$ denote the band gap energy for the binary mixed crystal AC and BC, respectively.

Also, the phrase "an under layer for improving the crystallinity of the n-type nitride semiconductor" means an under layer by which the crystallinity of the n-type nitride semiconductor in a device is increased as compared with that of a nitride semiconductor device having the same layer structure except that the under layer is not formed. In general, any under layer with a composition easy to have good crystallinity as compared with that of a layer to be grown thereon, the under layer can be said to have a capability of improving the crystallinity. In the case of the nitride semiconductor, a ternary mixed crystal is easier to have good crystallinity than a quaternary mixed crystal, and a binary mixed crystal is easier than a ternary mixed crystal. In the case of between identical quaternary mixed crystals or between identical ternary mixed crystals, those with a smaller In or Al composition ratio are easier to have good crystallinity.

The fabrication methods (hereinafter, referred to as the fabrication method of the invention) of the first embodiment and the second embodiment of the invention may be combined with each other. While the fabrication method of the invention is applicable for devices comprising an active layer of $Al_aIn_bGa_{1-a-b}N$, ($0\leq a\leq 1$, $0\leq b\leq 1$, $a+b\leq 1$) and emitting a luminescence of a variety of wavelength, the present invention is especially effective in a UV region with 380 nm or shorter wavelength. A nitride semiconductor device preferable for a short wavelength region, i.e. 380 nm or shorter wavelength can be fabricated by forming an active layer having a quantum well structure containing at least a well layer of a quaternary mixed crystal of InAlGaN and a barrier layer containing at least Al-containing nitride semiconductor. Since the well layer is made of the quaternary mixed crystal of InAlGaN in the above-mentioned active layer, the degrade of the crystallinity can be suppressed while the number of the component elements being suppressed to the minimum. Therefore the light emitting efficiency can be improved. Further, use of the nitride semiconductor containing at least Al for the barrier layer widens band gap energy than that of the well layer, makes formation of the active layer having a quantum well structure with the band gap energy corresponding to the luminescence wavelength possible and keeps the crystallinity of the active layer excellent.

In the fabrication method of the invention, a composition-graded layer may be formed further on the high-temperature-grown layer. The composition-graded layer is for moderating the lattice inconformity with the nitride semiconductor to be grown thereon and the composition ratio is gradually changed from the composition of the high-temperature-grown layer to the composition of the nitride semiconductor layer to be grown thereon. For example, in the case that the high temperature grown layer is made of an undoped GaN and the nitride semiconductor layer to be grown thereon is an n-type clad layer of $Al_yGa_{1-y}N$, the composition-graded layer is formed in which the mixed crystal ratio of Al is gradually increased from GaN to $Al_yGa_{1-y}N$. The composition-graded layer is especially effective for LED emitting luminescence in UV region in that defects in the nitride semiconductor layers are extremely reduced and their crystallinity is remarkably improved. Also, the composition-graded layer is effective for LED of which n-type clad layer has a relatively high Al content (for example, 5% or more). By the composition-graded layer, the lattice mismatch at the interface of the n-type clad layer is reduced and the crystallinity of the semiconductor layers is remarkably improved. Further, the composition-graded layer may be modulation-doped layer in which an impurity for determining the conductivity is added in graded state. For example, in the case the nitride semiconductor layer to be grown thereon is a Si-doped $Al_yGa_{1-y}N$, the composition-graded layer may have a structure in which the impurity concentration is changed from un-doped state to the Si concentration of an n-type clad layer. This reduces defects and improves the crystallinity of the nitride semiconductor layer.

Further, in fabrication method of the invention, a coating layer containing a phosphor substance is preferably formed in at least a portion of the surface of a nitride semiconductor device.

A nitride semiconductor device of the third embodiment of the invention, especially a nitride semiconductor device for the UV region with 380 nm or shorter wavelength, comprises:

a substrate having two opposed main faces and having a thermal expansion coefficient higher than that of a nitride semiconductor;

a bonding layer placed on one main face of the substrate and including an eutectic layer;

one or more p-type nitride semiconductor layers placed on the bonding layer;

an active layer including at least a well layer of $Al_aIn_bGa_{1-a-b}N$, ($0\leq a\leq 1$, $0<b\leq 1$, $a+b<1$) and a barrier layer of $Al_cIn_dGa_{1-c-d}N$, ($0<c\leq 1$, $0\leq d\leq 1$, $c+d<1$) and placed on said p-type nitride semiconductor layers; and one or more n-type nitride semiconductor layers containing Al and placed on said the active layer. In this case, the bonding layer is composed of said first bonding layer and second bonding layer. In the bonding layer, the first eutectic forming layer and the second eutectic forming layer are mutually diffused to form an eutectic layer.

The above-mentioned substrate is preferably conductive and more preferably contains both a metal with high electric conductance and a metal with high hardness. Preferably, a metal material with a high conductivity and a high thermal expansion coefficient is combined with a metal material with a high hardness and a low thermal expansion coefficient are compounded, so that a substrate with a high conductivity and a thermal expansion coefficient higher than that of the nitride semiconductor layers can be composed. As the metal material with a high hardness and a low thermal expansion coefficient, for example, Ag, Cu, Au, Pt and the like can be exemplified. As the metal material with a high hardness and a low thermal expansion coefficient, for example, W, Mo, Cr, Ni and the like can be exemplified.

In the case the metal material with a high conductivity and a high thermal expansion coefficient and the metal material with a high hardness and a low thermal expansion coefficient do not or hardly form a solid-solution, the substrate can be made of composites of these metal materials. Employing a composite metal material makes it possible to use the combination of the metal materials having significantly different properties from each other. Therefore, a supporting substrate having both a desired thermal expansion and high conductivity can be obtained. Further, the substrate may be made of a composite of a metal material having high conductivity and a high thermal expansion coefficient with a ceramic material having high hardness an a low thermal expansion coefficient such as diamond. In such a manner, a supporting substrate having a desired thermal expansion coefficient while maintaining the high conductivity may be obtained.

A nitride semiconductor device of the fourth embodiment of the invention comprises:

a substrate having two opposed main faces;

a bonding layer placed on one main face of the substrate and including an eutectic layer;

one or more p-type nitride semiconductor layers placed on said bonding layer;

an active layer including at least a well layer of $Al_aIn_bGa_{1-a-b}N$, $(0<a\leq1, 0<b\leq1, a+b<1)$ and a barrier layer of $Al_cIn_dGa_{1-c-d}N$, $(0<c\leq1, 0\leq d\leq1, c+d\leq1)$ and placed on said p-type nitride semiconductor layers; and n-type nitride semiconductor layers placed on said active layer and made of a nitride semiconductor which does not substantially absorb the light emitted from said active layer.

The phrase "a nitride semiconductor which does not substantially absorb the light emitted from the active layer" means a nitride semiconductor having a band gap energy is so large that the self-absorption of luminescence from the active layer can be suppressed sufficiently. For example, in the case the band gap energy of a nitride semiconductor is larger than a criteria value that is 0.1 eV larger than the luminescence peak energy, self-absorption of the luminescence by the nitride semiconductor can be negligible. Also, in the case the nitride semiconductor contains a layer with a band gap energy causing self-absorption, if the thickness of the layer is 0.1 µm or thinner (more preferably 0.01 µm or thinner), the self-absorption of the luminescence can be negligible.

With respect to the nitride semiconductor devices of the third and the fourth embodiments (hereinafter referred to as a nitride semiconductor device of the invention), especially in a nitride semiconductor device in a UV range with wavelength of 380 nm or shorter, the above-mentioned p-type nitride semiconductor layers may includes a p-type contact layer of $Al_fGa_{1-f}N$, $(0<f<1)$. The p-type contact layer is preferable has a graded composition in which a p-type impurity concentration is high and a mixed crystal ratio of Al is low in the conductive substrate side. In this case, the graded composition may be a continuously changed composition or a composition intermittently changed in step by step.

Further, with respect to a nitride semiconductor device of the invention, especially a nitride semiconductor device in a UV range with wavelength of 380 nm or shorter, the above-mentioned p-type contact layer may be composed of two layers; a first p-type contact layer of $Al_gGa_{1-g}N$, $(0<g<0.05)$ formed in the conductive electrode side and a second contact layer of $Al_hGa_{1-h}N$, $(0<h<0.1)$ formed in the active layer side; and the first contact layer may have a higher p-type impurity concentration than that of the second contact layer. However, the p-type contact layer is not necessarily to be $Al_fGa_{1-f}N$, $(0<f<1)$ but may be GaN. That is because the p-type contact layer is for forming a p-electrode and may be any material if it has an ohmic contact with the p-electrode. Also, since the contact layer may generally be thin as compared with a high-temperature-grown layer, even if GaN is used for the p-type contact layer, decrease of the luminescent outputting efficiency owing to the self-absorption of the layer is not so significant.

With respect to a device of the invention, especially a light emitting device, luminescence with a variety of wavelength values can be emitted by forming a coating layer containing a phosphor substance which absorbs a portion or entire luminescence from the active layer of $Al_aIn_bGa_{1-a-b}N$, $(0\leq a\leq1, 0\leq b\leq1, a+b\leq1)$ and emits luminescence of different wavelength values in the nitride semiconductor device on a conductive substrate. Especially, by adding YAG as a phosphor material, white light emission is made possible and the range of the device application is considerably wider to such as a light source for luminaries and the like.

With respect to the phosphor substance, the materials which absorb visible light rays and emits light rays with different wavelength values are limited. However, there are many kinds of materials which absorb UV rays and emits light rays with different wavelength values are available. Accordingly, with the light emitting device emitting UV light, an adequate material can be selected from a variety of materials. Also, phosphor substances which absorb UV rays have a high light conversion efficiency as compared with a visible light conversion efficiency. Especially, with respect to white light, color-rendering white light can be obtained and the application possibility is further widened. The invention provides, as a nitride semiconductor device emitting luminescence in UV range, a nitride semiconductor light emitting device with little self-absorption and also provides a light emitting device for emitting white light with an extremely high conversion efficiency by forming a coating with a phosphor substance.

DESCRIPTION OF THE PREFERRED EMBODIMENTS

Figure 1A:
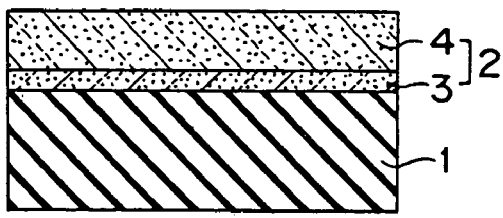
FIG. 1 is a schematic cross-sectional view illustrating fabrication process in one embodiment of a fabrication method of a nitride semiconductor device according to the invention.

The application is based on applications Nos. 2002-198761, 2002-218199, 2002-276309, 2003-4919 filed in Japan, the content of which is incorporated herein by reference.

While the invention has been described with reference to specific embodiments, various modifications and applications may occur to those skilled in the art. Such modifications and substitutions can be made without departing from the spirit and scope of the present invention as defined by the appended claims.

FIG. 1 is a schematic cross-sectional view illustrating fabrication process of a fabrication method of a nitride semiconductor device according to the invention. An under layer 2 composed of a buffer layer 3 and a high temperature grown layer 4 is formed on the surface of a substrate for growing nitride semiconductor 1 (FIG. 1A). Next, an n-type clad layer 5, an active layer 6, a p-type clad layer 7, a p-type contact layer 8, and a first bonding layer 9 composed of one or more metal layers are formed on the under layer 2 (FIG. 1B). Here, in the first bonding layer 9, after a p-electrode is formed on the p-type contact layer 8, annealing treatment is carried out in order to obtain ohmic contact. Next, a conductive substrate 10 on whose surface a second bonding layer 11 composed of one or more metal layers is formed is laminated on the substrate for growing nitride semiconductor 1 while the first bonding layer 9 and the second bonding layer 11 being set face to face and bound by pressing and heating.

Figure 1D:
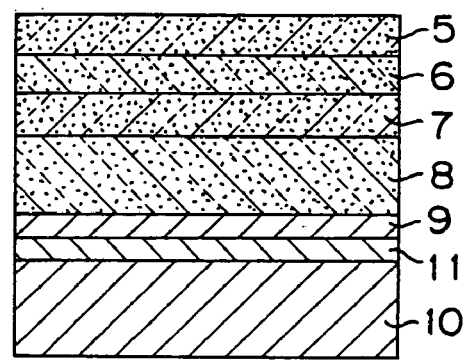
Figure 1B:
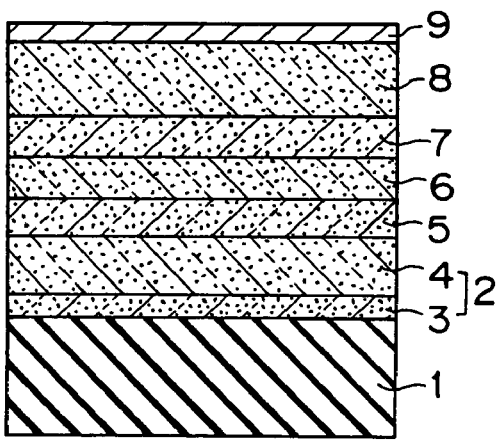

Next, the substrate for growing nitride semiconductor 1 bound to the conductive substrate 10 is set in a polishing apparatus and the substrate for growing nitride semiconductor 1 is subjected to lapping to remove the substrate for growing nitride semiconductor 1 and the under layer 2 to expose the n-type clad layer 5 (FIG. 1D).

Figure 1E:
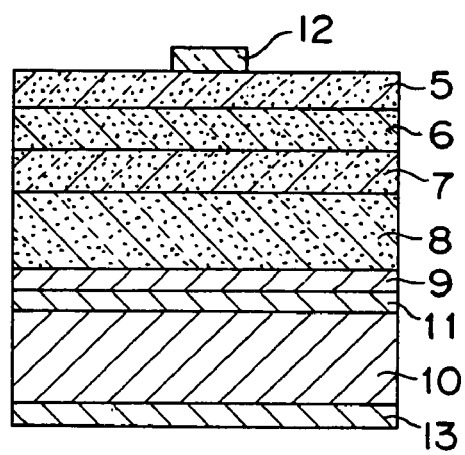
Figure 1C:
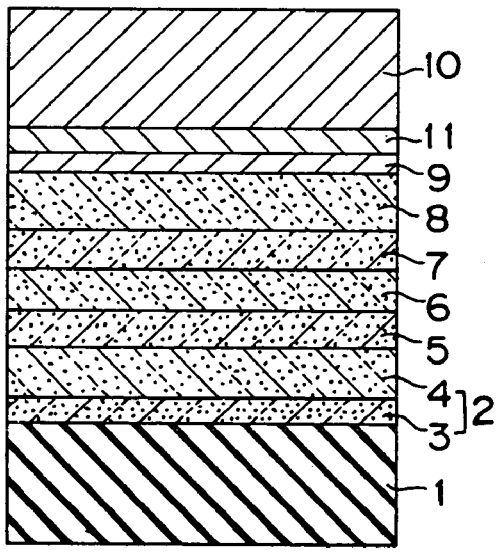
Figure 2A:
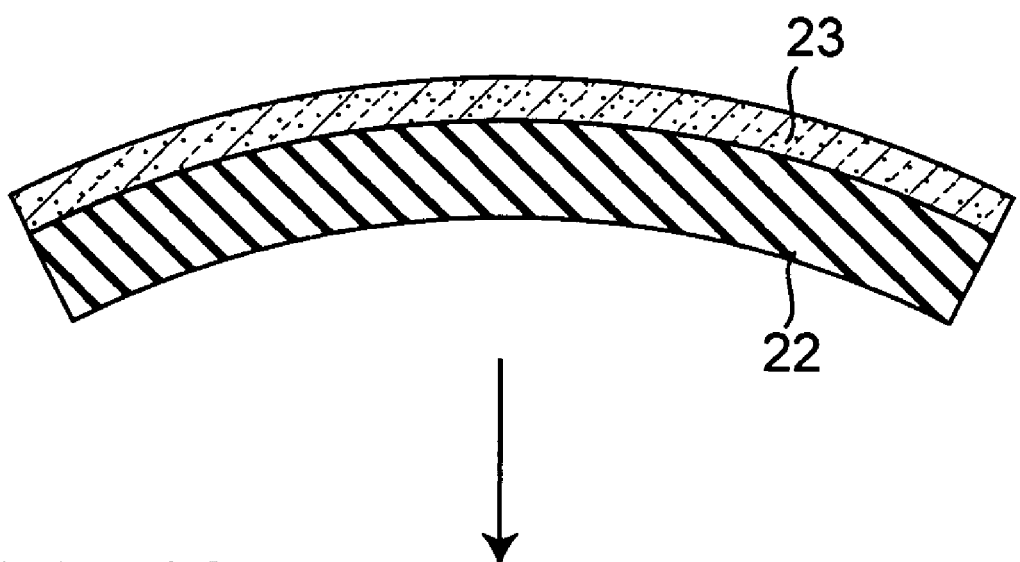
FIGS. 2A and 2B show schematic cross-sectional views illustrating the warp of a wafer in the case the thermal expansion coefficients A, B, and C of a substrate for growing nitride semiconductor, nitride semiconductor layers, and a supporting substrate, respectively, have a relation of C>A>B.
Figure 2B:
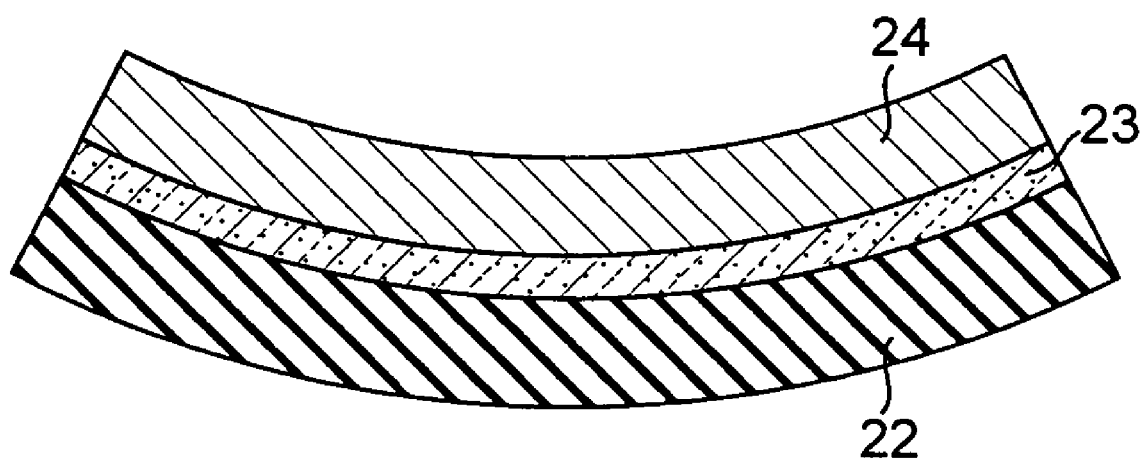
Figure 3A:
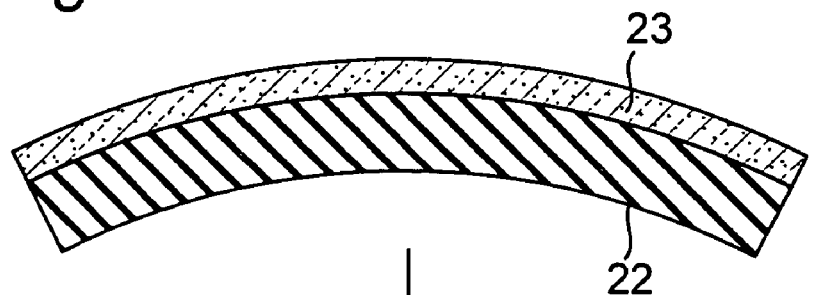
FIGS. 3A to 3D show schematic cross-sectional views illustrating the warp of a wafer in the case the thermal expansion coefficients A, B, and C of a substrate for growing nitride semiconductor, nitride semiconductor layers, and a supporting substrate, respectively, have a relation of A>B>C.
Figure 3B:
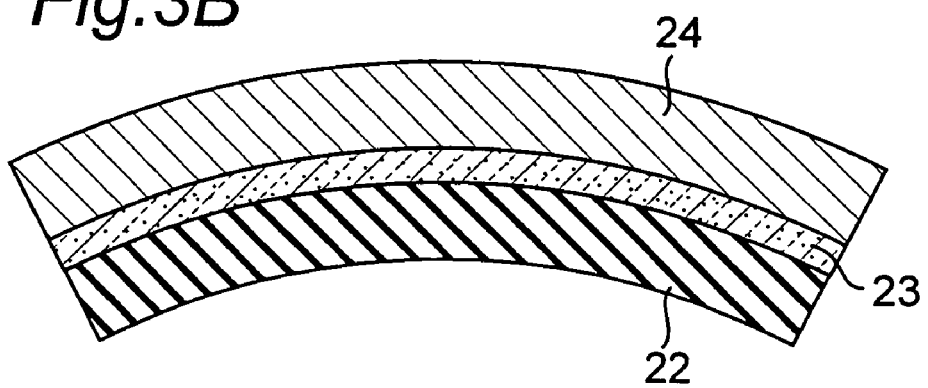
Figure 3C:
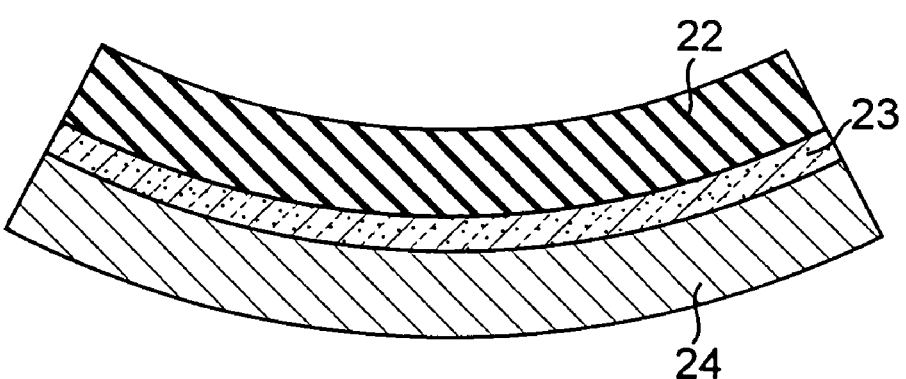
Figure 3D:
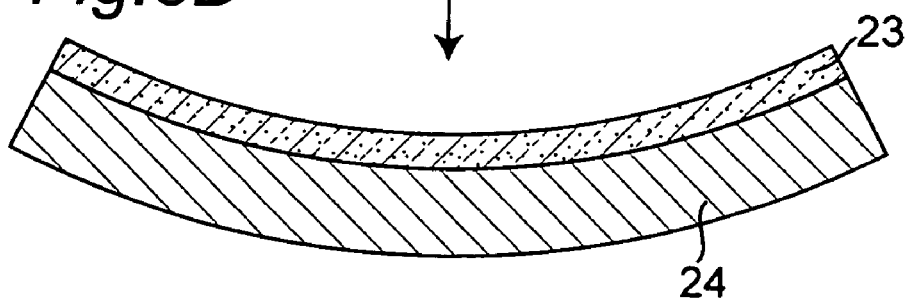
Figure 4A:
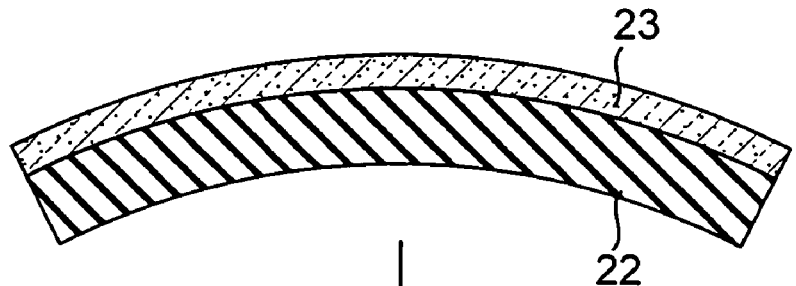
FIGS. 4A to 4D show schematic cross-sectional views illustrating the warp of a wafer in the case the thermal expansion coefficients A, B, and C of a substrate for growing nitride semiconductor, nitride semiconductor layers, and a supporting substrate, respectively, have a relation of $A \leq C > B$.
Figure 4B:
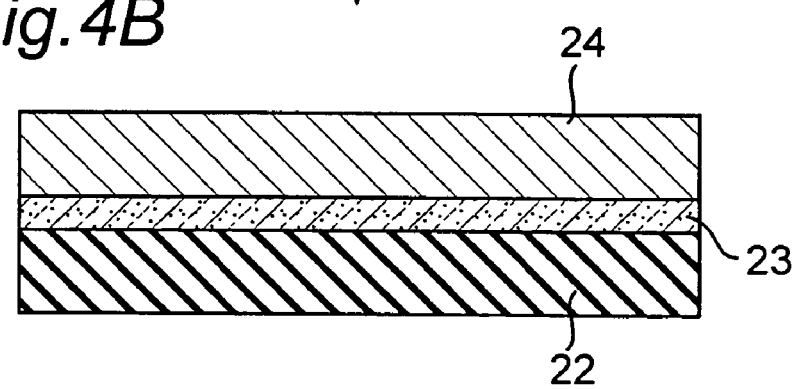
Figure 4C:
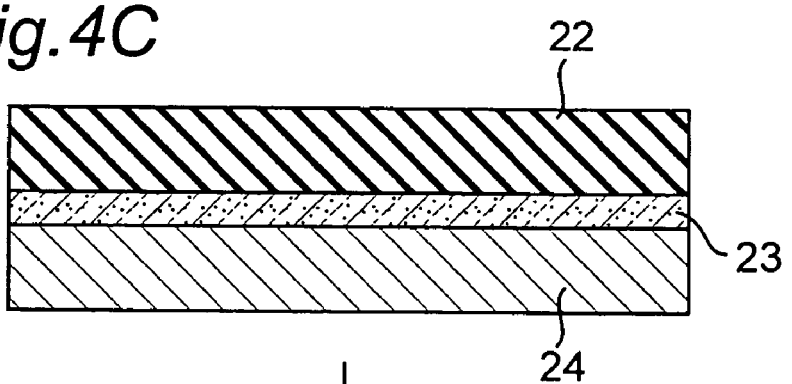
Figure 4D:
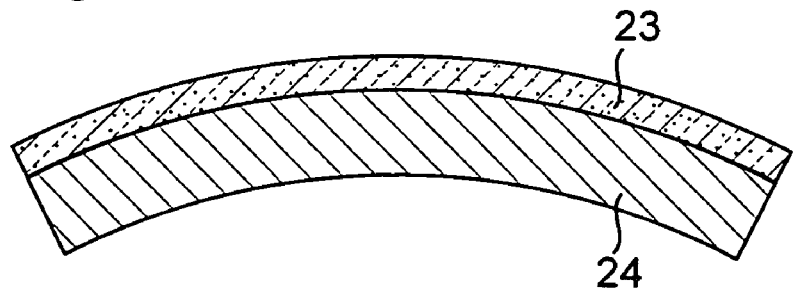

Next, after the surface of the exposed n-type clad layer 5 is polished, an n-electrode 12 is formed on the n-type clad layer 5, and on the other hand, a pad electrode 13 for a p-electrode is formed on the entire face of the conductive substrate 10. Next, light emitting device is separated into chips by dicing to obtain a light emitting device comprising nitride semiconductor layers laminated on the conductive substrate and the electrode formed on the conductive substrate (FIG. 1E).

In the method of the invention, as the substrate for growing nitride semiconductor, sapphire having any of C plane, R plane, and A plane as a main face, spinel (an insulating substrate of such as $MgAl_2O_4$), SiC, Si, and an oxide substrate having lattice conformity with that of the nitride semiconductor can be exemplified. Sapphire and spinel are preferable.

In the case nitride semiconductor layers are laminated on a substrate for growing nitride semiconductor, ELOG (Epitaxially Lateral Overgrowth) is carried out on the under layer to obtain the nitride semiconductor with improved crystallinity. Practically, the under layer is grown on the substrate for growing nitride semiconductor and a plurality of masks in stripes are formed on the under layer and nitride semiconductor is selectively grown from the apertures of the masks and a nitride semiconductor layer (a laterally grown layer) formed by growth accompanied with the grown in the lateral growth is formed. Since the through dislocation is suppressed in the laterally grown layer, the crystallinity of the nitride semiconductor to be formed on the laterally grown layer can be improved.

As the substrate for growing nitride semiconductor, a substrate produced from a material to be a substrate for growing which is off-angles, preferably off-angled in steps, in the main face is preferable. If an off-angled substrate is used, then three-dimensional growth in the surface does not take place and step growth occurs to make the surface flat easily. Further, if the direction along the steps (the step direction) of a sapphire substrate which is off-angles in steps is adjusted to be perpendicular to the A plane of the sapphire, the step face of the nitride semiconductor coincides with the resonance direction of laser and diffused reflection of the laser beam owing the surface roughness can be suppressed preferably.

Further, as the supporting substrate to be bound to the p-type nitride semiconductor layer, for example, a semiconductor substrate of a semiconductor of such as Si, SiC and the like, or a single metal substrate or a metal substrate of a composite of two or more metals which do not or scarcely form solid-solution can be employed. A metal substrate is preferably used because a metal substrate is excellent in mechanical properties as compared with a semiconductor substrate and easy to be elastically or plastically deformed and hard to be cracked. Further, as the metal substrate, those consisting of one or more metals selected from highly conductive metals such as Ag, Cu, Au, Pt and the like and one or more metals selected from high hardness metals such as W, Mo, Cr, Ni and the like can be employed. Further, as the metal substrate, a composite of Cu—W or Cu—Mo is preferably used because it contains Cu with a high thermal conductivity and therefore is excellent in heat releasing property. Further, in the case of the Cu—W composite, the content x of Cu is preferably $0<x\leqq30\%$ by weight and in the case of the Cu—Mo composite, the content x of Cu is preferably $0<x\leqq50\%$ by weight. Further, composites of a metal and a ceramic such as Cu-diamond may be used. The thickness of the substrate to be bound to the p-type nitride semiconductor layer is preferably 50 to 500 μm to increase the heat releasing property. The heat releasing property can be made excellent by making the supporting substrate thin in the above-mentioned range. The supporting substrate may have an uneven structure in the face to be stuck to the nitride semiconductor or on the opposed face.

It is preferable to select a material for the supporting substrate so as to satisfy $A\leqq C>B$ wherein the A, B, and C denote thermal expansion coefficients of the substrate for growing nitride semiconductor, the nitride semiconductor layers, and the supporting substrate. In the case the supporting substrate is a metal composite, the thermal expansion coefficient can be adjusted to be as desired by controlling the composition ratio of the metal material made to be the composite. For example, in the case of composing the supporting substrate using a composite of Cu and Mo, the thermal expansion coefficient of Cu is about $16\times10^{-6}$ $K^{-1}$ and the thermal expansion coefficient of Mo is about $5\times10^{-6}$ $K^{-1}$. Accordingly, in the case the thermal expansion coefficient of the supporting substrate is needed to be low, the composition ratio of Cu in the composite is adjusted to be low and in the case the thermal expansion coefficient is needed to be high, the composition ratio of Cu in the composite is adjusted to be high.

Further, it is preferable for the first layer to have ohmic contact with the p-type nitride semiconductor layer and comprise the p-electrode having a high reflectivity and contact with the p-type nitride semiconductor layer. For the p-electrode, a metal material containing at least one metal selected from a group consisting of Ag, Rh, Ni, Au, Pd, Ir, Ti, Pt, W, and Al is preferably used. Rh, Ag, Ni—Au, Ni—Au—RhO or Rh—Ir is preferable to be used and Rh is furthermore preferable to be used. In this case, since the p-electrode is formed on the p-type nitride semiconductor layer with a high resistance as compared with the n-type nitride semiconductor layer, the p-electrode is preferably formed on approximately entire surface of the p-type nitride semiconductor layer. The thickness of the p-electrode is preferably 0.05 to 0.5 μm.

Further, an insulating protection film is preferable to be formed on the exposed face of the p-type nitride semiconductor layer bearing the p-electrode of the first bonding layered. A monolayer film or a multi-layer film of $SiO_2$, $Al_2O_3$, $ZrO_2$, $TiO_2$ and the like may be used for a material of the protection film. Further, a metal film of such as Al, Ag, Rh and the like with a high reflectivity may be formed on the protection film. The reflectivity is increased by the metal film and the light outputting efficiency can be improved.

Further, it is also preferable to form a first eutectic forming layer on the p-electrode of the first bonding layer and a second eutectic forming layer on the main face of the conductive substrate in the second bonding layer. The first and second eutectic forming layers are layers forming eutectic by mutual diffusion at the time of bonding and Au, Sn, Pd, In, Ti, Ni, W, Mo, Au—Sn, Sn—Pd, In—Pd, Ti—Pt—Au, Ti—Pt—Sn and the like are preferably used. The first and second eutectic forming layers are more preferably made of metals such as Au, Sn, Pb, In and the like. The combination of the first and second eutectic forming layers is preferably Au—Sn, Sn—Pd or In—Pd. Further preferable combination is Sn for the first eutectic forming layer and Au for the second eutectic forming layer.

Further, a closely sticking layer and a barrier layer are preferably formed from the p-electrode side between the first eutectic forming layer of the first bonding layer and the p-electrode. The closely sticking layer is a layer for assuring the highly close adhesion to the p-electrode and is preferably made of a metal of Ti, Ni, W or Mo. The barrier is a layer for preventing a metal composing the first eutectic forming layer from diffusing to the closely sticking layer and is preferably made of Pt or W. In order to further prevent diffusion of the metal composing the first eutectic forming layer to the closely sticking layer, a Au film with a thickness of about 0.3 μm may be formed between the barrier layer and the first eutectic forming layer. Incidentally, the above-mentioned closely sticking layer, barrier layer, and Au film are preferably formed between the second eutectic forming layer and the conductive substrate.

As a combination of the closely sticking layer, barrier layer, and eutectic forming layer, for example, Ti—Pt—Au, Ti—Pt—Sn, Ti—Pt—Pd or Ti—Pt—AuSn, W—Pt—Sn, RhO—Pt—Sn, RhO—Pt—Au, RhO—Pt—(Au, Sn) and the like can be exemplified. These metal films are alloyed by the eutectic and form a conductive layer in a step thereafter. The first and second eutectic forming layers are preferably different from each other. The reason for that is because an eutectic can be formed at a low temperature and the melting point after eutectic formation can be increased.

The temperature at the time of bonding the laminate for bonding and the conductive substrate by pressing and heating is preferably 150 to 350° C. Because if it is 150° C. or higher, diffusion of the metals of the eutectic forming layers is promoted to form an eutectic with even density distribution and improve the adhesion strength of the laminate for bonding and the conductive substrate. If it is higher than 350° C., the metals of the eutectic forming layers are diffused to the barrier layer and further to the closely sticking layer to result in impossibility of obtaining high adhesion strength.

At the time of lamination, the first bonding layer will have the following structure. That is, p-electrode/Ti—Pt—AuSn—Pt—Ti/conductive substrate, p-electrode/RhO—Pt—AuSn—Pt—Ti/conductive substrate, p-electrode/Ti—Pt—PdSn—Pt—Ti/conductive substrate, p-electrode/Ti—Pt—AuSn—Pt—RhO/conductive substrate, and the like. Accordingly, a hardly peeling alloy can be formed. Lamination at a low temperature is thus made possible by forming the conductive layer of the eutectic and the adhesion force is also made high. Lamination at a low temperature is effective to moderate the warping.

To remove the substrate for growing nitride semiconductor after bonding the conductive substrate, polishing, etching, electromagnetic wave radiation or a method combining these methods can be employed. In the case of electromagnetic wave radiation, for example laser is employed for the electromagnetic wave and laser beam is radiated to the entire surface of the face where no under layer of the substrate for growing nitride semiconductor is formed to remove the substrate for growing nitride semiconductor and the under layer by decomposition of the under layer after bonding of the conductive substrate. Also, a desired film can be exposed by removing the substrate for growing nitride semiconductor and the under layer and then subjecting the surface of the exposed nitride semiconductor layer to CMP treatment. Accordingly, removal of a damaged layer, the thickness and the surface roughness of the nitride semiconductor layers can be adjusted.

To radiate electromagnetic wave, the following method can be employed too. That is, an under layer of a nitride semiconductor is formed on the substrate for growing nitride semiconductor and then partially etched to the substrate for growing nitride semiconductor to form projected and recessed parts, and after that, ELOG is carried out on the under layer having the projected and recessed parts to form a laterally grown layer. Next, after an n-type nitride semiconductor layer, an active layer, and a p-type nitride semiconductor layer are successively formed on the laterally grown layer, a conductive substrate is bound to the p-type nitride semiconductor layer. Finally, laser is radiated to the entire surface of the face where no under layer of the substrate for growing nitride semiconductor is formed to remove the substrate for growing nitride semiconductor and the under layer by decomposition of the under layer. By the method, $N_2$ gas generated by the decomposition of the nitride semiconductor at the time of electromagnetic radiation is spread to the voids among the foregoing projected and recessed parts and the laterally grown layer to prevent cracking of the substrate for growing nitride semiconductor owing to gas pressure and further prevent scooping damages of the under layer attributed to the cracking and consequently obtain a nitride semiconductor substrate with excellent plane state and crystallinity. As compared with a method by polishing, the work process can be simplified to result in improvement of the production yield.

Figure 15:
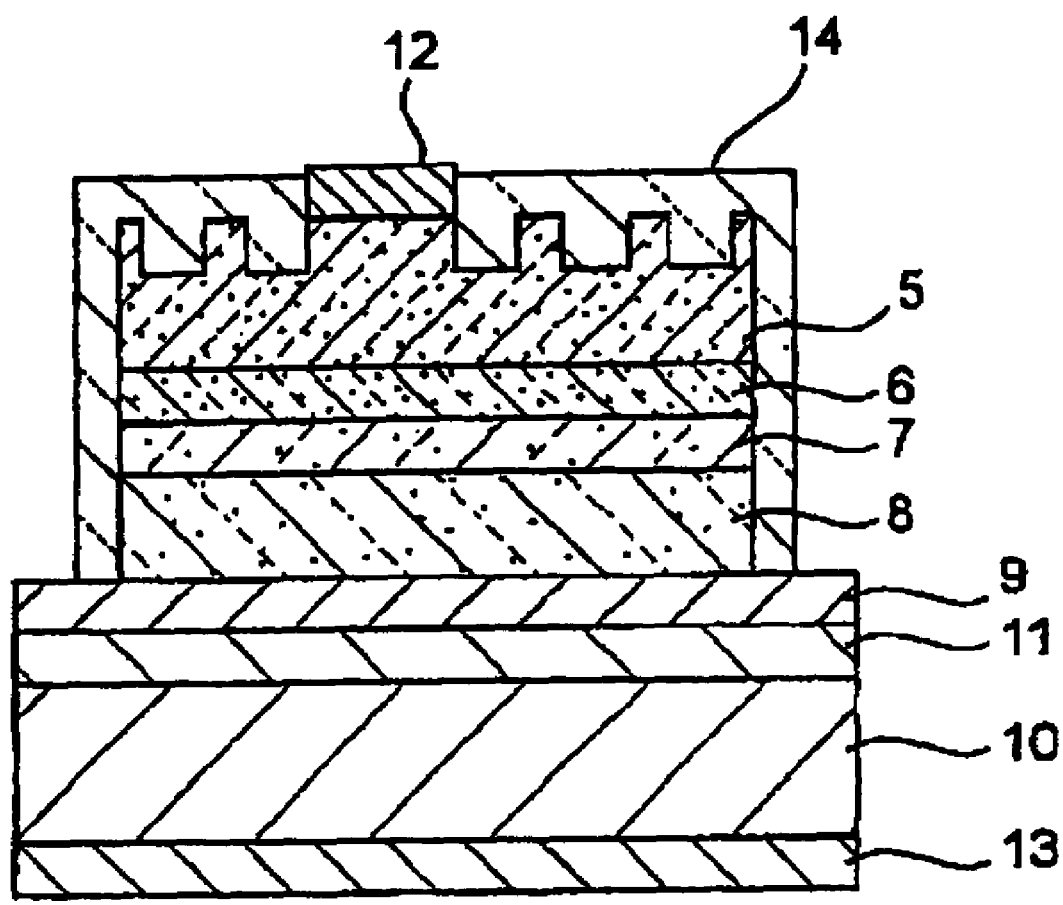
FIG. 15 is a schematic cross-sectional view showing an embodiment in which dimples are formed in the surface of an n-type nitride semiconductor layer.

Further, to improve the luminescence outputting efficiency, as shown in FIG. 15, projected and recessed parts (dimples) may be formed by RIE of the exposed face of the n-type nitride semiconductor layer 5 after the removal of the substrate for growing nitride semiconductor. The projected and recessed part (dimples) formed side is a luminescence outputting side of the nitride semiconductor. Owing to the projected and recessed part formation in the surface, the light rays which cannot come out due to the total reflection can be emitted by angular change of the light rays by the projected and recessed face. That is, the emitted light rays can be emitted by diffused reflection in the projected and recessed parts and light rays which are conventionally totally reflected are led upward and outputted to the outside of the device. It can be expected to improve the output by the formation of the projected and recessed parts 1.5 times as high as that without projected and recessed part formation. The plane shape of the projected and recessed parts is preferably round or polygonal such as hexagonal or triangular. The plane shape of the projected and recessed parts is also preferable to be in stripes, lattice, rectangular. In order to improve the luminescence outputting efficiency, pattern pitches of the projected and recessed parts are preferably as fine as possible. Further, the cross-sectional shape of the projected and recessed parts is preferably gently corrugated shape rather than composed of flat and straight lines. The luminescence outputting efficiency can be improved by making the cross-sectional shape of the projected and recessed parts be a corrugated shape as compared with that in the case the cross-sectional shape is made angular. Further, the depth of the recessed parts is preferably 0.2 to 3 µm, more preferably 0.1 to 1.5 µm. Because if the depth of the recessed parts is too shallow, the effect to improve the luminescence outputting efficiency cannot be sufficient and if it is too deep, the resistance in the lateral direction is increased. In the case the recessed parts are formed by scooping in round or polygonal shape, the output can be improved while the resistance value being kept low.

Further, multilayer electrodes of such as Ti—Al—Ni—Au or W—Al—W—Pt—Au can be employed for the n-electrode to be formed on the exposed face of the n-type nitride semiconductor layer. The thickness of the n-electrode is preferably 0.1 to 1.5 µm. An insulating protection film of such as $SiO_2$, $Al_2O_3$, $ZrO_2$, $TiO_2$ and the like is preferably formed so as to coat the exposed face other than the n-electrode.

The p-electrode and n-electrode are not limited in the shapes and the sizes as long as the p-electrode is formed in one main face of the nitride semiconductor device and the n-electrode is formed in the other main face. Preferably, both electrodes are arranged on the opposite to each other so as not to be overlapped when observed in the layered direction of the nitride semiconductor layers. By this arrangement, in the case of a face-down structure, emitted light can be efficiently outputted without being shielded by the n-electrode. For example, in the case that the p-electrode is formed over almost the entire surface of the p-type nitride semiconductor layer, the n-electrode may be divided into two or four and placed in the corner portions of the n-type nitride semiconductor layer. Alternatively, the n-electrode may be formed in a lattice-like shape over the entire face of the n-type semiconductor layer, or may be formed at the corner portions of the n-type semicondutor in a lattice-like shape.

With reference to FIG. 5, the preferable shapes of the p-electrode and the n-electrode will be described in details.

Figure 5A:
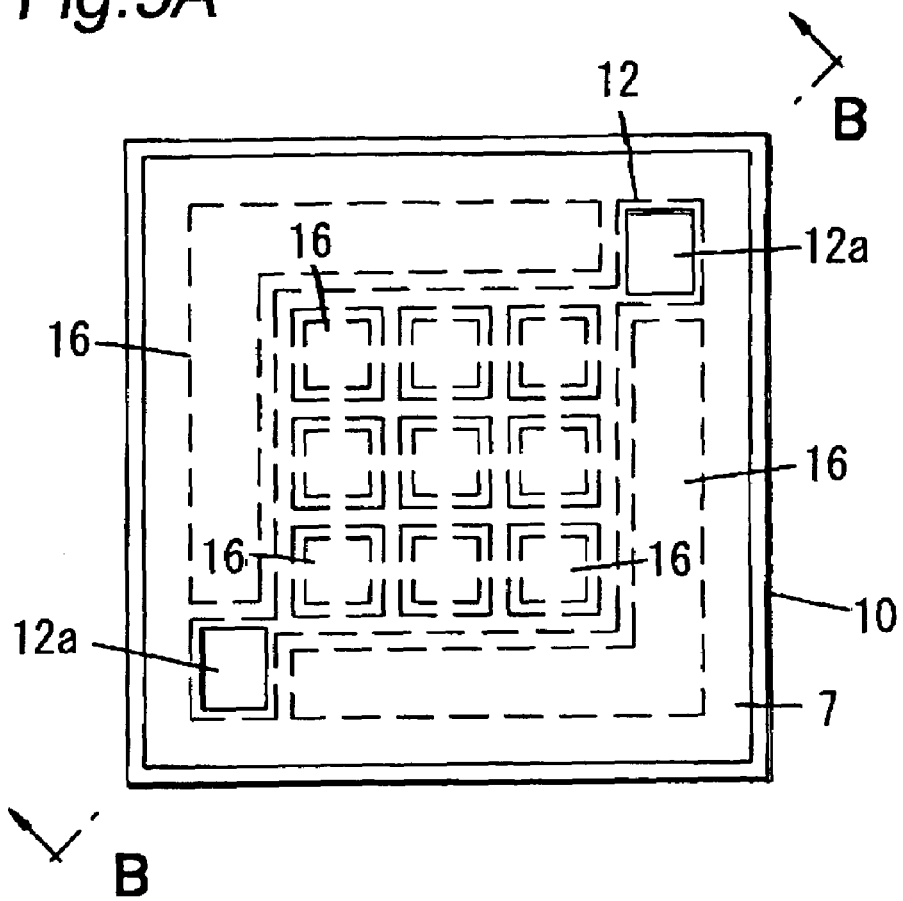
FIGS. 5A and 5B show a plane view and a cross-sectional view illustrating one embodiment of a nitride semiconductor device according to the invention.
Figure 5B:
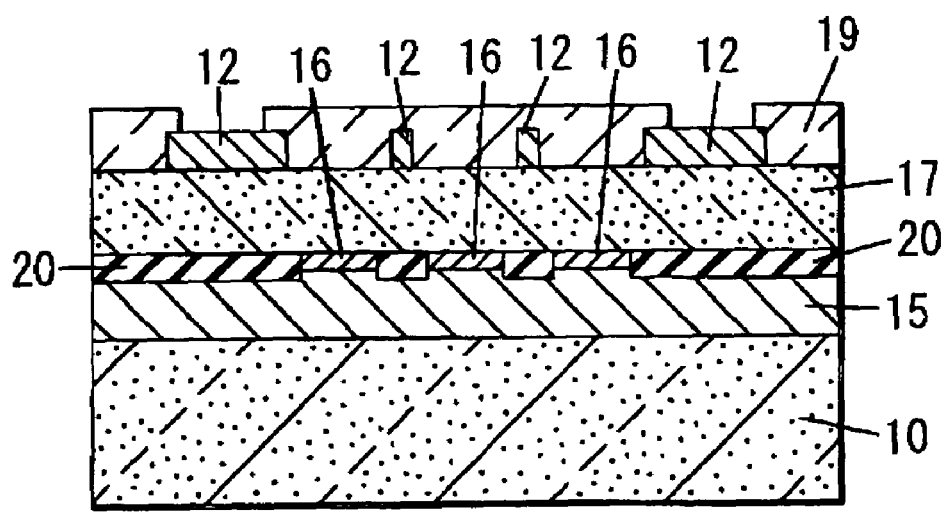

FIGS. 5A and 5B show a plane view and a cross-sectional view illustrating one nitride semiconductor device according to the invention. A conductive layer 15 of an eutectic from a first and a second bonding layers, a p-electrode 16, and a nitride semiconductor 17 are successively formed on a supporting substrate 10. An n-electrode 12 is formed on the nitride semiconductor 17. The n-electrode 12 comprises pad electrode formation regions 12*a* in the corner parts in a diagonal line of a chip and is spread like a net between the pad electrode formation regions 12*a*. The electrode 12 is formed in net-like or lattice-like shape on the approximately entire face in the light emitting range, so that current can flow evenly in the nitride semiconductor layer 17. The pad electrode formation region 12*a* may not be limited to two regions on the diagonal line but formed in all four corners. The p-electrode 16 and the n-electrode 12 are formed in a manner that both electrodes are not overlapped when being observed from the top face of the chip. A protection film 19 is formed on the n-electrode 12. The protection film 19 may be formed not only on the nitride semiconductor layer 17 but also on the p-electrode 16 other than on the pad electrode formation regions 12*a* of the n-electrode.

As illustrated in FIG. 5B, apertures are formed in the p-electrode 16 adjacent to the nitride semiconductor 17 and an insulating protection film 20 is formed in the inside of the apertures. A monolayer film or a multilayer film of $SiO_2$, $Al_2O_3$, $ZrO_2$, $TiO_2$ and the like may be used for a material of the protection film 20. Formation of the insulating protection film 20 prevents short-circuiting and improves the yield and the reliability. The protection film 20 preferably has a double layer structure with a reflection film (not illustrated). For example, formation of a reflection film (not illustrated) of Al, Ag, Rh or the like in a thickness of not thinner than 500 Å and not thicker than 2,000 Å in the side where the protection film 20 does not contact with the nitride semiconductor 17 improves the output efficiently of light transmitted in the lateral direction. The reflection film may be formed in the supporting substrate 10 side or in the nitride semiconductor 17 side.

Incidentally, the electric connection of the p-electrode 16 and the outside of the device can be formed through the conductive layer 15. For example, in the case the supporting substrate 10 is conductive, a wire is connected to the rear face of the supporting substrate 10, so that the electric connection of the p-electrode 16 and its outside part can be formed through the conductive layer 15 and the supporting substrate 10. In the case the supporting substrate 10 is not conductive, a wire is connected to the conductive layer 15 from the chip side face, so that the electric connection of the p-electrode 16 and its outside part can be formed. Further, the supporting substrate 10 and the conductive layer 15 may be made to be wider than the nitride semiconductor layer 17 and a wire may be connected to the part of the conductive layer 15 which is not coated with the nitride semiconductor layer 17.

Hereinafter, a practical constitution of a nitride semiconductor device according to the invention will be described.

(Under Layer)

An under layer 2 can be composed of at least one or more nitride semiconductor layers and it is preferably composed of a buffer layer 3 grown at a low temperature on a substrate for growing nitride semiconductor 1 and a high temperature grown layer 4 grown at a high temperature on the buffer layer.

The buffer layer 3 is made of a nitride semiconductor of $Ga_iAl_{1-i}N$, ($0<i\leq 1$) and use of a nitride semiconductor with a low Al ratio, preferably GaN, improves the crystallinity of a nitride semiconductor to be grown on the buffer layer. The thickness of the buffer layer is preferably 0.002 to 0.5 μm, more preferably 0.005 to 0.2 μm, and further more preferably 0.01 to 0.02 μm.

The growing temperature of the buffer layer is preferably 200 to 900° C., more preferably 400 to 800° C.

An un-doped GaN or GaN doped with an n-type impurity is preferable to be used for the high temperature grown layer 4. Generally, since GaN has excellent crystallinity, growth of GaN as an under layer improves the crystallinity of the device structure to be grown thereon. Incidentally, the high temperature grown layer 4 may contain In and Al to an extent that the crystallinity improvement effect is not lost. The In ratio in the high temperature grown layer 4 is preferably not higher than 0.01. Also, the Al ratio in the high temperature grown layer 4 is desirably not higher than 0.01. Especially in the case the high temperature grown layer 4 contains In, the crystal of the high temperature grown layer 4 is softened and therefore, an effect to moderate the strain generated in the interface to the substrate for growing nitride semiconductor can be obtained. The thickness of the high temperature grown layer is preferably not thinner than 500 Å, further preferably not thinner than 5 μm, and further more preferably not thinner than 10 μm. The growth temperature of the high temperature grown layer is preferably 900 to 1,100° C., more preferably 1,050° C. or higher.

In the case the nitride semiconductor employed for the high temperature grown layer 4 self-absorbs the luminescence from the active layer, the high temperature grown layer 4 is preferable to be removed finally. For example, in the case the band gap energy of the high temperature grown layer 4 is smaller than (luminescence peak energy +0.1 ev), luminescence from the active layer is absorbed by such a high temperature grown layer 4, so that removal of the high temperature grown layer 4 results in increase of the luminous intensity. If the thickness is thin enough to suppress the self-absorption of the luminescence to a negligible level, for example, a thickness of 0.1 μm or thinner (more preferably, 0.01 μm or thinner), a portion of the high temperature grown layer 4 may be left.

(n-Type Clad Layer Working also as n-type Contact Layer 5)

Any n-type clad layer 5 is not particularly limited if it has a composition with a higher band gap energy than that of the active layer 6 and is capable of enclosing the carrier in the active layer 6, however $Al_jGa_{1-j}N$, ($0<j<0.3$) is preferable. Here, $0.1<j<0.2$ is further preferable. Although the thickness of the n-type clad layer is not particularly limited, it is preferably 0.01 to 0.1 μm, further preferably 0.03 to 0.06 μm. The n-type impurity concentration of the n-type clad layer is also not limited, however it is preferably $1\times10^{17}$ to $1\times10^{20}/cm^3$, more preferably $1\times10^{18}$ to $1\times10^{19}/cm^3$. Further, in the invention, in the case the substrate for growing nitride semiconductor, the under layer and GaN of the high temperature grown layer are removed after the conductive substrate is bound, a certain thickness is required and in such a case the thickness if controlled to be 1 to 10 μm, further preferably 1 to 5 μm. Incidentally, in this embodiment of the invention, the n-type clad layer 5 works also as the n-type contact layer.

(Another Embodiment of n-type Contact Layer)

Any material can be used for the n-electrode in the embodiment of the invention if the material is capable of having ohmic contact with the n-type nitride semiconductor layer. However, in the case the following steps (1) to (5) are carried out in the this order in the fabrication process as the process of the invention; (1) p-electrode formation; (2) ohmic annealing; (3) bonding the conductive substrate; (4) removing the substrate for growing nitride semiconductor; and (5) forming the n-electrode; the n-electrode can be formed without the ohmic annealing. Further, if it is tried to carry out ohmic annealing, since an eutectic layer exists in the bonding layer of the conductive substrate, annealing at a high temperature is difficult to be carried out. Therefore, in the step of cleaning treatment to be carried out after the n-electrode formation, the substrate is heated at 150 to 350° C. to result in a problem that the n-electrode is made thermally unstable. Further, with respect to a high output light emitting device fabricated in such fabrication steps, there occurs a problem that the n-electrode is made thermally unstable by the heat at the time of light emission. Further, owing to the thermal instability, the ohmic contact tends to be Schottky contact.

In the constitution of the invention, since the n-type nitride semiconductor layer is exposed by removing the substrate for growing nitride semiconductor and the n-electrode is formed in the exposed face, micro cracking is sometimes observed in the exposed face owing to polishing. Occurrence of the cracks not only interferes even flow of electric current but also makes it impossible to obtain high bonding strength between the n-electrode and the n-type nitride semiconductor layer with a high productivity.

Since the under layer which self-absorbs the luminescence of the active layer is removed together with the substrate for growing nitride semiconductor in the embodiment of the invention, the band gap energy of the contact layer (the n-type clad layer in this embodiment of the invention) is high as compared with that of a conventional nitride semiconductor light emitting device. However, generally, the higher the band gap energy of a semiconductor material becomes, the more difficult it tends to become to have ohmic contact.

As a preferable embodiment to solve such problems as described above, the nitride semiconductor device of the invention comprises the n-electrode contacting with the n-type nitride semiconductor layer and the n-type nitride semiconductor layer is composed of at least two layers; a first n-type nitride semiconductor layer doped with an n-type impurity as a layer contacting with the n-electrode and a second n-type nitride semiconductor layer un-doped or doped with an n-type impurity in a less amount than that of the first n-type nitride semiconductor layer in the active layer side rather than the first n-type nitride semiconductor layer. For example, as shown in FIG. 10, the n-type clad layer 5 working also as an n-type contact layer is divided into a first n-type nitride semiconductor layer 5a and a second n-type nitride semiconductor layer 5b.

The doping amount of the n-type impurity is not lower than $3 \times 10^{18}/cm^3$ and not higher than $1 \times 10^{20}/cm^3$ for the first n-type nitride semiconductor layer 5a, and not lower than $1 \times 10^{17}/cm^3$ and lower than $3 \times 10^{18}/cm^3$ or none for the second n-type nitride semiconductor layer 5b, respectively. The respective n-type nitride semiconductor layers may have similar or dissimilar compositions, however they are preferably formed with compositions in the above-mentioned range of the preferable composition of the n-type clad layer 5.

The reason for the less n-type impurity concentration of the second n-type nitride semiconductor layer 5b nearer to the active layer is to avoid an inverse effect of the n-type impurity on the active layer. Since the invention involves particular steps such as a step of press-bonding by heating at the time of bonding a conductive supporting substrate and a step of removing a portion of the n-type nitride semiconductor layer by polishing and laser radiation, if the a large quantity of the n-type impurity is contained in the n-type nitride semiconductor layer near the active layer, the impurity causes inverse effects on the active layer. Therefore, the first n-type nitride semiconductor layer 5a forming the n-electrode is doped in a high concentration, whereas the second n-type nitride semiconductor layer 5b nearer to the active layer is doped in a decreased n-type impurity concentration, so that a nitride semiconductor device with excellent properties can be obtained.

The thickness of the first n-type nitride semiconductor layer 5a is required to be thick to a certain extent since the substrate for growing nitride semiconductor, the under layer and the GaN of the high temperature grown layer are removed and it is preferably 1.5 to 10 μm, more preferably 1 to 5 μm. Especially, since the precision of polishing is about ±0.5 μm, at least 1 μm or more is required. The thickness of the second n-type nitride semiconductor layer 5b is required to be enough to moderate the mechanical impact at the time of removing the substrate for growing nitride semiconductor and exposing the first nitride semiconductor layer and maintain the excellent light emitting properties of the active layer and it is preferably 0.1 μm or thicker and 1.5 μm or thinner. The second nitride semiconductor layer 5b also has a function of restoring the deterioration of the crystallinity attributed to the doping to the impurity in a high concentration in the first nitride semiconductor layer 5a. The total thickness of the n-type nitride semiconductor layer including the first n-type nitride semiconductor layer 5a and the second n-type nitride semiconductor layer 5b is preferably thicker than the total thickness of the p-type nitride semiconductor layer and accordingly, the n-electrode is hardly affected by heat due to the light emission since the electrode is parted more from the active layer than the p-electrode formed in the conductive substrate side at the viewpoint from the active layer.

(Active Layer)

The active layer 6 to be employed for the invention has a quantum well structure comprising at least a well layer of $Al_a In_b Ga_{1-a-b}N$, ($0 \leq a \leq 1$, $0 \leq b \leq 1$, $a+b \leq 1$) and a barrier layer of $Al_c In_d Ga_{1-c-d}N$, ($0 \leq c \leq 1$, $0 \leq d \leq 1$, $c+d \leq 1$). Further preferably, the foregoing well layer and barrier layer are $Al_a In_b Ga_{1-a-b}N$, ($0 < a \leq 1$, $0 < b \leq 1$, $a+b < 1$) and a barrier layer of $Al_c In_d Ga_{1-c-d}N$, ($0 < c \leq 1$, $0 \leq d \leq 1$, $c+d < 1$), respectively. The wavelength of the luminescence of the active layer is preferably 380 nm or shorter and practically the band gap energy of the well layer is preferably equivalent to the wavelength of 380 nm or shorter.

The nitride semiconductor to be used for the active layer may be non-doped, doped with an n-type impurity, or doped with a p-type impurity and preferably a nitride semiconductor which is non-doped or un-doped or doped with an n-type impurity is used to provide a high output light emitting device. Further preferably, the well layer is made to be a un-doped layer and the barrier layer is an n-impurity-doped layer to increase the light emitting efficiency of the light emitting device.

In this case, the quantum well structure may be either multilayer quantum well structure or a single quantum well structure. The multilayer quantum well structure is preferable since the output can be improved and the oscillation threshold value can be decreased.

(Well Layer)

The well layer to be employed for the light emitting device of the invention may be p-type impurity-doped or n-type impurity-doped or undoped, however it is preferably doped with an n-type impurity because the light emitting efficiency can be improved. On the other hand, in the case of a quaternary mixed crystal of AlInGaN, the crystallinity is decreased if the impurity concentration is high, and for that, the impurity concentration is required to be low in order to form a well layer with excellent crystallinity. Practically, in order to improve the crystallinity to the maximum extent, an un-doped well layer has to be grown and in this case the well layer with practically free from impurities as low impurity concentration as $5 \times 10^{16}/cm^3$ or lower is preferable.

Further, in the case an n-type impurity is doped, doping with an n-type impurity concentration in a range of $1 \times 10^{17}/cm^3$ or lower and $5 \times 10^{16}/cm^3$ or higher is preferable. If the n-type impurity concentration is in the range, the carrier concentration can be increased while the crystallinity deterioration being suppressed and therefore, the threshold current density and $V_f$ can be lowered. Further, in the case the well layer is doped with an-type impurity, the n-type impurity concentration of the well layer is preferably adjusted to be approximately same as or lower than the n-type impurity concentration of the barrier layer. Because re-coupling in the well layer is promoted and the luminescence output can be improved. Further, the well layer and the barrier layer may be grown while being undoped. In the case of a multilayer quantum well structure, the impurity concentrations of a plurality of well layers are not necessarily same.

In the case of a high output device such as a high output LD and a high power LED, to be operated with a high quantity of electric current, if the well layer is undoped and practically contains no n-type impurity, the re-coupling of carriers in the well layer can be promoted and light emitting re-coupling can be carried out at a high efficiency. On the other hand, if an n-type impurity is doped into the well layer, an undesired cycle of increase of the carrier density in the well layer, decrease of the probability of the light emitting re-coupling, and increase of the operation current under constant output is caused to result in shortening of the device life. Accordingly, it is preferable in the case of a high out put device that the n-type impurity of the well layer is suppressed to $1\times10^{18}/cm^3$ or lower, more preferably undoped or practically free from the n-impurity. Consequently, a stably operable light emitting device with a high output can be obtained.

The well layer constitution illustrated in the following embodiment of the invention is preferable for a well layer having a band gap energy to make luminescence and oscillation possible.

The well layer to be employed for a light emitting device of the invention is for obtaining luminescence in a wavelength range difficult to obtain by a conventional well layer of InGaN, practically luminescence with around 365 nm wavelength, which is the band gap energy of GaN, or with wavelength shorter than that and has band gap energy sufficient to give luminance or oscillation with 380 nm or shorter wavelength. In the case of a conventional well layer of InGaN, if wavelength close to 365 nm wavelength equivalent to the band gap energy of GaN, for example 370 nm wavelength, is tried to obtain, the In composition ratio has to be adjusted to be 1% or lower. However, if the In composition ratio becomes as extremely low as described above, the light emitting efficiency is decreased to make it impossible to obtain a light emitting device with sufficient output and make it difficult to control the growth. In the invention, a well-layer of a nitride semiconductor containing Al and In is used, so that the band gap energy can be increased by increasing the Al composition ratio and a light emitting device provided with a high inner quantum efficiency and light emitting efficiency even in a wavelength range around 380 nm, in which efficient light emission has been conventionally difficult, can be obtained by adding In.

The In composition ratio b in the quaternary mixed crystal of InAlGaN to be used for the well layer is preferably not lower than 0.02 and not higher than 0.1, more preferably not lower than 0.03 and not higher than 0.05. High light emitting efficiency and inner quantum efficiency as compared with those of the case with the ratio of lower than 0.02 can be obtained by controlling the In composition ratio b to be not lower than 0.02 as the lowest limit and the efficiency is further improved by controlling the ratio to be not lower than 0.03. On the other hand, deterioration of crystallinity attributed to addition of In can be suppressed by controlling the ratio to be not higher than 0.1 as the highest limit and the well layer with suppressed crystallinity can be formed by further controlling the ratio to be not higher than 0.05 and therefore, in the case of forming a plurality of well layers just like a case of a multilayer quantum well structure, the crystallinity of the respective well layers can be make good.

Also, the Al composition ratio a in the quaternary mixed crystal of InAlGaN to be used for the well layer is preferably not lower than 0.02 in the case a band gap energy equivalent to 380 nm wavelength is formed, further preferably not lower than 0.05 in the case a band gap energy equivalent to 365 nm wavelength is formed in order to obtain high luminescence and oscillation.

The thickness of the well layer is preferably not thinner than 1 nm and not thicker than 30 nm, further preferably not thinner than 2 nm and not thicker than 20 nm, furthermore preferably not thinner than 3.5 nm and not thicker than 20 nm. Because if it is thinner than 1 nm, the well layer does not function well and if it is thicker than 30 nm, the crystallinity of the quaternary mixed crystal of InAlGaN is degraded to result in deterioration of the properties of the obtained device. Further, if it is not thinner than 2 nm, a layer with relatively even quality without significant thickness unevenness can be obtained and if it is not thicker than 20 nm, the crystal growth with suppressed crystal defect can be made possible. Further, the output can be improved by controlling the thickness to be 3.5 nm or thicker. That is, increase of the thickness of the well layer promotes luminescent re-coupling of a large quantity of injected carriers based on the high light emitting efficiency and inner quantum efficiency just like a case of LD operated with large electric current and it is especially effective for a multilayer quantum well structure. Further, by controlling the thickness in a monolayer quantum well structure to be 5 nm or thicker, a similar effect as described above to improve the output can be obtained.

In the case that the In ratio in the InGaN well layer is 0.01 or smaller, it is preferable that the thickness of the well layer is 10 nm or more and the composition of the barrier layer is $Al_cGa_{1-c}N$ (0<c<1). This provides a light emitting device having high luminescence efficiency at the wavelength of 370 nm or below.

(Barrier Layer)

In the active layer of the quantum well structure, barrier layers may be formed reciprocally with well layers and a plurality of barrier layers may be formed to each one well layer. For example, two or more barrier layers may be sandwiched between neighboring well layers and multilayered barrier layers and well layers may be reciprocally stacked.

Similar to the well layers, the barrier layers are preferably p-type impurity-doped or n-type impurity-doped or undoped, more preferably n-type impurity-doped or undoped. For example, in the case the barrier layers are doped with an n-type impurity, the concentration is required to be $5\times10^{16}/cm^3$ or higher. For example, in the case of LED, the concentration is preferably not lower than $5\times10^{16}/cm^3$ and not higher than $2\times10^{18}/cm^3$. In the case of high output LED or LD, the concentration is preferably not lower than $5\times10^{17}/cm^3$ and not higher than $1\times10^{20}/cm^3$, further preferably not lower than $1\times10^{18}/cm^3$ and not higher than $5\times10^{19}/cm^3$. In this case, the well layers are preferably grown while being doped with practically no n-type impurity or being undoped.

In the case the barrier layers are doped with an n-type impurity, all of the barrier layers in the active layer may be doped or some may be doped and the rest may be undoped. In the case some of the barrier layers are doped, doping is preferably carried out in the barrier layers which are arranged in the n-type layer side in the active layer. For example, doping is carried out in a barrier layer $B_n$ (n denotes a positive integer) in the n-th plane from the n-type layer side, so that electrons are injected efficiently into the active layer and an excellent light emitting device with high light emitting efficiency and inner quantum efficiency can be obtained. Further, also with respect to the well layers, a similar effect to that of the above mentioned barrier layer case can be obtained by doping the well layer $W_m$ (m denotes a positive integer) in the m-th plane from the n-type layer side. The similar effect can be obtained also in the case of doping both barrier layer and well layer.

The barrier layer constitution illustrated in the following embodiment of the invention is a preferable constitution having a band gap energy to make luminescence and oscillation with wavelength of 380 nm or shorter possible.

With respect to a light emitting device of the invention, it is required to use a nitride semiconductor having a higher band gap energy for the barrier layers than that for the well layers. Especially, in the case of well layers with luminescent wavelength in a region of 380 nm or shorter, a quaternary mixed crystal of AlInGaN having a general formula $Al_cIn_dGa_{1-c-d}N$, ($0<c\leq1$, $0\leq d\leq1$, $c+d<1$) or a ternary mixed crystal of AlGaN is preferably used for the barrier layers. A quantum well structure having a high light emitting efficiency as a light emitting device can be formed by adjusting the Al composition ratio c in a barrier layer to be higher than the Al composition ratio a in a well layer so as to be $c>a$ and keeping sufficiently high band gap energy between the barrier layer and the well layer. In the case, a barrier layer contains In ($d>0$), the In composition ratio d is not higher than 0.1, preferably not higher than 0.05. It is because, in the case, In composition ratio becomes higher than 0.1, the reaction of Al and In is promoted during the growth, the crystallinity could be degenerated, and excellent film couldn't be formed. By controlling the In composition ratio to be 0.05 or lower, the crystallinity can be further improved and excellent film can be formed by controlling the In composition ratio d to be 0.05 or lower.

Further, since the difference of band gap energy can be formed mainly depending on the Al composition ratio and the In composition ratio d in a barrier layer can be optional in a wide range as compared with the In composition ratio b in a well layer, it is possible to adjust as $d\leq b$. In such as case, since the critical thickness of the well layer and the barrier layer can be changed, the thickness can be optionally set in the quantum well structure and an active layer with desired properties can be designed.

The thickness of a barrier layer is similar to that of a well layer and preferably not thinner than 1 nm and not thicker than 30 nm, more preferably not thinner than 2 nm and not thicker than 20 nm. Because if it is thinner than 1 nm, no layer that has even thickness and sufficiently functions as a barrier layer can be formed and if it is thicker than 30 nm, the crystallinity is deteriorated.

(p-Type Clad Layer)

A p-type clad layer is not particularly limited if it has a composition with a higher band gap energy than that of the active layer 6 and is capable of enclosing carriers in the active layer 6, however a layer of $Al_kGa_{1-k}N$, ($0\leq k<1$), more preferable $Al_kGa_{1-k}N$, ($0<k<0.4$), is employed. Here, $0.15<k<0.3$ is furthermore preferable. Although the thickness of the p-type clad layer is not particularly limited, it is preferably 0.01 to 0.15 μm, further preferably 0.04 to 0.08 μm. The p-type impurity concentration of the p-type clad layer is not limited, however it is preferably $1\times10^{18}$ to $1\times10^{21}$/cm³, more preferably $1\times10^{19}$ to $5\times10^{20}$/cm³. If the p-type impurity concentration is with in the above-mentioned range, the bulk resistance can be decreased without deteriorating the crystallinity.

The p-type clad layer may be either a monolayer or a multilayer structure (a superlattice structure). In the case of the multilayer structure, it may be a multilayer structure composed of the foregoing $Al_kGa_{1-k}N$ and nitride semiconductor layers with a smaller band gap energy than that of the $Al_kGa_{1-k}N$. For example, as the layers with a smaller band gap energy, similarly to the case of the n-type clad layer, $In_lGa_{1-l}N$, ($0\leq l<1$), $Al_mGa_{1-m}N$, ($0\leq m<1$, m>1) can be exemplified. The thickness of each layer composing the multilayer structure is preferably 100 Å or thinner, more preferably 70 Å, or thinner and furthermore preferably 10 to 40 Å in the case of the superlattice structure. In the case the p-type clad layer has the multilayer structure composed of layers with higher band gap energy and layers with smaller band gap energy, either the layers with higher band gap energy or the layers with smaller band gap energy may be doped with a p-type impurity. Further in the case both of the layers with higher band gap energy and the layers with smaller band gap energy are doped, the doping amount may be similar or dissimilar.

(p-Type Contact Layer)

The p-type contact layer 8 may be of $Al_fGa_{1-f}N$, ($0\leq f<1$) and especially in the case the layer is of $Al_fGa_{1-f}N$, ($0<f<0.3$), excellent ohmic contact with an ohmic electrode 9 can be obtained. The p-type impurity concentration is preferably $1\times10^{17}$/cm³ or higher.

Further, the p-type contact layer 8 preferably has a composition graded in a manner that the p-type impurity concentration is high in the conductive substrate side and the mixed crystal ratio of Al becomes lower. In this case the graded composition may be a composition successively changed or a composition changed intermittently step by step. For example, the p-type contact layer 8 may be composed of a first p-type contact layer contacting with the ohmic electrode 9 and having a high p-type impurity concentration and a low Al composition ratio and a second p-type contact layer having low p-type impurity concentration and a high Al composition ratio. Good ohmic contact can be obtained by the first p-type contact layer and self-absorption can be prevented by the second p-type contact layer.

The composition of the first p-type contact layer is preferably $Al_gGa_{1-g}N$, ($0\leq g<0.05$), more preferably $0<g<0.01$. If the Al composition ratio is within the above-mentioned range, even if high concentration doping with p-type impurity is carried out, inactivation of the impurity can be prevented and excellent ohmic contact can be obtained. The p-type impurity concentration of the first p-type contact layer is preferably $1\times10^{19}$/cm³ to $1\times10^{22}$/cm³, further preferably $5\times10^{20}$/cm³ to $5\times10^{21}$/cm³. Further, the thickness of the first p-type contact layer is preferably 100 to 500 Å, more preferably 150 to 300 Å.

On the other hand, the composition of the second p-type contact layer is preferably $Al_hGa_{1-h}N$, ($0\leq h<0.1$), more preferably $0.1<h<0.05$. If the Al composition ratio is within the above-mentioned range, self-absorption can be prevented. The p-type impurity concentration of the second p-type contact layer is preferably $1\times10^{20}$/cm³ or lower, further preferably $5\times10^{18}$/cm³ to $5\times10^{19}$/cm³. Further, the thickness of the second p-type contact layer is preferably 400 to 1,200 Å, more preferably 800 to 1,200 Å.

(Phosphor)

(Types of Phosphors)

In a nitride semiconductor device, particularly a light emitting device, of the invention, light rays with a variety of wavelength values can be emitted by forming a coating layer or a sealing member containing a phosphor substance that emits luminescence with different wavelength values by absorbing a portion or entire luminescence from the active layer in the nitride semiconductor device composed by bonding to a supporting substrate. Some examples of the phosphor substance are as follows. As green-emitting phosphors, $SrAl_2O_4$:Eu; $Y_2SiO_5$:Ce,Tb; $MgAl_{11}O_{19}$:Ce,Tb; $Sr_7Al_{12}O_{25}$:Eu; (at least one or more of Mg, Ca, and Ba)$Ga_2S_4$:Eu; $BaAl_{12}O_{19}$:Eu, Mn; ZnS:Cu,Al can be exemplified (hereinafter, described as "group 1"). Also, as blue-emitting phosphors, $Sr_5(PO_4)_3Cl$:Eu; $(SrCaBa)_5(PO_4)_3Cl$:

Eu; (BaCa)$_5$(PO$_4$)$_3$Cl:Eu; (at least one or more of Mg, Ca (PO$_4$)$_6$Cl$_2$:Eu, Mn; BaAl$_{12}$O$_{19}$:Mn; Ca(PO$_4$)$_3$Cl:Eu; CaB$_5$O$_9$Cl:Eu can be exemplified (hereinafter, described as "group 2"). As red-emitting phosphors, Y$_2$O$_2$S:Eu; La$_2$O$_2$S: Eu; and Gd$_2$O$_2$S:Eu can be exemplified. Further, as yellow-emitting phosphors, YAG; Tb$_3$Al$_5$O$_{12}$:Ce; (BaSrCa)$_2$SiO$_4$: Eu; CaGaS$_4$:Eu is exemplified (hereinafter, described as "group 3"). As blue-gree-emitting phosphors, Sr$_4$Al$_{14}$O$_{25}$: Eu is exemplified. As yellow-red-emitting phosphors, Ca$_2$Si$_5$N$_8$:Eu is exemplified, and as orange-emitting phosphors, ZnS:Mn is exemplified, respectively, Especially, by adding YAG and a phosphor selected from group 1, an emission of white light is made possible and applications of the device is significantly wider, for example, to light sources. YAG is (Y$_{1-x}$Gd$_x$)$_3$(Al$_{1-y}$Ga$_y$)$_5$O$_{12}$:R(R denotes one or more elements selected from Ce, Tb, Pr, Sm, Eu, Dy, and Ho; 0<R<0.5). Practical examples are (Y$_{0.8}$Gd$_{0.2}$)$_3$ Al$_5$O$_{12}$:Ce and Y$_3$(Al$_{0.8}$Ga$_{0.2}$)$_5$O$_{12}$:Ce.

With respect to the materials which absorb a portion or entire light rays and emit luminescence with different wavelength values, those which absorb visible light rays and emit luminescence with different wavelength values are limited and selectivity of such materials is poor. However, materials which absorb UV rays and emit luminescence with different wavelength values exist considerably many and the materials can be selected depending on a variety of uses. One reason for the selectivity of the materials is because phosphors which absorb UV rays have high light conversion efficiency as compared with that in the case of visible light rays.

Especially, in the case of white light, high color-rendering white light can be obtained and thus the application possibility is further widened. White light is preferably obtained by combining a plurality of phosphors, for example, three kinds of phosphors selected from group 1, group 2 and group 3, respectively; two kinds selected from group 2 and group 4, respectively; two kinds selected from a group of blue-green phosphors and group 3, respectively. By applying the present invention to the nitride semiconductor device emitting UV light and coating the device with phosphor materials, a white light emitting device with an extremely high light-converting efficiency is provided.

[Particle Size of Phosphor]

The particle size of a phosphor to be employed in the invention is preferably in a range of 6 to 50 μm, more preferably 15 to 30 μm, for mean particle size. Phosphors having such a particle size has a high luminescence absorption property and high conversion efficiency and a wide range of excitation wavelength. Phosphors having a particle size smaller than 6 μm are relatively easy to agglomerate one another and be densified and precipitated in a liquid state resin and therefore decrease the light transmissivity and moreover, they have a low luminescence absorption property and low conversion efficiency and a narrow range of excitation wavelength.

In this specification of the invention, the particle size of a phosphor is a value obtained by particle size distribution curve on the basis of volume and the particle size distribution curve on the basis of volume can be obtained by measuring the particle size distribution of phosphors by laser diffraction and diffusion method. Practically, under conditions of 25° C. temperature and 70% humidity, a phosphor is dissolved in an aqueous solution of 0.05% concentration of sodium hexametaphosphate and subjected to the measurement by a laser diffraction type particle size measuring apparatus (SALD-2000A) in a particle size range of 0.03 μm to 700 μm. Also, in this specification, the center particle size of a phosphor is a particle size value calculated as the 50% integrated value in the particle size distribution curve on the basis of the volume. It is preferable that many phosphor particles having the center particle size value are added and the frequency ratio of the phosphor particles is preferably 20 to 50%. Use of such phosphor particles in a small dispersion of the particle size gives a light emitting device with suppressed color unevenness and good contrast.

(Yttrium Aluminum Oxide Type Phosphors)

Among phosphors to be employed for the invention are preferable phosphors (YAG type phosphors) mainly consisting of yttrium aluminum oxide type phosphors which are excited by luminescence emitted out of a semiconductor light emitting device comprising a light emitting layer of a nitride semiconductor and emit luminescence and which are activated by cerium (Ce) or praseodymium (Pr) since they are capable of emitting white light rays. Practical examples of the yttrium aluminum oxide type phosphors are YAlO$_3$: Ce, Y$_3$Al$_5$O$_{12}$:Ce (YAG:Ce), Y$_4$Al$_2$O$_9$:Ce and their mixtures. The yttrium aluminum oxide type phosphors may contain at least one of Ba, Sr, Mg, Ca and Zn. Addition of Si can suppress reaction of crystal growth and makes the particle size of phosphor particles even.

In this specification, a yttrium aluminum oxide type phosphor excited by Ce is especially broadly defined and include phosphors in which yttrium is partially or entirely replaced with at least one element selected a group consisting of Lu, Sc, La, Gd and Sm and/or aluminum is partially or entirely replaced with Ba, TI, Ga, In and which have luminescence emitting function.

Further in details, the yttrium aluminum oxide type phosphor means photoluminescent phosphors defined by a general formula (Y$_z$Gd$_{1-z}$)$_3$Al$_5$O$_{12}$:Ce (0<z≦1) and a general formula (Re$_{1-a}$Sm$_a$)$_3$Re'$_5$O$_{12}$:Ce (0≦a<1; 0≦b≦1; Re denotes at least one element selected from Y, Gd, La, and Sc; and Re' denotes at least one element selected from Al, Ga and In). Since the phosphors have garnet structure, they are highly durable to heat, light and water and capable of giving an excitation spectrum peak close to 450 nm. Also, they have luminescence peak near 580 nm and have a broad luminescence spectra having tails to 700 nm.

The photoluminescent phosphors can be provided with a high excitation luminescence efficiency in a long wavelength range of 460 nm or longer by adding Gd (gadolinium) in the crystal. The luminescent peak wavelength is shifted to the longer wavelength side and the entire luminescence wavelength is also shifted to the longer wavelength side by increasing the content of Gd. That is, in the case intense red-emitting color is required, it can be accomplished by increasing the amount of replacement with Gd. On the other hand, along with increase of Gd, the luminous brightness of the photoluminescence attributed to the blue color light tends to be decreased. Further, depending on the necessity, Tb, Cu, Ag, Au, Fe, Cr, Nd, Dy, Co, Ni, Ti, and Eu may be contained in addition to Ce. Moreover, in the composition of the yttrium aluminum garnet-based phosphor having the garnet structure, replacement of a portion of Al with Ga can shift the luminescence wavelength to the shorter wavelength side and replacement of a portion of Y with Gd can shift the luminescence wavelength to the higher wavelength side.

In the case a portion of Y is replaced with Gd, it is preferable to suppress the replacement with Gd to less than 10% and to control the content of Ce (replacement ratio) to be 0.03 to 1.0. If replacement with Gd is less than 20%, the green color component is increased and the red color component is decreased, however it is made possible to catch the red color component and obtain desired color tone without decreasing brightness by increasing the Ce content. With such a composition, the temperature properties can be improved and the reliability of a light emitting diode can be improved. Further, use of a photoluminescent phosphor adjusted so as to contain a large quantity of the red color component makes it possible to fabricate a light emitting apparatus capable of emitting neutral tints such as pink and the like.

Such photoluminescent phosphors can be obtained in the following manner. As raw materials of Y, Gd, Al, Ce, and Pr, oxides or compounds easy to be oxides at a high temperature are used and they are sufficiently mixed in stoichiometric ratios to obtain raw materials. Alternatively, a raw material mixture is obtained by mixing solutions produced by dissolving rare earth elements of Y, Gd, Ce, and Pr in acids, producing coprecipitates by adding oxalic acid to the mixed solution, obtaining oxides of the coprecipitates by firing the coprecipitates and mixing the obtained oxides with aluminum oxide. A proper amount of a fluoride such as barium fluoride, ammonium fluoride or the like as a flux to the obtained raw material mixture and the resulting mixture is packed in a crucible and fired at 1,350 to 1,450° C. for 2 to 5 hours in air to obtain a fired product and the fired product is ball-milled in water, washed, separated, dried, and finally sieved to obtain the phosphors.

In the nitride semiconductor device of the invention, such photoluminescent phosphors may be mixtures of two or more of cerium-activated yttrium aluminum garnet type phosphors and other phosphors. Light rays with desired color tone can be easily accomplished by mixing two types of yttrium aluminum garnet type phosphors with different replacement amounts of Y with Gd. Especially, a phosphor with a higher replacement amount is used as the foregoing phosphor and a phosphor with a less replacement amount of without replacement is used as the forgoing phosphor with a middle particle size, so that both of the color rendering property and the brightness can be simultaneously improved.

(Nitride Type Phosphors)

The phosphors to be used in the invention may include nitride type phosphors containing N, at least one element selected from Be, Mg, Ca, Sr, Ba, and Zn, and at least one element selected from C, Si, Ge, Sn, Ti, Zr, and Hf, and activated by at least one element selected from rare earth elements. The nitride-based phosphors can be excited by absorption of visible light rays and UV rays emitted out of a light emitting device, or luminescence from a YAG-type phosphor and emit luminescence. Among the nitride phosphors are preferable Mn-containing silicon nitrides such as Sr—Ca—Si—N:Eu, Ca—Si—N:Eu, Sr—Si—N:Eu, Sr—Ca—Si—O—N:Eu, Ca—Si—O—N:Eu, and Sr—Si—O—N:Eu.

The basic elements constituting of the phosphors can be defined by a general formula $L_xSi_yN_{(2/3x+4/3y)}$:Eu or $L_xSi_yO_zN_{(2/3x+4/3y-2/3z)}$:Eu (L denotes Sr, Ca, or Sr and Ca). In the general formula, X and Y are preferably as follows; X=2, Y=5 or X=1, Y=7, however optional ones are also usable. Practically, the basic constitutions of the phosphors are preferably Mn-added $(Sr_xCa_{1-x})_2Si_5N_8$:Eu, $Sr_2Si_5N_8$:Eu, $Ca_2Si_5N_8$:Eu, $Sr_xCa_{1-x}Si_7N_{10}$:Eu, $SrSi_7N_{10}$:Eu, and $CaSi_7N_{10}$:Eu. These compositions of the phosphors may contain at least one or more elements selected from Mg, Sr, Ca, Ba, Zn, B, Al, Cu, Mn, Cr, and Ni. Further, mixing ratio of Sr and Ca may be changed based on the necessity. Use of Si for the compositions of the phosphors provides economical and excellently crystalline phosphors.

With respect to the nitride type phosphors, europium (Eu), a rare earth element, is preferably used as the luminescence center. Europium has mainly divalent and trivalent energy levels. The phosphors of the invention contain $Eu^{2+}$ as an activator for the mother substances, alkaline earth nitride silcides. $Eu^{2+}$ is easy to be oxidized and Eu is commercialized in form of trivalent $Eu_2O_3$ composition. However, O greatly affects in the case of the commercialized $Eu_2O_3$ to make it difficult to obtain good phosphors. Therefore, compounds obtained by removing O from $Eu_2O_3$ to the outside of the system are preferable to be used. For example, simple substance europium and europium nitride are preferable. However, that is not so in the case Mn is added.

Mn, an additive, promotes diffusion of $Eu^{2+}$ and improves the luminescence brightness, the energy efficiency, and the luminescence efficiency such as quantum efficiency or the like. Mn may be added to raw materials or added in form of Mn simple substance or a Mn compound during the production process and fired together with the raw materials. However, Mn is not contained in the basic constitutions after the firing or remains in a slight amount as compared with the initial addition amount. It is supposedly attributed to that Mn is scattered.

The nitride type phosphors preferably contain at least one elements selected from a group consisting of Mg, Sr, Ca, Ba, Zn, B, Al, Cu, Mn, Cr, O and Ni in the basic constitutions or together with the basic constitutional elements. These elements have functions of enlarging the particle size or increasing the luminescence brightness. Further, B, Al, Mg, Cr, and Ni have functions of suppressing afterglow.

Such nitride type phosphors emit light rays in a region from yellow to red by absorbing a portion of blue color light emitted by a light emitting device. A light emitting device emitting warm color type white light by mixing yellow to red color light rays emitted from the nitride type phosphors with blue color light emitted from a light emitting device can be obtained by using the nitride type phosphors together with YAG type phosphors for the light emitting apparatus having the above-mentioned constitution. The phosphors to be added besides the nitride type phosphors preferably include cerium-activated yttrium aluminum oxide phosphors because the desired chromaticity can be adjusted by adding the foregoing yttrium aluminum oxide phosphors. The cerium-activated yttrium aluminum oxide phosphors absorb a portion of blue color light emitted from a light emitting device and emit light in a yellow region. The blue color light emitted from a light emitting device and the yellow color light of the yttrium aluminum oxide phosphors are mixed to emit bluish white light. Accordingly, a light emitting apparatus capable of emitting white type mixed color light by mixing the yttrium aluminum oxide phosphors and red-emitting phosphors together in a color conversion layer and combining the blue color light emitted from a light emitting device all together. Particularly preferable apparatus is a white light emitting apparatus having the chromaticity at the Planck Ian locus in the chromaticity diagram. Incidentally, in order to obtain a light emitting apparatus with a desired color temperature, the amount of the yttrium aluminum oxide phosphors and the amount of the red-emitting phosphors can be properly changed. The light emitting apparatus capable of emitting white type mixed color light is provided with improved CIE 1974 special color rendering index R9. A light emitting apparatus which emits white light only based on the combination of a conventional light emitting device for emitting blue color light and cerium-activated yttrium aluminum oxide phosphors has CIE 1974 special color rendering index R9 approximately zero around the color temperature Tcp=4,600 K and is insufficient in the red-emitting components. Therefore, improvement of the CIE 1974 special color rendering index R9 has been a matter to be solved and use of the red-emitting phosphors together with the yttrium aluminum oxide phosphors can increase the CIE 1974 special color rendering index R9 around the color temperature Tcp=4,600 K to about 40.

Next, a production method of a phosphor $((Sr_xCa_{1-x})_2Si_5N_8:Eu)$ according to the invention will be described, however the description is illustrative and is not to be construed as limiting the production method. The above-mentioned phosphor contains Mn and O.

(1) At first, raw materials of Sr and Ca are crushed. Simple substances are preferable to be used as the raw materials of Sr and Ca, however compounds such as imides and amides may be used. Further, the raw materials of Sr and Ca may be those containing B, Al, Cu, Mg, Mn, and $Al_2O_3$. The raw materials of Sr and Ca are crushed in a globe box in argon atmosphere. Sr and Ca obtained by crushing preferably have an average particle size of about 0.1 to 15 μm, but the average particle size is not limited to the range. The purity of Sr and Ca is preferably 2N or higher, but it is not limited. In order to improve the mixing state, at least one of metal Ca, metal Sr, and metal Eu may be alloyed and then nitrided and crushed to use the resulting powder as a raw material.

(2) A raw material of Si is crushed. A simple substance is preferable to be used, however compounds such as nitrides, imides and amides may be used. For example, $Si_3N_4$, $Si(NH_2)_2$, and $Mg_2Si$ can be used. The purity of Si is preferably 3N or higher, however it may contain compounds such as $Al_2O_3$, Mg, metal borides ($CO_3B$, $Ni_3B$, CrB), manganese oxide, $H_3BO_3$, $B_2O_3$, $Cu_2O$, CuO and the like but it is not limited. Si, as same as the raw materials of Sr and Ca, is crushed in a globe box in argon atmosphere or nitrogen atmosphere. The average particle size of the Si compound is preferably about 0.1 to 15 μm.

(3) Next, the raw materials of Sr and Ca are nitrided in nitrogen atmosphere. The reaction formula is shown as the following formula 1 and formula 2.

$$3Sr + N_2 \rightarrow Sr_3N_2 \quad \text{(formula 1)}$$

$$3Ca + N_2 \rightarrow Ca_3N_2 \quad \text{(formula 2)}$$

Sr and Ca are nitrided at 600 to 900° C. for about 5 hours in nitrogen atmosphere. Sr and Ca may be mixed and nitrided or independently nitrided. Accordingly, Sr and Ca nitrides can be obtained. The Sr and Ca nitrides are preferable to have a high purity, however those commercialized can be used.

(4) The raw material of Si is nitrided in nitrogen atmosphere. The reaction formula is shown as the following formula 3.

$$3Si + 2N_2 \rightarrow Si_3N_4 \quad \text{(formula 3)}$$

Si is also nitrided at 800 to 1,200° C. for about 5 hours in nitrogen atmosphere. Accordingly, Si nitride can be obtained. The Si nitride to be used for the invention is preferable to have a high purity, however those commercialized can be used.

(5) Nitrides of Sr, Ca, or Sr—Ca are crushed. Nitrides of Sr, Ca, or Sr—Ca are crushed are crushed in a globe box in argon atmosphere or nitrogen atmosphere. Similarly, the Si nitride is also crushed. Further, an Eu compound, $Eu_2O_3$, is also similarly crushed. As an Eu compound, europium oxide is used, however metal europium, europium nitride and the like can be used. Besides, as the raw materials of Eu, imides and amides may be used. Although high purity europium oxide is preferable, commercialized ones can be used. The average particle size of the alkali earth nitride, silicon nitride, and europium oxide after crushing is preferably about 0.1 to 15 μm.

The foregoing raw materials may contain at least one element selected from a group consisting of Mg, Sr, Ca, Ba, Zn, B, Al, Cu, Mn, Cr, O and Ni. Further, the above-mentioned elements such as Mg, Zn, B and so on may be mixed while the mixing amount being properly adjusted during the following mixing steps. These elements may be added solely to the raw materials, however in general, they are added in form of compounds. Such kind compounds include $H_3BO_3$, $Cu_2O_3$, $MgCl_2$, MgO.CaO, $Al_2O_3$, metal borides (CrB, $Mg_3B_2$, $AlB_2$, MnB), $B_2O_3$, $Cu_2O$, CuO and the like.

(6) After the above-mentioned crushing is carried out, nitrides of Sr, Ca, Sr—Ca, Si nitride, and an Eu compound $Eu_2O_3$ are mixed and Mn is added. Since the mixture of them is easy to be oxidized, mixing is carried out in a globe box in Ar atmosphere or nitrogen atmosphere.

(7) Finally, the mixture of nitrides of Sr, Ca, Sr—Ca, Si nitride, and an Eu compound $Eu_2O_3$ is fired in ammonia atmosphere. A phosphor defined as $(Sr_xCa_{1-x})_2Si_5N_8:Eu$ containing Mn can be obtained by firing. However, the composition of an aimed phosphor can be changed by changing the mixing ratios of the respective raw materials. Firing can be carried out by using a tubular furnace, a small size furnace, a high frequency furnace, a metal furnace and the like. The firing temperature may be in a range of 1,200 to 1,700° C., preferably 1,400 to 1,700° C. Firing is carried out preferably by one-step firing method involving gradually increasing the temperature and heating at 1,200 to 1,500° C. for several hours, however it may be carried out by two-step firing (or multi-step firing) method involving first-step firing at 800 to 1,000° C., gradually increasing the temperature and second-step firing at 1,200 to 1,500° C. Raw materials of the phosphors are preferably fired using a crucible or a boat made of boron nitride (BN)-based materials. Besides the crucible made of boron nitride-based materials, a crucible made of alumina ($Al_2O_3$)-based materials can be used.

By the above-mentioned production method, an aimed phosphor can be obtained.

In an embodiment of the invention, as a phosphor emitting luminescence bearing red color, particularly nitride type phosphors are used, however in the invention, a light emitting apparatus may comprise the above-mentioned YAG type phosphor and a phosphor capable of emitting red type luminescence. Such a phosphor capable of emitting red type luminescence is a phosphor excited by light rays with wavelength of 400 to 600 nm and emits luminescence and, for example, $Y_2O_2S:Eu$; $La_2O_2S:Eu$; CaS:Eu; SrS:Eu; ZnS:Mn; ZnCdS:Ag,Al; and ZnCdS:Cu, Al and the like can be exemplified. The color rendering properties of the light emitting apparatus can be improved by using the phosphor capable of emitting red type luminescence together with the YAG type phosphor.

Two or more kinds of YAG type phosphors and phosphor capable of emitting red type luminescence such as nitride type phosphors produced in the above-mentioned manner may exist in a color conversion layer composed of a single layer in the side end face of a light emitting device or one or more kinds of them may exist respectively in each layer of a color conversion layer composed of two layer. With such a constitution, mixed color light by mixing colors of luminescence from different types of phosphors can be obtained. In this case, in order to well mix the color of luminescence emitted from each phosphor and suppress the color unevenness, the average particle sizes and the shapes of the respective phosphors are preferably identical. In consideration of absorption of a portion of luminescence with wavelength converted by the YAG phosphors, the nitride type phosphors are preferable to form a color conversion layer so as to arrange the nitride type phosphors nearer to the side end face of the light emitting device than the YAG type phosphors. With such a constitution, the nitride type phosphors can be prevented from absorbing a portion of luminescence, whose wavelength is converted by the YAG phosphors and the color rendering properties of the mixed luminescence from both types of phosphors can be improved as compared with those in the case where the YAG type phosphors and nitride type phosphors are contained in form of a mixture.

(Package)

Figure 6A:
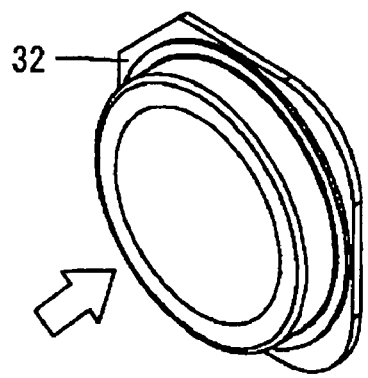
FIGS. 6A to 6C show a perspective view, a top view and a cross-sectional view illustrating one package to be employed for a nitride semiconductor device according to the invention.
Figure 6B:
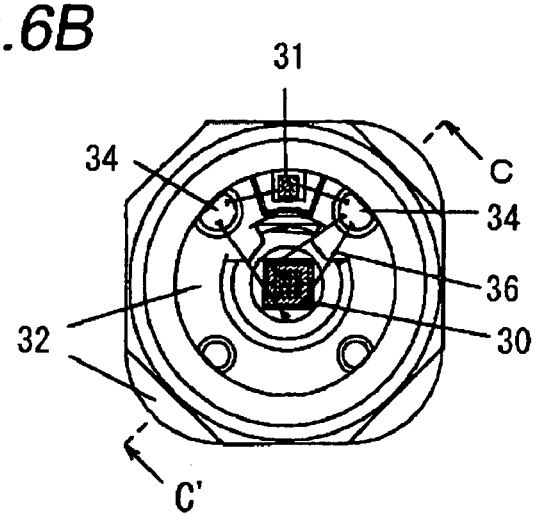
Figure 6C:
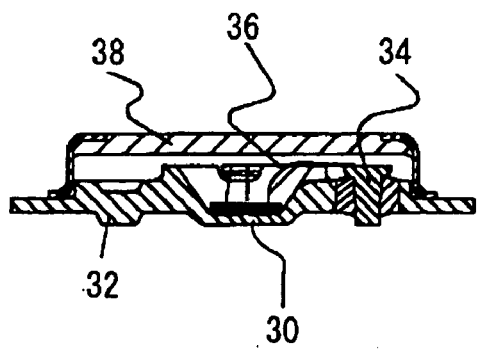

The semiconductor light emitting device obtained by the invention can be mounted, for example, in the following package to give a light emitting device. At first, as illustrated in FIGS. 6A to 6C, a nitride semiconductor light emitting device 30 is disposed in a heat sink 32 provided with a lead frame 34 and a conductive wire 36 is bonded to the lead frame 34 from the semiconductor light emitting device 30. After that, transparent glass 38 is used for packaging to obtain a light emitting device.

Figure 7A:
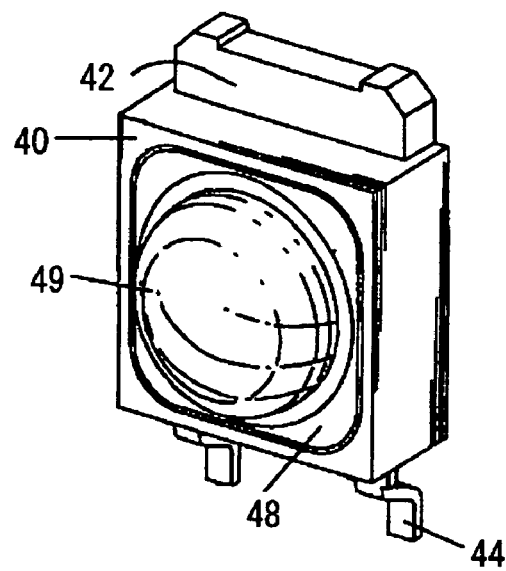
FIGS. 7A to 7C show a perspective view, a top view and a cross-sectional view illustrating another package to be employed for a nitride semiconductor device according to the invention.
Figure 7B:
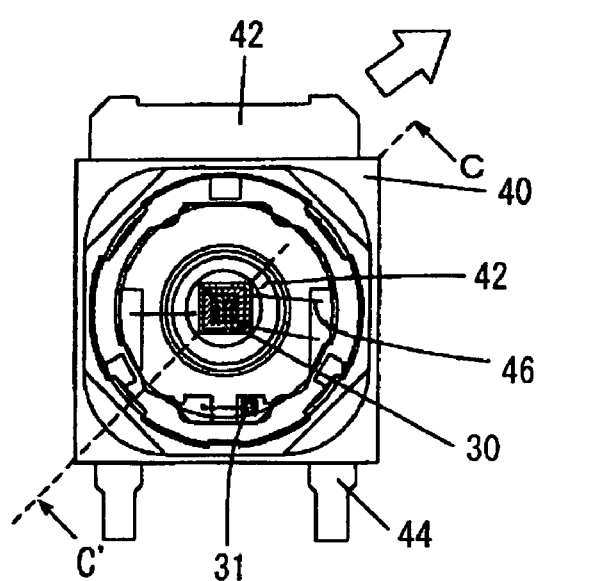
Figure 7C:
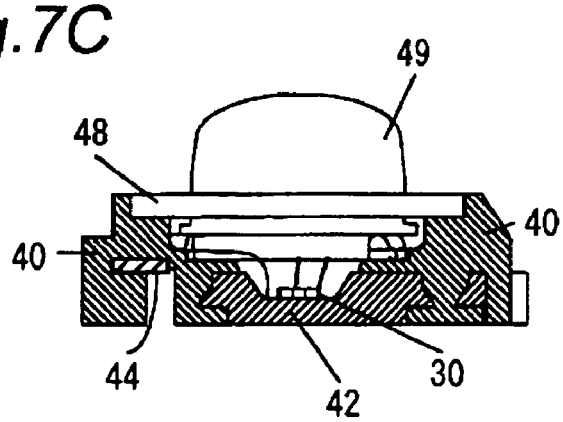
Figure 8A:
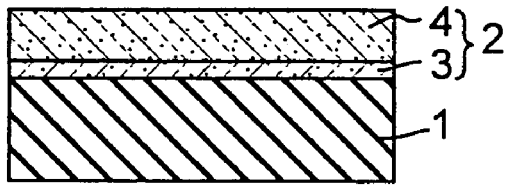
FIG. 8 is a process drawing illustrating another embodiment different from that in FIG. 1.
Figure 8B:
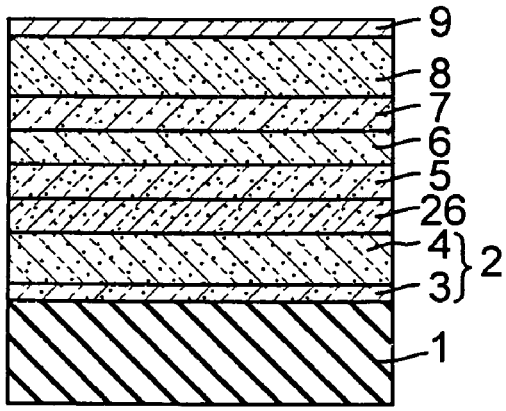
Figure 8C:
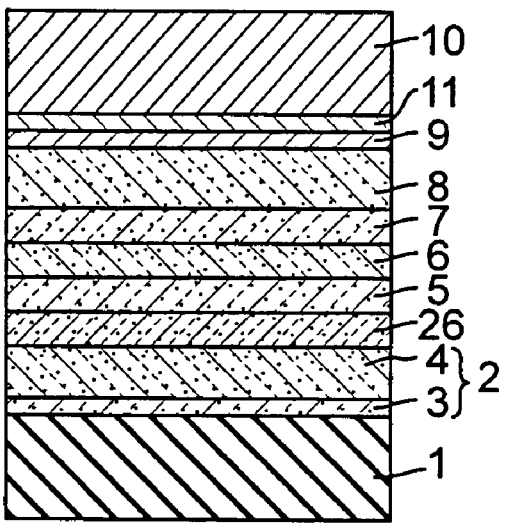
Figure 8D:
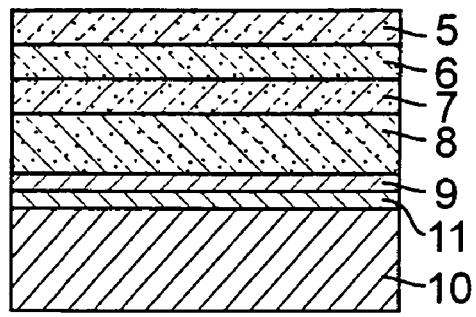
Figure 8E:
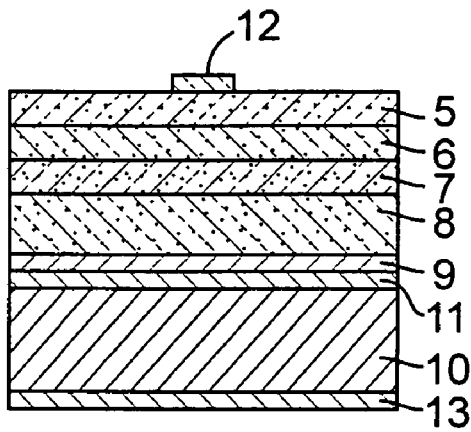

Further, a package illustrated in FIGS. 7A to 7C, in place of FIGS. 6A to 6C, may be employed. FIG. 7A illustrates a light emitting device produced by the following. A packaging resin 40 having a heat sink 42 is made ready, a semiconductor light emitting device 30 is installed in a heat sink 42, and a conductive wire 46 is bonded to the lead frame 44 from the semiconductor light emitting device 30. After that, potting resin 48 of such as silicone is applied to the foregoing semiconductor light emitting device 30. Further, a lens 49 is formed thereon to obtain a light emitting device. The light emitting devices illustrated in FIG. 6 and FIG. 7 are preferably provided with a protection apparatus 31 to protect the semiconductor light emitting devices 30 from static electricity.

Incidentally, although the above-mentioned embodiments are described along with the cases that the invention is applied to the light emitting diodes for UV emitting grown on sapphire substrates, the invention is not limited to these embodiments. It can be applied to the cases where devices are grown on substrates for growing nitride semiconductor other than sapphire and diodes emitting blue color light rays with wavelength other than UV rays. Further, the invention can be applied to not only the light emitting diodes but also laser diodes.

EXAMPLES

Example 1

In this Example, the invention was applied to a light emitting diode with 375 nm wavelength and a nitride semiconductor device was produced according to a fabrication method of the invention as illustrated in FIGS. 1A to 1E.

(Substrate for Growing Nitride Semiconductor)

A substrate of sapphire (C-plane) was used as a substrate for growing nitride semiconductor 1 and surface cleaning was carried out at 1,050° C. in hydrogen atmosphere in a MOCVD reaction vessel.

(Under Layer 2)

Buffer layer 3: Successively, a buffer layer 3 of GaN in a thickness of about 200 Å was grown on the substrate at 510° C. in hydrogen atmosphere using ammonia and TMG (trimethylgallium).

(High Temperature Grown Layer 4)

High temperature grown layer 4: After growth of the buffer layer 3, a high temperature grown nitride semiconductor 4 of undoped GaN in 5 µm thickness was grown on the substrate by stopping only TMG supply, increasing the temperature to 1,050° C., and using TMG and ammonia as raw material gases when it reached at 1,050° C.

(n-Type Clad Layer 5)

Next, an n-type clad layer 5 of n-type $Al_{0.18}Ga_{0.82}N$ doped with Si in a concentration of $5 \times 10^{17}/cm^3$ and with a thickness of 400 Å was grown by using TMG, TMA, ammonia, and silane at 1,050° C.

(Active Layer 6)

Next, barrier layers of Si-doped $Al_{0.1}Ga_{0.9}N$ and well layers of undoped $In_{0.03}Al_{0.02}Ga_{0.95}N$ were laminated in the order of barrier layer (1)/well layer (1)/barrier layer (2)/well layer (2)/barrier layer (3)/well layer (3) by controlling the temperature at 800° C. and using TMI (trimethylindium), TMG, TMA as raw material gases. In this case, the thickness was controlled to be 200 Å for the barrier layer (1), 40 Å for the barrier layers (2) and (3), and 70 Å for the well layers (1) and (2). The active layer 6 had the total thickness about 420 Å and a multilayer quantum well (MQW) structure.

(p-Type Clad Layer 7)

Next, a p-type clad layer 7 of p-type $Al_{0.2}Ga_{0.8}N$ doped with Mg in a concentration of $1 \times 10^{20}/cm^3$ and with a thickness of 600 Å was grown by using TMG, TMA, ammonia, and $Cp_2Mg$ (cyclopentadienylmagnesium) at 1,050° C. in hydrogen atmosphere.

(p-Type Contact Layer 8)

Successively, a first p-type contact layer of p-type $Al_{0.04}Ga_{0.96}N$ doped with Mg in a concentration of $1 \times 10^{19}/cm^3$ and with a thickness of 0.1 µm was grown on the p-type clad layer by using TMG, TMA, ammonia, and $Cp_2Mg$ and after that, a second p-type contact layer of p-type $Al_{0.01}Ga_{0.99}N$ doped with Mg in a concentration of $2 \times 10^{21}/cm^3$ and with a thickness of 0.02 µm was grown by adjusting the gas flow rates.

On completion of the growth, the wafer was annealed at 700° C. in the reaction vessel to further lower the resistance of the p-type layers 7 and 8.

(First Bonding Layer 9)

After annealing, the wafer was taken out of the reaction vessel and a Rh film in a thickness of 2,000 Å was grown on the p-type contact layer to form a p-electrode. After that, ohmic annealing was carried out at 600° C. and then an insulating protection film $SiO_2$ in a thickness of 0.3 µm was formed on the exposed face other than the p-electrode.

Next, a multilayer film of Ni—Pt—Au—Sn—Au with a thickness of 2,000 Å–3,000 Å–3,000 Å–30,000 Å–1,000 Å was formed on the p-electrode. In this case, Ni was a bonding layer, Pt was a barrier layer, Sn was a first eutectic forming layer, Au between the Pt and Sn was a layer for preventing diffusion of Sn to the barrier layer, and the outermost Au layer was a layer for improving adhesion strength to a second eutectic forming layer.

(Second Bonding Layer 11)

On the other hand, a metal substrate 10 with a thickness of 200 μm and made of a composite consisting of Cu 30% and W 70% was used as a conductive supporting substrate and a closely sticking layer of Ti, a barrier layer of Pt and a second eutectic forming layer of Au with thickness of 2,000 Å–3,000 Å–12,000 Å were formed in this order on the surface of the metal substrate 10.

Next, while the first bonding layer 9 and the second bonding layer 11 being set face to face, the bonding laminate and the conductive supporting substrate 10 were bound by heating and pressing at 250° C. heater temperature. Accordingly, the metals of the first eutectic forming layer and the second eutectic forming layer were mutually diffused to form an eutectic.

(Removal of Substrate for Growing Nitride Semiconductor 1)

Next, after the sapphire substrate 1 was removed from the laminate for bonding to which the conductive supporting substrate 10 was bound, the exposed buffer layer 3 and the high temperature grown layer 4 were polished and polishing was carried out until the AlGaN layer of the n-type clad layer 5 was exposed to eliminate surface roughness.

(n-Electrode)

Next, a multilayer electrode of Ti—Al—Ti—Pt—Au in a thickness of 100 Å–2,500 Å–1,000 Å–2,000 Å–6,000 Å was formed on the n-type clad layer 5 functioning also as the n-type contact to form an n-electrode. After that, the conductive supporting substrate 10 was polished to a thickness of 100 μm and then as a pad electrode 13 for the p-electrode, a multilayer film of Ti—Pt—Au in a thickness of 1,000 Å–2,000 Å–3,000 Å was formed on the rear face of the conductive supporting substrate 10. Since the p-pad electrode 13 serves as a bonding portion to a package of the device, a material suitable for bonding to the package is preferably selected for the p-pad electrode. Finally, devices were separated by dicing.

The obtained LED was in size of 1 mm×1 mm, emitted UV luminescence with 373 nm wavelength at 20 mA in forward direction and had output power of 4.2 mW and Vf of 3.47 V.

Example 2

An LED obtained in the same manner under same conditions as those of Example 1 except that the p-type electrode in the first bonding layer with a thickness of 2,000 Å was formed using Ag had output power of 5.8 mW and Vf of 4.2V.

Example 3

This Example was carried out under same conditions as those of Example 1 except that the laser radiation method was employed in place of the polishing method at the time of removing the substrate for growing nitride semiconductor 1.

(Removal of Substrate for Growing Nitride Semiconductor 1)

With respect to the laminate for bonding to which the conductive supporting substrate 10 was bound, laser beam in linear state of 1 mm×50 mm was radiated with an output power of 600 J/cm$^2$ to the entire surface of the opposed face of the sapphire substrate 1 from the under layer side by scanning using KrF excimer laser with wavelength of 248 nm. The nitride semiconductor of the under layer 2 was decomposed by the laser radiation to remove the sapphire substrate 1.

The obtained LED had luminescence peak wavelength of 373 nm at 20 mA electric power in forward direction and had Vf of 3.47 V and output power of 4.2 mW. Further, as compared with the case of Example 1, since the sapphire substrate did not required to be polished, the time taken for the fabrication could be remarkably shortened. The light emitting output was considerably improved as compared with a conventional device.

Example 4

A nitride semiconductor device was fabricated under the same conditions as those of Example 3. Further, a coating layer of SiO$_2$ containing YAG phosphor and a blue-emitting phosphor selected from group 2 was formed on the entire surface of the nitride semiconductor device.

Accordingly, a nitride semiconductor light emitting device capable of emitting high color-rendering white luminescence and having little self-absorption and high conversion efficiency was obtained.

Example 5

A nitride semiconductor device was fabricated under the same conditions as those of Example 3 and in this Example, a plurality of nitride semiconductor devices were formed in dot-like arrangement on a conductive substrate. A plurality of the nitride semiconductor devices were packaged while exposed face being formed in some portions. Further, a coating layer of SiO$_2$ containing YAG phosphor and a blue-emitting phosphor selected from group 2 was formed on the exposed face.

Accordingly, a nitride semiconductor light emitting apparatus comprising a plurality of arranged nitride semiconductor devices capable of emitting white luminescence, having a large surface area, and capable of emitting white luminescence was obtained. The apparatus was usable as a light source for luminescence.

Example 6

In this Example, the invention was applied to a light emitting diode with 365 nm wavelength and a nitride semiconductor device illustrated in FIGS. 5A and 5B was produced according to a fabrication method of the invention as illustrated in FIG. 1A to 1E.

(Substrate for Growing Nitride Semiconductor)

A substrate of sapphire (C-plane) was used as a substrate for growing nitride semiconductor 1 and surface cleaning was carried out at 1,050° C. in hydrogen atmosphere in a MOCVD reaction vessel.

(Under Layer 2)

Buffer layer 3: Successively, a buffer layer 2 of GaN in a thickness of about 200 Å was grown on the substrate at 510° C. in hydrogen atmosphere using ammonia and TMG (trimethylgallium).

(High Temperature Grown Layer 4)

High temperature grown layer 4: After growth of the buffer layer, a high temperature grown nitride semiconductor of undoped GaN in 5 μm thickness was grown by stopping only TMG supply, increasing the temperature to 1,050° C., and using TMG and ammonia as raw material gases when it reached at 1,050° C.

(n-Type Clad Layer 5)

Next, an n-type clad layer 5 of n-type $Al_{0.08}Ga_{0.92}N$ doped with Si in a concentration of $1\times10^{19}/cm^3$ and with a thickness of 2.5 μm was grown by using TMG, TMA, ammonia, and silane at 1,050° C.

(Active Layer 6)

Next, barrier layers of $Al_{0.08}Ga_{0.92}N$ doped with Si in a concentration of $1\times10^{19}/cm^3$ and well layers of undoped $In_{0.1}Ga_{0.9}N$ were laminated in the order of barrier layer (1)/well layer (1)/barrier layer (2)/well layer (2)/barrier layer (3)/well layer (3)/barrier layer (4) by controlling the temperature at 900° C. and using TMI (trimethylindium), TMG, TMA as raw material gases. In this case, the thickness was controlled to be 370 Å for the barrier layers (1), (2), (3) and (4) and 80 Å for the well layers (1), (2), and (3). Only the barrier layer (4) was undoped. The active layer 6 had the total thickness about 1,700 Å and a multilayer quantum well structure.

(p-Type Clad Layer 7)

Next, a p-type clad layer 7 of $Al_{0.2}Ga_{0.8}N$ doped with Mg in a concentration of $1\times10^{20}/cm^3$ and with a thickness of 370 Å was grown by using TMG, TMA, ammonia, and $Cp_2Mg$ (cyclopentadienylmagnesium) at 1,050° C. in hydrogen atmosphere.

(p-Type Contact Layer 8)

Successively, a first p-type contact layer of $Al_{0.07}Ga_{0.93}N$ doped with Mg in a concentration of $1\times10^{19}/cm^3$ and with a thickness of 0.1 μm was grown on the p-type clad layer by using TMG, TMA, ammonia, and $Cp_2Mg$ and after that, a second p-type contact layer of $Al_{0.07}Ga_{0.93}N$ doped with Mg in a concentration of $2\times10^{21}/cm^3$ and with a thickness of 0.02 μm was grown by adjusting the gas flow rates.

On completion of the growth, in nitrogen atmosphere, the wafer was annealed at 700° C. in the reaction vessel to further lower the resistance of the p-type layers 7 and 8.

(First Bonding Layer 9)

After annealing, the wafer was taken out of the reaction vessel and a Rh film in a thickness of 2,000 Å was grown on the p-type contact layer 8 to form a p-electrode. After that, ohmic annealing was carried out at 600° C. and then an insulating protection film $SiO_2$ in a thickness of 0.3 μm was formed on the exposed face other than the p-electrode.

Next, a multilayer film of Rh—Ir—Pt was formed on the p-electrode.

(Second Bonding Layer 11)

On the other hand, a metal substrate with a thickness of 200 μm and made of a composite consisting of Cu 30% and W 70% was used as a conductive supporting substrate 10 and a closely sticking layer of Ti, a barrier layer of Pt and a second eutectic forming layer of Pd with thickness of 2,000 Å–3,000 Å–12,000 Å were formed in this order on the surface of the metal substrate 10.

Next, while the first bonding layer 9 and the second bonding layer 11 being set face to face, the bonding laminate and the conductive substrate were bound by heating and pressing at 250° C. heater temperature. Accordingly, the metals of the first eutectic forming layer and the second eutectic forming layer were mutually diffused to form an eutectic.

(Removal of Substrate for Growing Nitride Semiconductor 1)

With respect to the laminate for bonding to which the conductive supporting substrate 10 was bound, laser beam in linear state of 1 mm×50 mm was radiated with an output power of 600 $J/cm^2$ to the entire surface of the opposed face of the sapphire substrate 1 from the under layer side by scanning using KrF excimer laser with wavelength of 248 nm. The nitride semiconductor of the under layer 2 was decomposed by the laser radiation to remove the sapphire substrate 1. Further polishing was carried out until the n-type $Al_{0.3}Ga_{0.7}N$ clad layer was made as thin as about 2.2 μm thickness to eliminate surface roughness.

(n-Electrode)

Next, a multilayer electrode of Ti—Al—Ni—Au was formed on the n-type clad layer 5 functioning also as the n-type contact to form an n-electrode 12. After that, the conductive supporting substrate 10 was polished to a thickness of 100 μm and then as a pad electrode 13 for the p-electrode, a multilayer film of Ti—Pt—Au—Sn—Au in a thickness of 2,000 Å–3,000 Å–3,000 Å–30,000 Å–1,000 Å was formed on the rear face of the conductive supporting substrate 10. Finally, devices were separated by dicing. As illustrated in FIGS. 5A and 5B, the n-electrode and the p-electrode were formed in lattice-like forms in the entire surface of the respective semiconductor layer faces. In this case, the aperture parts in the lattice forms are formed reciprocally so as not to be overlapped with each other in the n-side and the p-side.

The obtained LED was in size of 1 mm×1 mm, emitted UV luminescence with 365 nm wavelength at 20 mA in forward direction and had output power of 2.4 mW and Vf of 3.6 V.

Example 7

In this Example, the invention was applied to a blue emitting LED different from UV emitting LED of the Examples 1 to 6. In the Example, since the luminescence wavelength was as long as 460 nm, self-absorption of the luminescence by a GaN layer was scarcely caused. Accordingly, differing from the Examples 1 to 6, the GaN layer, which was a high temperature grown layer, could be left to utilize it as an n-type contact layer.

(Substrate for Growing Nitride Semiconductor)

A substrate of sapphire (C-plane) was used as a substrate for growing nitride semiconductor and surface cleaning was carried out at 1,050° C. in hydrogen atmosphere in a MOCVD reaction vessel.

(Under Layer)

Buffer layer: Successively, a buffer layer 2 of GaN in a thickness of about 200 Å was grown on the substrate at 510° C. in hydrogen atmosphere using ammonia and TMG (trimethylgallium).

(n-Type Contact Layer)

After growth of the buffer layer, an n-type contact layer of n-type GaN in 5 μm thickness and doped with Si in a concentration of $1\times10^{18}/cm^3$ was grown by stopping only TMG supply, increasing the temperature to 1,050° C., and using TMG, ammonia, and silane as raw material gases when it reached at 1,050° C.

(n-Type Clad Layer)

Next, an n-type clad layer 5 of n-type $Al_{0.18}Ga_{0.82}N$ doped with Si in a concentration of $5\times10^{17}/cm^3$ and with a thickness of 400 Å was grown by using TMG, TMA, ammonia, and silane as raw material gases at 1,050° C.

(Active Layer)

Next, barrier layers of GaN doped with Si and well layers of undoped InGaN were laminated in the order of barrier layer/well layer/barrier layer/well layer/barrier layer by controlling the temperature at 800° C. and using TMI, TMG, and TMA as raw material gases. In this case, the thickness was controlled to be 200 Å for the barrier layers and 50 Å for the well layers. The active layer had the total thickness about 700 Å and a multilayer quantum well (MQW) structure.

(p-Type Clad Layer)

Next, a p-type clad layer 7 of $Al_{0.2}Ga_{0.8}N$ doped with Mg in a concentration of $1\times10^{20}/cm^3$ and with a thickness of 600 Å was grown by using TMG, TMA, ammonia, and $Cp_2Mg$ (cyclopentadienylmagnesium) at 1,050° C. in hydrogen atmosphere.

(p-Type Contact Layer)

Successively, a p-type contact layer of GaN doped with Mg in a concentration of $2\times10^{21}/cm^3$ and with a thickness of 0.15 μm was grown on the p-type clad layer by using TMG, ammonia, and $Cp_2Mg$.

On completion of the growth, the wafer was annealed at 700° C. in the reaction vessel in nitrogen atmosphere to further lower the resistance of the p-type layer.

(First Bonding Layer)

After annealing, the wafer was taken out of the reaction vessel and a Rh film in a thickness of 2,000 Å was grown on the p-type contact layer to form a p-electrode. After that, ohmic annealing was carried out at 600° C. and then an insulating protection film $SiO_2$ in a thickness of 0.3 μm was formed on the exposed face other than the p-electrode.

Next, a multilayer film of a multilayer film of Ni—Pt—Au—Sn—Au in a thickness of 2,000 Å–3,000 Å–3,000 Å–30,000 Å–1,000 Å was formed on the p-electrode. Here, Ni was a bonding layer, Pt was a barrier layer, Sn was a first eutectic forming layer, the Au layer between the Pt and Sn was a layer for preventing diffusion of Sn to the barrier layer, and the outermost Au layer was a layer for improving adhesion strength to a second eutectic forming layer.

(Second Bonding Layer)

On the other hand, a metal substrate with a thickness of 200 μm and made of a composite consisting of Cu 30% and W 70% was used as a conductive substrate and a closely sticking layer of Ti, a barrier layer of Pt and a second eutectic forming layer of Au with thickness of 2,000 Å–3,000 Å–12,000 Å were formed in this order on the surface of the metal substrate.

Next, while the first bonding layer and the second bonding layer being set face to face, the bonding laminate and the conductive substrate were bound by heating and pressing at 250° C. heater temperature. Accordingly, the metals of the first eutectic forming layer and the second eutectic forming layer were mutually diffused to form an eutectic.

Next, with respect to the laminate form bonding to which the conductive substrate was bound, laser beam in linear state of 1 mm×50 mm was radiated with an output power of 600 $J/cm^2$ to the entire surface of the opposed face of the sapphire substrate from the under layer side by scanning using KrF excimer laser with wavelength of 248 nm. The nitride semiconductor of the under layer was decomposed by the laser radiation to remove the sapphire substrate. Further polishing was carried out until the n-type contact layer was exposed to eliminate surface roughness.

(n-Electrode)

Next, a multilayer electrode of Ti—Al—Ti—Pt—Au in a thickness of 100 Å–2,500 Å–1,000 Å–2,000 Å–6,000 Å was formed on the n-type contact layer to form an n-electrode. After that, the conductive substrate was polished to a thickness of 100 μm and then as a pad electrode for the p-electrode, a multilayer film of Ti—Pt—Au in a thickness of 1,000 Å–2,000 Å–3,000 Å was formed on the rear face of the conductive substrate. Finally, devices were separated by dicing.

The obtained LED was in size of 1 mm×1 mm, emitted blue color luminance with 460 nm wavelength at 20 mA in forward direction.

Example 8

A nitride semiconductor device was fabricated under the same conditions as those of Example 7. Further, a coating layer of $SiO_2$ containing YAG as a phosphor was formed on the entire surface of the nitride semiconductor device.

Accordingly, a nitride semiconductor light emitting device capable of emitting white luminescence was obtained.

Example 9

A nitride semiconductor device was fabricated under the same conditions as those of Example 7 and in this Example, a plurality of nitride semiconductor devices were formed in dot-like arrangement on a conductive substrate. A plurality of the nitride semiconductor devices were packaged while exposed face being formed in some portions. Further, a coating layer of $SiO_2$ containing YAG as a phosphor was formed on the exposed face.

Accordingly, a nitride semiconductor light emitting apparatus comprising a plurality of arranged nitride semiconductor devices capable of emitting white luminescence, having a large surface area, and capable of emitting white luminescence was obtained. The apparatus was usable as a light source for luminescence.

Example 10

Figure 9:
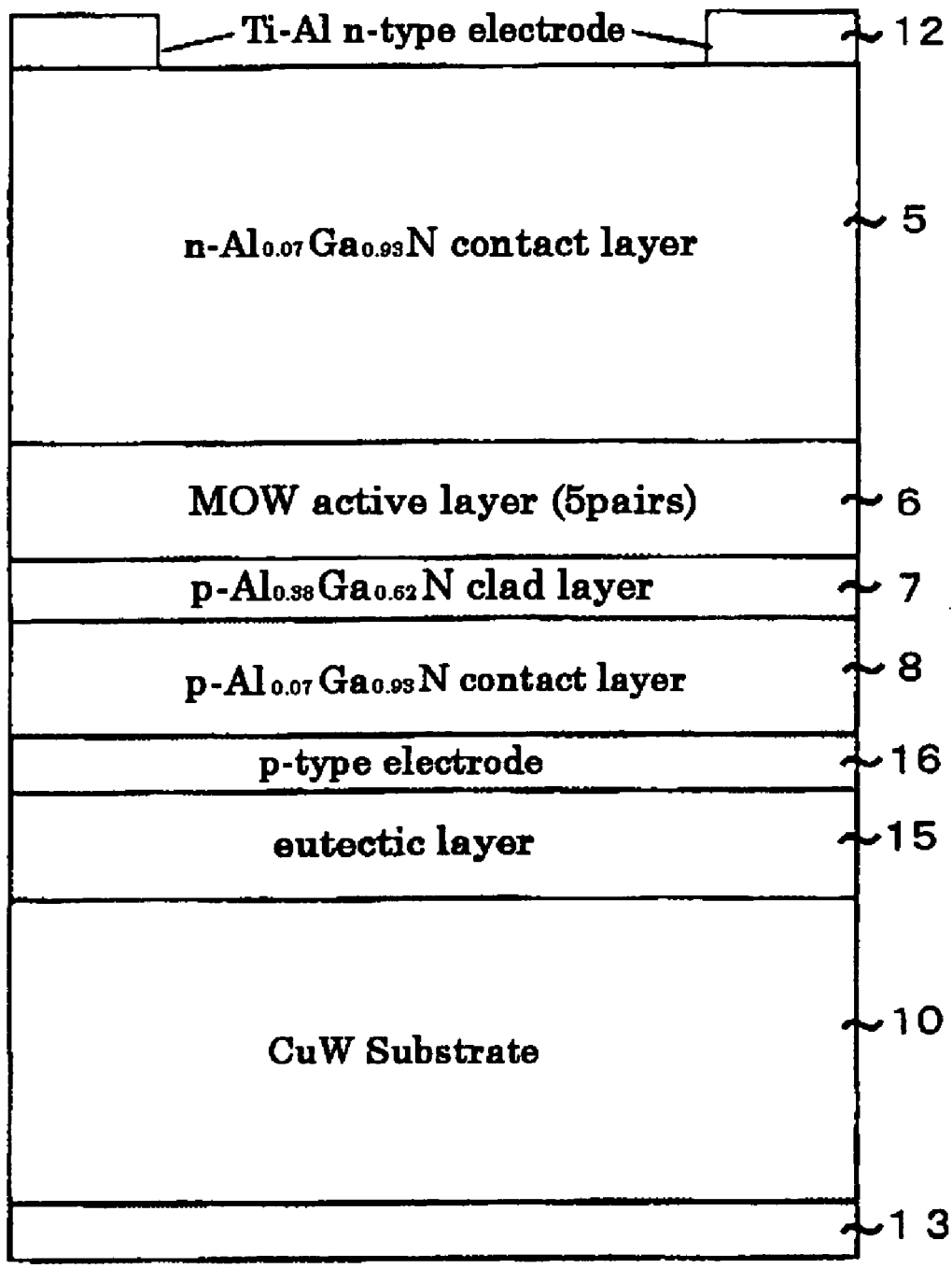
FIG. 9 shows a schematic cross-sectional view illustrating a layer structure of the nitride semiconductor device of the embodiment shown in FIG. 8.
Figure 10A:
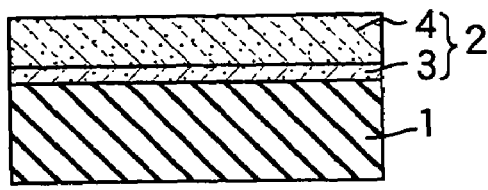
FIG. 10 shows a process drawing illustrating another embodiment different from that in FIG. 8.
Figure 10D:
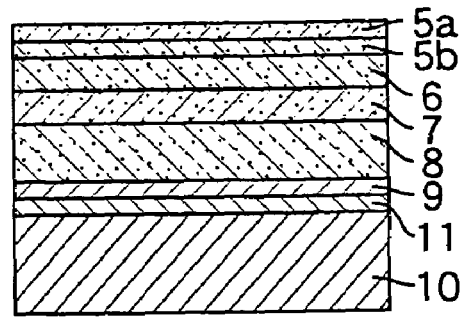
Figure 10B:
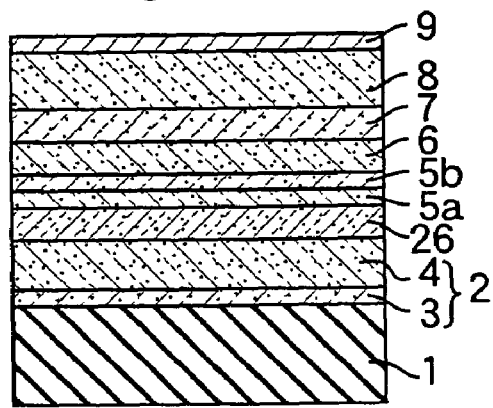
Figure 10E:
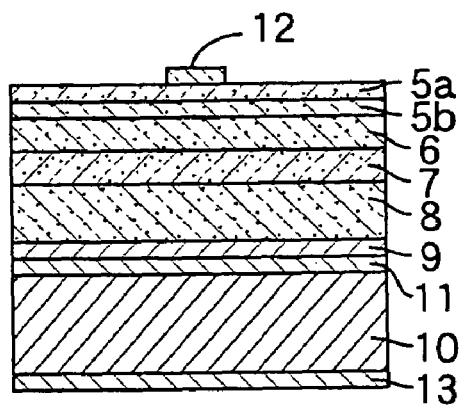
Figure 10C:
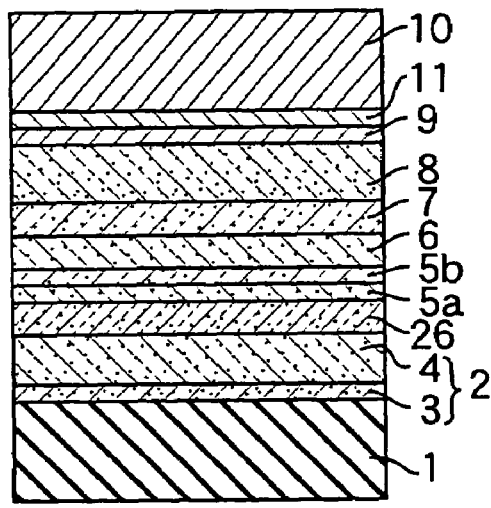

In this Example, the invention was applied to a light emitting diode with 365 nm wavelength to fabricate a nitride semiconductor device comprising a layer constitution comprising an n-type composition-graded layer as illustrated in FIGS. 8 and 9 and having an electrode structure as illustrated in FIG. 5.

(Substrate for Growing Nitride Semiconductor)

A substrate of sapphire (C-plane) was used as a substrate for growing nitride semiconductor and surface cleaning was carried out at 1,050° C. in hydrogen atmosphere in a MOCVD reaction vessel.

(Under Layer 2)

Buffer layer: Successively, a buffer layer 2 of GaN in a thickness of about 200 Å was grown on the substrate at 510° C. in hydrogen atmosphere using ammonia and TMG (trimethylgallium).

High temperature grown layer: After growth of the buffer layer, a high temperature grown nitride semiconductor of undoped GaN in 5 μm thickness was grown by stopping only TMG supply, increasing the temperature to 1,050° C., and using TMG and ammonia as raw material gases when it reached at 1,050° C.

(Composition-Graded Layer 26)

Composition-graded layer: After the high temperature grown layer growth, a composition-graded AlGaN layer 26 in a thickness of 0.4 μm was grown at the same temperature using TMG, TMA, and ammonia as raw material gases. The composition-graded AlGaN layer 26 was for moderating the lattice unconformity between the high temperature grown layer and the n-type clad layer and formed in the manner that the mixed crystal ratio of Al and the doping amount of Si were gradually increased from the undoped GaN to the n-type $Al_{0.07}Ga_{0.93}N$ doped with Si in a concentration of $1 \times 10^{19}/cm^3$ (n-Type Clad Layer 5)

Next, an n-type clad layer 5 of n-type $Al_{0.07}Ga_{0.93}N$ doped with Si in a concentration of $1 \times 10^{19}/cm^3$ and with a thickness of 2.5 μm was grown by using TMG, TMA, ammonia, and silane at 1,050° C.

(Active Layer 6)

Next, barrier layers of $Al_{0.09}Ga_{0.91}N$ doped with Si in a concentration of $1 \times 10^{19}/cm^3$ and well layers of undoped $In_{0.01}Ga_{0.99}N$ were laminated in the order of barrier layer (1)/well layer (1)/barrier layer (2)/well layer (2)/barrier layer (3)/well layer (3)/barrier layer (4) by controlling the temperature at 900° C. and using TMI (trimethylindium), TMG, and TMA as raw material gases. In this case, the thickness was controlled to be 200 Å for the barrier layers (1), (2), (3) and (4) and 60 Å for the well layers (1), (2), and (3). Only the barrier layer (4) was undoped.

(p-Type Clad Layer 7)

Next, a p-type clad layer 7 of $Al_{0.38}Ga_{0.62}N$ doped with Mg in a concentration of $1 \times 10^{20}/cm^3$ and with a thickness of 270 Å was grown by using TMG, TMA, ammonia, and $Cp_2Mg$ (cyclopentadienylmagnesium) at 1,050° C. in hydrogen atmosphere.

(p-Type Contact Layer 8)

Successively, a first p-type contact layer of $Al_{0.07}Ga_{0.93}N$ doped with Mg in a concentration of $4 \times 10^{18}/cm^3$ and with a thickness of 0.1 μm was grown on the p-type clad layer 7 by using TMG, TMA, ammonia, and $Cp_2Mg$ and after that, a second p-type contact layer of $Al_{0.07}Ga_{0.93}N$ doped with Mg in a concentration of $1 \times 10^{20}/cm^3$ and with a thickness of 0.02 μm was grown by adjusting the gas flow rates.

On completion of the growth, in nitrogen atmosphere, the wafer was annealed at 700° C. in the reaction vessel to further lower the resistance of the p-type layers 7 and 8.

(First Bonding Layer 9)

After annealing, the wafer was taken out of the reaction vessel and a Rh film in a thickness of 2,000 Å was formed on the p-type contact layer to form a p-electrode. After that, ohmic annealing was carried out at 600° C. and then an insulating protection film $SiO_2$ in a thickness of 0.3 μm was formed on the exposed face other than the p-electrode.

Next, a multilayer film of Rh—Ir—Pt was formed on the p-electrode.

(Second Bonding Layer 11)

On the other hand, a metal substrate with a thickness of 200 μm and made of a composite consisting of Cu 15% and W 85% was used as a conductive substrate 10 and a closely sticking layer of Ti, a barrier layer of Pt and a second eutectic forming layer of Pd with thickness of 2,000 Å–3,000 Å–12,000 ↑1 were formed in this order on the surface of the metal substrate 10.

Next, while the first bonding layer 9 and the second bonding layer 11 being set face to face, the bonding laminate and the conductive substrate 10 were bound by heating and pressing at 230° C. heater temperature. Accordingly, the metals of the first eutectic forming layer and the second eutectic forming layer were mutually diffused to form an eutectic.

(Removal of Substrate for Growing Nitride Semiconductor)

With respect to the laminate for bonding to which the conductive substrate 10 was bound, laser beam in linear state of 1 mm×50 mm was radiated with an output power of 600 $J/cm^2$ to the entire surface of the opposed face of the sapphire substrate 1 from the under layer side by scanning using KrF excimer laser with wavelength of 248 nm. The nitride semiconductor of the under layer 2 was decomposed by the laser radiation to remove the sapphire substrate 1. Further polishing was carried out until the n-type clad layer 5 composed of the under layer 2, the composition-graded layer 26 and the n-type $Al_{0.3}Ga_{0.7}N$ was made as thin as about 2.2 μm thickness to eliminate surface roughness.

(n-Electrode 2)

Next, a multilayer electrode of Ti—Al—Ni—Au was formed on the n-type contact layer to form an n-electrode 12. In consideration of the light outputting efficiency, the n-electrode 12 was formed not on the entire surface but in portions so as to have 70% aperture ratio. After that, the conductive substrate 10 was polished to a thickness of 100 μm and then as a pad electrode 13 for the p-electrode, a multilayer film of Ti—Pt—Au—Sn—Au in a thickness of 2,000 Å–3,000 Å–3,000 Å–30,000 Å–1,000 Å was formed on the rear face of the conductive substrate 10. Finally, devices were separated by dicing. As illustrated in FIGS. 5A and 5B, the n-electrode 12 and the p-electrode 16 were formed in lattice-like forms in the entire surface of the respective semiconductor layer faces. In this case, the aperture parts in the lattice forms are formed reciprocally so as not to be overlapped with each other in the n-side and the p-side.

Figure 11A:
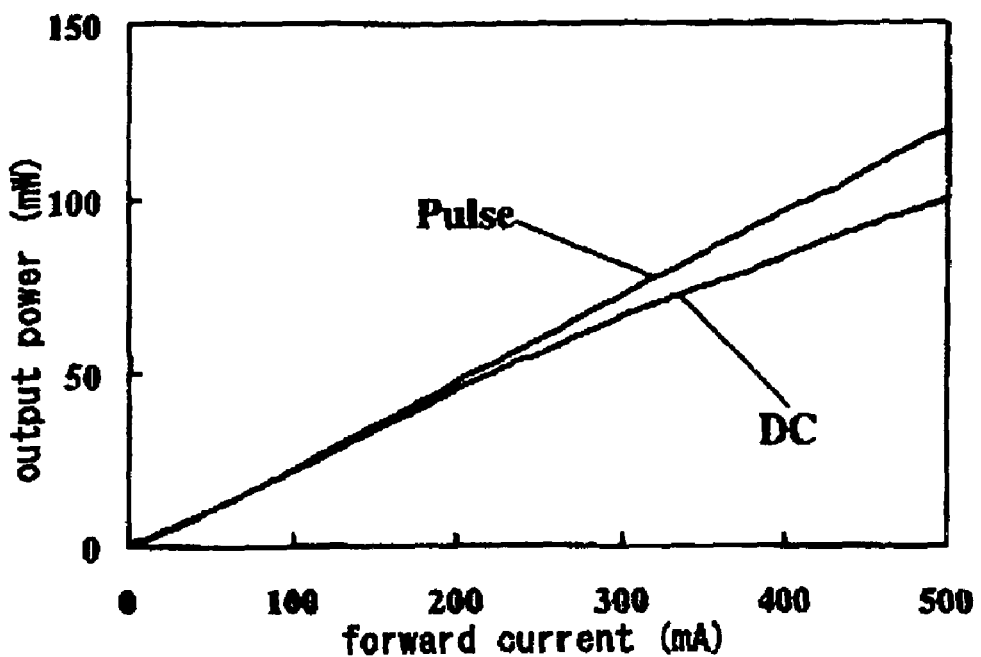
FIGS. 11A and 11B show the characteristics of the nitride semiconductor device according to Example 10.
Figure 11B:
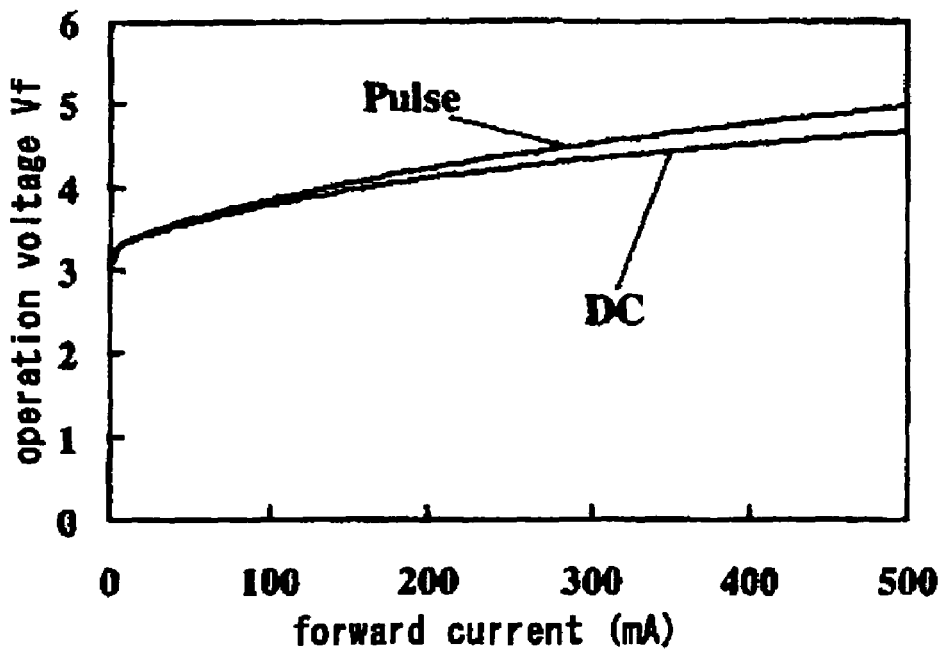

The characteristics of the obtained LED were as shown in FIG. 11.

FIG. 11 shows alteration of the operation voltage (Vf) and the output in relation to the forward current in cases of pulsed current (Pulse) and direct current (DC). The device emitted UV luminescence with 365 nm wavelength and had output power of 118 mW, operation voltage of 4.9 V, and external quantum efficiency of 6.9% with 500 mA pulsed electric current (pulse width of 2 μsec, duty 1%) at a room temperature and emitted UV luminescence with 365 nm wavelength and had output power of 100 mW, operation voltage of 4.6 V, and external quantum efficiency of 5.9% with 500 mA direct current at a room temperature.

Comparative Example 1

(Substrate for Growing Nitride Semiconductor)

A substrate of sapphire (C-plane) was used as a substrate for growing nitride semiconductor and surface cleaning was carried out at 1,050° C. in hydrogen atmosphere in a MOCVD reaction vessel.

(Under Layer)

Buffer layer: Successively, a buffer layer 2 of GaN in a thickness of about 200 Å was grown on the substrate at 510° C. in hydrogen atmosphere using ammonia and TMG (trimethylgallium).

High temperature grown layer: After growth of the buffer layer, a high temperature grown nitride semiconductor of undoped GaN in 5 µm thickness was grown by stopping only TMG supply, increasing the temperature to 1,050° C., and using TMG and ammonia as raw material gases when it reached at 1,050° C.

Composition-graded layer: After the high temperature grown layer growth, a composition-graded AlGaN layer in a thickness of 0.4 µm was grown at the same temperature using TMG, TMA, and ammonia as raw material gases. The composition-graded AlGaN layer was for moderating the lattice unconformity between the high temperature grown layer and the n-type clad layer and formed in the manner that the mixed crystal ratio of Al and the doping amount of Si were gradually increased from the undoped GaN to the n-type $Al_{0.07}Ga_{0.93}N$ doped with Si in a concentration of $1\times10^{19}/cm^3$ (n-type Clad Layer)

Next, an n-type clad layer 5 of n-type $Al_{0.07}Ga_{0.93}N$ doped with Si in a concentration of $1\times10^{19}/cm^3$ and with a thickness of 2.5 µm was grown by using TMG, TMA, ammonia, and silane at 1,050° C.

(Active Layer)

Next, barrier layers of $Al_{0.07}Ga_{0.93}N$ doped with Si in a concentration of $1\times10^{19}/cm^3$ and well layers of undoped $In_{0.07}Ga_{0.93}N$ were laminated in the order of barrier layer (1)/well layer (1)/barrier layer (2)/well layer (2)/barrier layer (3)/well layer (3)/barrier layer (4) by controlling the temperature at 900° C. and using TMI (trimethylindium), TMG, and TMA as raw material gases. In this case, the thickness was controlled to be 200 Å for the barrier layers (1), (2), (3) and (4) and 60 Å for the well layers (1), (2), and (3). Only the barrier layer (4) was undoped.

(p-Type Clad Layer)

Next, a p-type clad layer 7 of $Al_{0.38}Ga_{0.62}N$ doped with Mg in a concentration of $1\times10^{20}/cm^3$ and with a thickness of 270 Å was grown by using TMG, TMA, ammonia, and $Cp_2Mg$ (cyclopentadienylmagnesium) at 1,050° C. in hydrogen atmosphere.

(p-Type Contact Layer)

Successively, a second p-type contact layer of $Al_{0.07}Ga_{0.93}N$ doped with Mg in a concentration of $4\times10^{18}/cm^3$ and with a thickness of 0.1 µm was grown on the p-type clad layer by using TMG, TMA, ammonia, and $Cp_2Mg$ and after that, a second p-type contact layer of $Al_{0.07}Ga_{0.93}N$ doped with Mg in a concentration of $1\times10^{20}/cm^3$ and with a thickness of 0.02 µm was grown by adjusting the gas flow rates.

On completion of the growth, in nitrogen atmosphere, the wafer was annealed at 700° C. in the reaction vessel to further lower the resistance of the p-type layers.

(Electrode)

A portion of the second p-type contact layer was etched until the n-type clad layer was exposed to form a face to form an n-electrode thereon and a Rh electrode was formed on the second p-type contact layer and Ti—Al—Ni—Au was formed on the exposed n-type clad layer.

Figure 12:
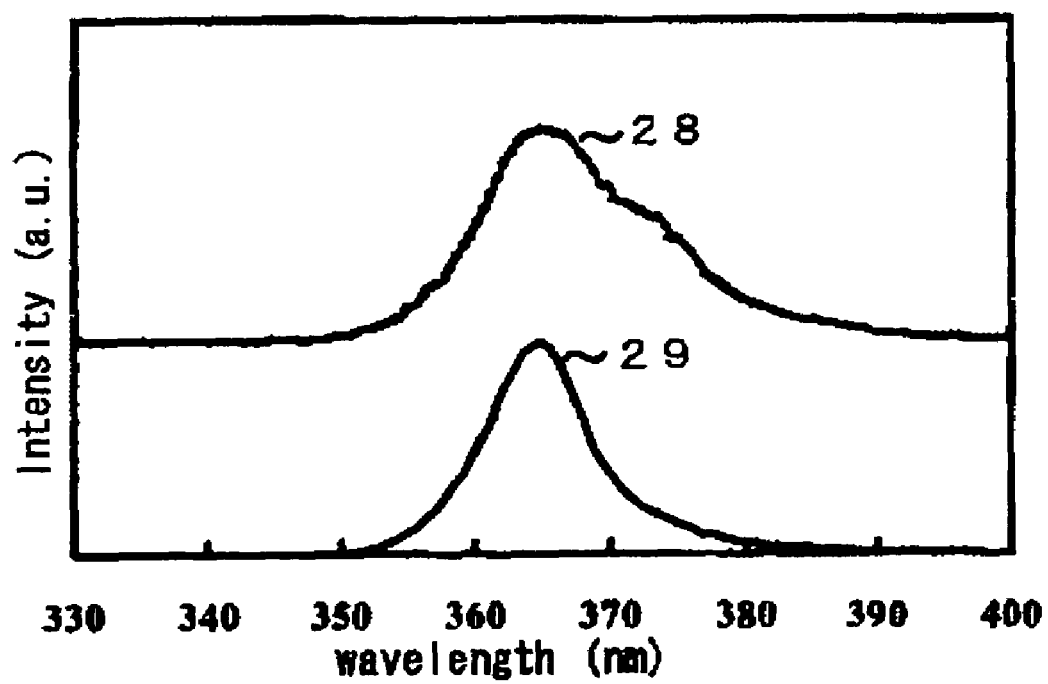
FIG. 12 is a graph comparing the characteristics of the nitride semiconductor device of Example 10 and a conventional nitride semiconductor device.

The obtained LED showed the luminescence spectrum shown in FIG. 12A. FIG. 12B shows the luminescence spectrum of the device obtained in Example 10, and it was found that absorption of GaN greatly affected the luminescence spectra.

Example 11

An LED was fabricated in the same manner as Example 10 except that the n-clad layer 5 is divided into two layers as shown in FIG. 10.

(n-Type Clad Layer 5)

A first n-type nitride semiconductor layer 5a of n-type $Al_{0.07}Ga_{0.93}N$ doped with Si in a concentration of $1\times10^{19}/cm^3$ and with a thickness of 1.7 µm was grown using TMG, TMA, ammonia, and silane at 1,050° C. and further thereon, a second n-type nitride semiconductor layer 5b of n-type $Al_{0.07}Ga_{0.93}N$ doped with Si in a concentration of $2\times10^{17}/cm^3$ and with a thickness of 0.8 µm was grown to form an n-type clad layer 5 composed of the first n-type nitride semiconductor layer 5a and the second n-type nitride semiconductor layer 5b.

The LED obtained accordingly had operation voltage lowered further by about 0.3 V than the LED of Example 10 and the deterioration was slight even after long time light emission.

Example 12

This Example was carried out under same conditions as those of Example 11 except that the active layer is formed in the following condition.

(Active Layer 6)

Next, after setting the temperature at about 900° C., using TMI (trimethylindium), TMG, and TMA as raw material gases, barrier layers of $Al_{0.09}Ga_{0.91}N$ doped with Si in a concentration of $1\times10^{19}/cm^3$ and well layers of undoped $In_{0.01}Ga_{0.99}N$ were laminated in the order of barrier layer (1)/well layer (1)/barrier layer (2)/well layer (2)/barrier layer (3)/well layer (3)/barrier layer (4)/well layer (4)/barrier layer (5)/well layer (5)/barrier layer (6). In this case, the thickness was controlled to be 200 Å for the barrier layers (1) to (6) and 150 Å for the well layers (1) to (5).

Thus provided LED device has an output power substantially equal to that in Example 11 and light emitting spectrum improved in terms of monochromatism.

Example 13

In Example 10, projected and recessed parts in stripes were formed in the exposed n-type contact layer after the formation of the n-type electrode. The depth and the width of the recessed parts were adjusted to 1.5 µm and 3 µm, respectively and the width of the projected parts was adjusted to be 3 µm. Other conditions were same as those in Example 10. This dimpling process further improved the luminescence outputting efficiency.

Example 14

Figure 13:
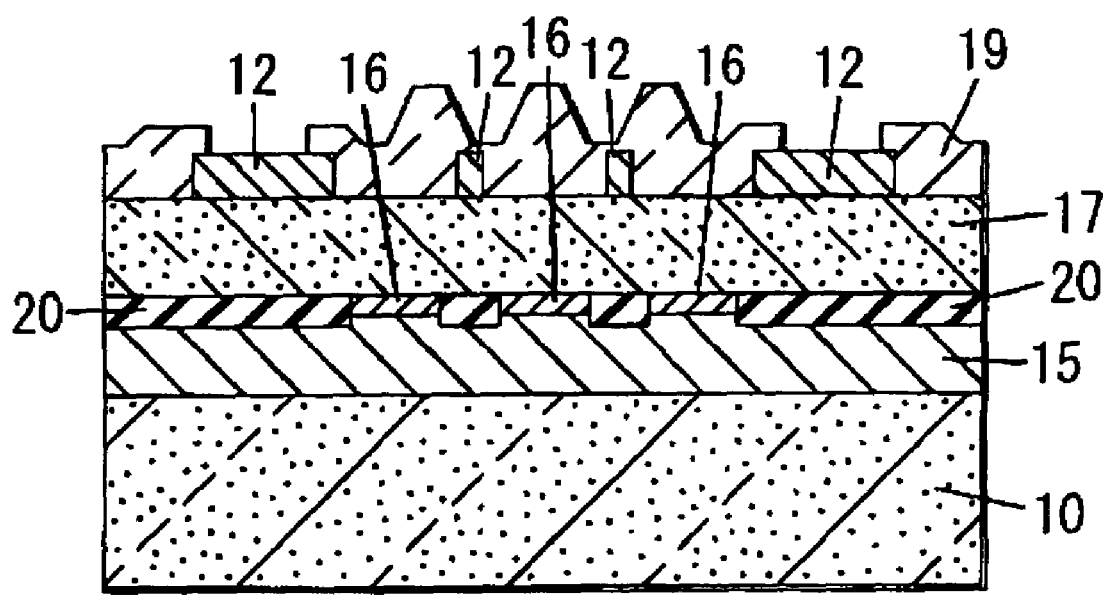
FIG. 13 is a schematic cross-sectional view showing a nitride semiconductor device of another embodiment different from that shown in FIG. 5.

With respect to the device obtained by Example 10 or Example 11, after formation of the n-type electrode, a protection film 19 of an insulating $ZrO_2$ (refractive index 2.2) with a thickness of 1.5 µm was formed. Further, as shown in FIG. 13, projected and recessed parts were formed in the protection film 19 at 3 µm intervals. The plane shape of each projected part was circular and the depth of the recessed parts was adjusted to be 1.0 µm. Accordingly, the luminescence outputting efficiency was further improved. Although $ZrO_2$ was used in this Example, similar effects could be obtained in the case of using $Nb_2O_5$ (refractive index 2.4) and $TiO_2$ (refractive index 2.7).

Example 15

In Example 14, the projected parts to be formed in the protection film 19 were made to be projected parts with a shape having a tapered angle of 60° C. in the $ZrO_2$ protection film. According to this Example, the luminescence outputting efficiency was further improved as compared with that of Example 13.

Example 16

An LED was obtained in the similar method as Example 10. Successively, the LED was mounted on a metal package and electric communication of the LED with an external electrode was preformed by a conductive wire and after that, a coating layer 14 shown in FIG. 14 was formed on the nitride semiconductor-containing light emitting device by the following method.

(1) At first, a resist or a polyimide film was formed on the electrode of the LED. (2) Next, as described above, a coating solution was produced by producing a mixed solution of hydrolytic solutions of cerium-activated yttrium aluminum garnet type phosphor and ethyl silicate with a high boiling point solvent and stirring the resulting solution mixture as to evenly disperse the phosphor. (3) The coating solution was applied to the top face and the side faces of the LED except the supporting substrate and the portion where the protection film was formed by a spray coating method. (4) The coating was primarily cured by drying at 150° C. for 30 minutes to form a layer with a thickness of several ten μm. (5) The formed layer was impregnated with the hydrolytic solution of ethyl silicate containing no phosphor. (6) Finally, the resist or the polyimide film was removed and secondary curing was carried out by drying at 240° C. for 30 minutes. Through the above-mentioned steps (1) to (6), a coating layer 14 with an approximately even thickness of 20 to 30 μm, which was a continuous layer existing at least on the exposed face of the nitride semiconductor layers with the total thickness of 5 to 10 μm and positioned in the upper face and side faces of the LED except the electrode, was formed.

The light emitting apparatus obtained according to the Example was provided with the phosphor, an inorganic material scarcely deteriorated even if used together with a light emitting device emitting luminescence with wavelength in a range from blue to UV rays, firmly stuck to the light emitting device and thus a light emitting apparatus with little unevenness of luminescence color even in the case of long time use could be obtained. Further, the light emitting apparatus according to the Example could be a light emitting apparatus with little change of color temperature even from different luminescence observation directions owing to the formation of the coating layer 14 which had an approximately even thickness and covered at least the luminescence observation faces of the light emitting device. Further, since the coating layer containing the phosphor was formed on the all of the faces where the luminescence from the light emitting device, no light was transmitted through the supporting substrate, and therefore, as compared with a conventional light emitting device using a sapphire substrate, the outputting efficiency of the luminescence with wavelength changed by the phosphor can be improved. Further, use of a supporting substrate with a high thermal conductivity improved heat releasing property as compared with that of a conventional light emitting device using a sapphire substrate.

Example 17

Figure 14:
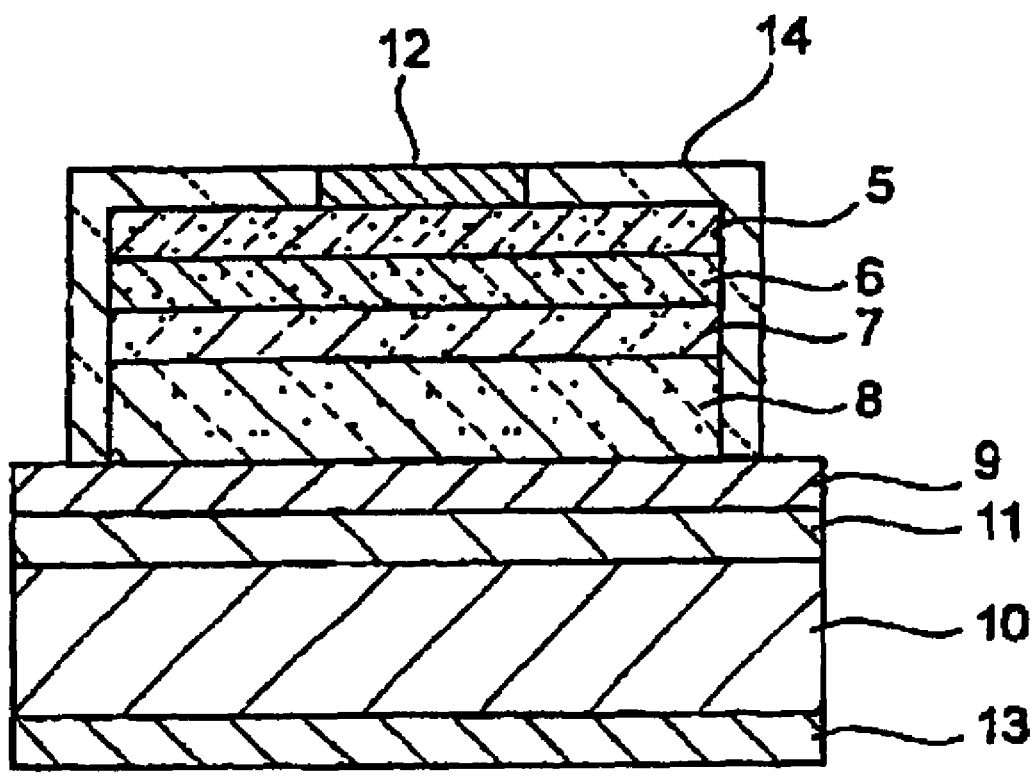
FIG. 14 is a schematic cross-sectional view showing an embodiment in which a coating layer containing a phosphor is formed.

After the side faces of respective p- and n-semiconductors on the supporting substrate were exposed by etching as shown in FIG. 14, a coating layer was formed by screen printing using a coating solution produced in the same manner as Example 16 or a material obtained by adding a cerium-activated yttrium aluminum garnet type phosphor to a silicone resin. Here, in the case of using the material obtained by adding the phosphor to a silicone resin, the curing was carried out at 150° C. for 1 hour. The semiconductor wafer obtained in such a manner was divided by dicing after a scribing line was formed in the wafer to obtain LED chips as light emitting devices.

In such a manner, formation of the coating layer 14 containing a phosphor in the wafer state made it possible to carry out inspection and selection of luminescence color before fabrication of a light emitting apparatus by disposing the LED chips in a metal package or the like, that is, in the stage of the LED chips bearing the coating layer containing the phosphor, so that the production yield of the light emitting apparatus could be improved. Further, the LED chips according to the Example could be light emitting devices with little change of color temperature even from different luminescence observation directions to the LED chips bearing the above-mentioned coating layer 14.

Example 18

FIG. 15 shows a schematical cross-sectional view of a semiconductor light emitting device according to this Example.

After the removal of a substrate for growing nitride semiconductor in Example 16, in order to improve the luminescence outputting efficiency, projected and recessed parts (dimples) were formed in the exposed face of the n-type nitride semiconductor layers and/or side faces of the semiconductor layers by RIE. In this Example, as shown in FIG. 15, dimpling process was carried out especially for the n-type clad layer 5, however the dimpling process could be carried out from the n-type clad layer 5 to the active layer 6 and from the p-type clad layer 7 to the p-type contact layer 8. The cross-sectional shape of the projected and recessed parts could be mesa type or reverse mesa type and the plane shape could be island-like, lattice-like, rectangular, circular, or polygonal shape. The coating layer 14 similar to that of Example 15 was formed on the exposed face and the side faces of the semiconductor layers subjected to dimpling process.

A light emitting apparatus with improved luminescence outputting efficiency from light emitting devices and little unevenness of luminescence color even in the case of long time use could be fabricated by formation of the coating layer in such a manner.

Example 19

A nitride semiconductor device was fabricated in this Example under the same conditions as those of Example 16, however a plurality of nitride semiconductor devices were formed on a supporting substrate while being arranged like dots. Exposed faces were formed in portions of the side faces of the nitride semiconductor devices by etching and the coating layer 14 was formed in the same manner as that of Example 15. Finally, the supporting substrate was disposed on a support such as a metal package and pairs of both negative and positive electrodes of the light emitting devices were electrically communicated with external electrodes to fabricate a light emitting apparatus.

Accordingly, a plurality of light emitting devices capable of emitting mixed color light obtained by mixing the luminescence from the light emitting devices and luminescence obtained by changing the wavelength of the luminescence from the light emitting devices by the phosphor were arranged to give a light emitting apparatus with a large surface area and capable of emitting the mixed color light. Such a light emitting apparatus can be used as a light source for luminaire.

Example 20

In this Example, the semiconductor light emitting device obtained in Example 16 was disposed in a package shown in FIG. 7. The semiconductor light emitting device 30 was die-bonded by an epoxy resin in the bottom face of an aperture part of a package 40 provided with a heat sink. The bonding material to be used for the die bonding was not particularly limited and a resin or glass containing Au—Sn alloy or a conductive material could be used. The conductive material to be added is preferably Ag and if Ag paste with 80 to 90% content was used, a light emitting apparatus excellent in heat releasing property and having suppressed stress after the bonding can be obtained. Next, the respective electrodes of the die-bonded semiconductor light emitting device 30 and the respective lead electrodes 44 exposed out of the bottom face of the aperture of the package 40 were electrically connected to each other through respective Au wires 46.

Next, 3% by weight of lightweight calcium carbonate (refractive index 1.62) with an average particle size of 1.0 µm and an oil absorption capability of 70 ml/100 g as a dispersant was added to 100% by weight of a phenyl methyl type silicone resin composition (refractive index of 1.53) and stirred for 5 minutes by a planetary mixer. Next, to release heat generate by the stirring treatment, the resin was left still for 30 minutes to cool to a constant temperature and stabilized. The curable composition 48 obtained in such a manner was packed in the aperture part of the package 40 to the line of the same plane of the top faces of both ends of the aperture. Finally, the composition was subjected to heating treatment of 70° C.×3 hours and 150° C.×1 hour. Accordingly, a light emitting face with a right and left symmetric and parabolic concaved shape from the top faces of both ends of the aperture toward the center part can be obtained. The potting member 48 made of the cured material of the curable composition was separated into two layers; a first layer with a high dispersant content and a second layer with a lower dispersant content than that of the first layer and the surface of the semiconductor light emitting device was coated with the first layer. Accordingly, luminescence emitted out of the semiconductor light emitting device could be taken to the outside and the evenness of the luminescence could be improved. The first layer was preferably formed continuously from the bottom face of the aperture part to the surface of the semiconductor light emitting device and consequently, the shape of the light emitting face could be the smooth aperture part. The light emitting device according to the Example could emit luminescence from the light emitting device from the main face side without vain and as compared with a conventional device, it could be made thin and radiate light rays to a wide range of a light impingent face of a photo-guiding board.

Example 21

A light emitting device was fabricated in the same manner as Example 20, except that the phosphor substance was added in the potting material 48. The phosphor substance could be obtained in the following manner. Coprecipitation was caused in a solution, which was obtained by dissolving rare earth metals such as Y, Gd, and Ce in stoichiometric ratios in an acid, by adding oxalic acid and the oxides of the coprecipitates obtained by firing the coprecipitates were mixed with aluminum oxide to obtain a raw material mixture. After being mixed with barium fluoride as a flux, the obtained raw material mixture was packed in a crucible and fired at 1,400° C. for 3 hours in air to obtain a fired product and the fired product was ball-milled in water, washed, separated, dried, and finally sieved to obtain the phosphor substance of $(Y_{0.995}Gd_{0.005})_{2.750}Al_{5012}:Ce_{0.250}$ with a mean particle size of 8 µm. Addition of the phosphor could provide a light emitting device capable of emitting mixed color light of a portion of the luminescence of the light emitting apparatus with the luminescence obtained by conversion of wavelength of the luminescence by the phosphor.

Example 22

In this Example, a light emitting apparatus is formed by packaging the device of Example 16 with phosphor materials according to the packaging method described in this specification. $BaAl_{12}O_{19}:Mn$ and $Sr_4Al_{14}O_{25}:Eu$ are used as phosphor materials. This apparatus emits blue-green light.

Example 23

Figure 16A:
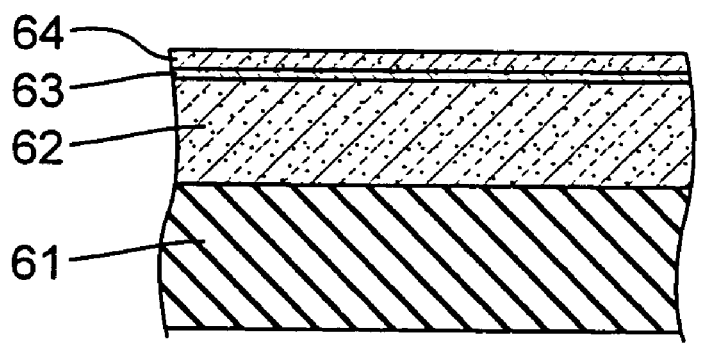
FIGS. 16A to 16L show process drawings illustrating a fabrication method of a nitride semiconductor device according to Example 23.

This Example will describe a laser fabricated by applying the invention with reference to FIGS. 16A to 16L. First, as shown in FIG. 16A, n-type nitride semiconductor layers 62, an active layer 63 and p-type semiconductor layers are formed on a sapphire substrate 61.

(Buffer Layer)

In this example, a sapphire was used as a substrate for growing nitride semiconductor 61. At first, a hetero substrate 61 made of a sapphire having the c-plane as a main face, and 2 inch Φ was set in a MOVPE reaction vessel and a buffer layer of GaN with a thickness of 200 Å was grown using trimethylgallium (TMG), ammonia ($NH_3$) at 500° C.

(Under Layer)

After buffer layer formation, a nitride semiconductor layer of undoped GaN with a thickness of 4 µm was grown using TMG and ammonia at 1,050° C. The layer worked as an under layer (a substrate for growing nitride semiconductor) for growing respective layers composing the device structure. A substrate for growing nitride semiconductor with good crystallinity could be obtained if a nitride semiconductor grown by ELOG (Epitaxially Laterally Overgrowth) besides the above-mentioned layer. A practical example of the ELOG layer includes layers formed by forming a nitride semiconductor layer on a hetero substrate, forming stripes of mask regions on the surface by forming protection films on which a nitride semiconductor is difficult to grow and non-mask regions on which the nitride semiconductor is to be formed, and growing the nitride semiconductor from the non-mask regions not only in the thickness direction but also in the lateral direction so as to grow the nitride semiconductor even on the mask regions and also by forming apertures in the nitride semiconductor layer grown on the hetero substrate and promoting growth of the layer in the lateral direction from the side faces of the apertures.

Next, the respective layers composing the laminate structure were formed on the under layer of the nitride semiconductor.

(n-Type Contact Layer)

Successively, an n-type contact layer of GaN doped with Si in a concentration of $4.5\times10^{18}/cm^3$ and with a thickness of 2.25 μm was grown at 1,050° C. by similarly using TMG, ammonia, and silane as an impurity gas. The thickness of the n-contact layer was satisfactory to be 2 to 30 μm.

(Crack Prevention Layer)

Next, a crack prevention layer of $In_{0.06}Ga_{0.94}N$ with a thickness of 0.15 μm was grown at 800° C. by using TMG, TMI (trimethylindium) and ammonia. The crack prevention layer may be omitted.

(n-Type Clad Layer)

Next, an A layer of undoped AlGaN with a thickness of 25 Å was grown at 1,050° C. by using TMA (trimethylaluminum), TMG, and ammonia as raw material gases and successively the supply of TMA was stopped, and a B layer of GaN doped with Si in a concentration of $5\times10^{18}/cm^3$ and with a thickness of 25 Å was grown using silane gas as an impurity gas. These steps were respectively repeated 160 times to reciprocally form the A layer and the B layer to grow an n-type clad layer composed of multilayered films (superlattice structure) in a total thickness of 8,000 Å. In this case if the mixed crystal ratio of Al in the undoped AlGaN was in a range not lower than 0.05 and not higher than 0.3, sufficiently high refractive index difference to work as a clad layer could be obtained.

(n-Type Photo-Guiding Layer)

Next, an n-type photo-guiding layer of undoped GaN with a thickness of 0.1 μm was grown at the same temperature using TMG and ammonia as raw material gases. The layer could be doped with an n-type impurity.

(Active Layer)

Next, a barrier layer of $In_{0.05}Ga_{0.95}N$ doped with Si in a concentration of $5\times10^{18}/cm^3$ and with a thickness of 100 Å was formed at 800° C. using TMI (trimethylindium), TMG, and ammonia as raw materials and silane gas as an impurity gas. Successively, the silane gas was stopped and a well layer of undoped $In_{0.1}Ga_{0.9}N$ with a thickness of 50 Å was formed. These steps were respectively repeated 3 times and finally the barrier layer was grown to form an active layer having the total thickness about 550 Å and a multilayer quantum well structure (MQW).

(p-Type Cap Layer)

Next, at the same temperature, a p-type electron-enclosing layer of AlGaN doped with Mg in a concentration of $1\times10^{19}/cm^3$ and with a thickness of 100 Å was grown using TMA, TMG, and ammonia as raw material gases and Cp$_2$Mg (cyclopentadienylmagnesium) as an impurity gas.

(p-Type Photo-Guiding Layer)

Next, a p-type photo-guiding layer of undoped GaN with a thickness of 750 Å was grown at 1,050° C. using TMG and ammonia as raw material gases. Although the p-type photo-guiding layer was grown while being undoped, the layer could be doped with Mg.

(p-Type Clad Layer)

Next, a layer of undoped $Al_{0.16}Ga_{0.84}N$ with a thickness of 25 Å was grown at 1,050° C. and successively the supply of TMA was stopped, and a layer of Mg-doped GaN with a thickness of 25 Å was grown using Cp$_2$Mg and consequently a p-type clad layer with a superlattice structure in a total thickness of 0.6 μm was grown. In the case the p-type clad layer was formed in a superlattice structure composed of layered nitride semiconductor layers of which one type layers were Al-containing nitride semiconductor layers and have different band gap energy from that of the other, the crystallinity tended to be made excellent if high concentration doping in one type layers, so-called modulated doping, was performed, however doping could be performed similarly in both type layers.

(p-Type Contact Layer)

Finally, a p-type contact layer of a p-type GaN doped with Mg in concentration of $1\times10^{20}/cm^3$ and with a thickness of 150 Å was grown on the p-type clad layer at 1,050° C. The p-type contact layer could be a p-type $In_xAl_yGa_{1-x-y}N$, ($x\leq$, $0 y\leq0, x+y\leq1$) and preferably, if the layer was of Mg-doped GaN, the most desirable ohmic contact with the p-electrode could be obtained. On completion of the reaction, the wafer was annealed at 700° C. in nitrogen atmosphere in the reaction vessel to further lower the resistance of the p-type layer.

In such a manner, as shown in FIG. 16A, a laminate body composed of the n-type nitride semiconductor layer 62, the active layer 63, and the p-type nitride semiconductor layer 64 on the sapphire substrate 61 was obtained.

(n-Type Layer Exposure And Resonance Face Formation)

Figure 16B:
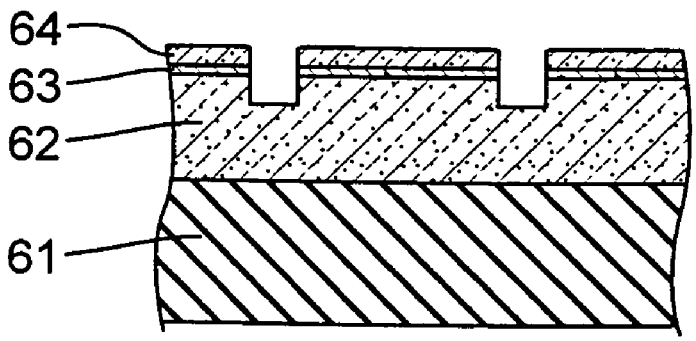

After the nitride semiconductor was formed in the above-mentioned manner, the wafer was taken out of the reaction vessel and a protection film of SiO$_2$ was formed on the surface of the uppermost layer, the p-type contact layer, and then the wafer was subjected to etching using SiCl$_4$ by RIE (reactive ion etching). Accordingly, as shown in FIG. 16B, an active layer end face to be a resonance face was exposed to give the etching end face as a resonance end face.

(Substrate Exposure)

Figure 16C:
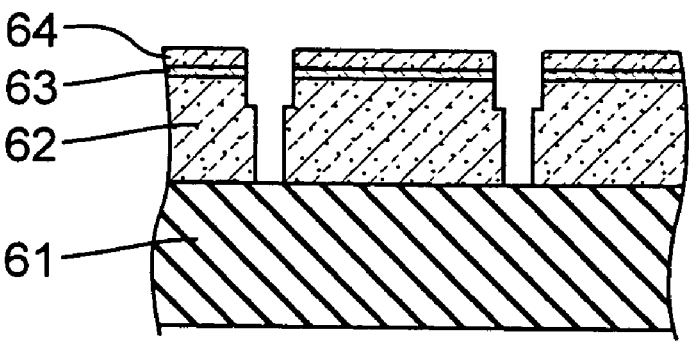

Next, after SiO$_2$ was formed on the entire surface of the wafer, a resists film was formed thereon except the exposed face of the n-type contact layer and as shown in FIG. 16C, etching was carried out until the substrate was exposed. Since the resist film was formed on the side faces of the resonance face, after the etching, end faces in two steps between the side faces (including the p-type layer, the active layer, and a portion of the n-type layer) of the resonance face formed before and the n-type layer existing between the resonance face and the substrate were formed.

(Stripe-Like Projected Part (Ridge) Formation)

Figure 16D:
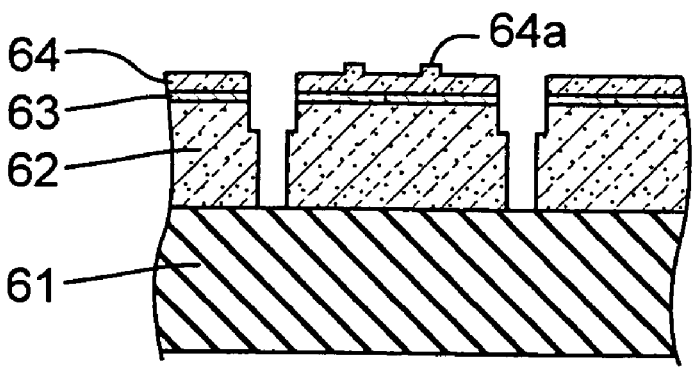

Next, as shown in FIG. 16D, a stripe-state waveguide region was formed. After the protection film of Si oxide (mainly SiO$_2$) with a thickness of 0.5 μm was formed on the entire surface of the uppermost layer, which is the p-type contact layer, by a CVD apparatus, a mask in stripes with 3 μm width was put on the protection film and SiO$_2$ was etched withy CF$_4$ by a RIE apparatus and after that, the nitride semiconductor layers were etched by SiCl$_4$ until the p-type guiding layer was exposed to form projected parts 64 in stripes projected more than the active layer.

(First Insulation Film)

While the SiO$_2$ being put as it was, a first insulating film of ZrO$_2$ was formed on the surface of the p-type semiconductor layer 64. Portions where on first insulation film was formed could be left, so that the first insulation film 65 was easily divided thereafter. After the first insulation film formation, the wafer was immersed in a buffered solution to dissolve and remove $SiO_2$ formed on the top faces of the projected parts in stripes and together with $SiO_2$, the $ZnO_2$ existing on the p-type contact layer (further on the n-type contact layer) was removed by lift-off method. Accordingly, the top faces of the projected parts in stripes were exposed and the side faces of the projected parts were covered with $ZrO_2$.

(p-Side Ohmic Electrode)

Figure 16E:
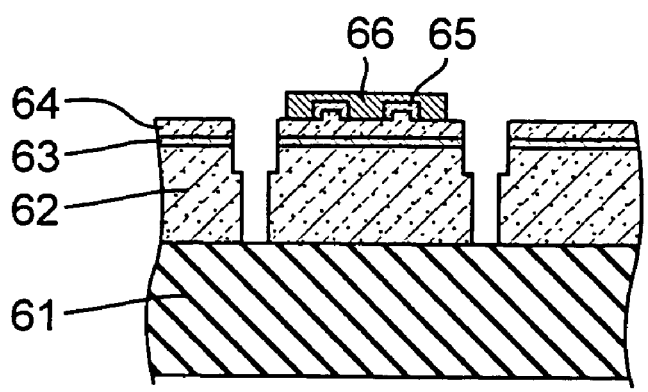

Next, as shown in FIG. 16E, a p-side ohmic electrode 65 was formed in the first insulation film on the uppermost faces of the projected parts on the p-type contact layer. The p-side ohmic electrode 65 consisted of Ni and Au. After the electrode formation, annealing at 600° C. was carried out in atmosphere containing oxygen and nitrogen in 1:99 (O:N) ratio to carry out alloying of the p-side ohmic electrode and obtain good ohmic characteristics.

(Second Insulation Film)

Next, a resist was applied to a portion of the p-side ohmic electrode on the projected parts in stripes and a second insulation film with a multilayer structure consisting of two pairs (4 layers) of Si oxide (mainly $SiO_2$) and Ti oxide (mainly $TiO_2$) with each film thickness of λ/4n was formed in the etched bottom face and side faces to form a mirror. In this case, the p-side ohmic electrode was kept exposed.

(p-Side Pad Electrode)

Next, as shown in FIG. 16E, a p-side pad electrode 66 was formed so as to cover the above-mentioned insulation films. The p-side pad electrode 66 was composed of a closely sticking layer, a barrier layer, and an eutectic layer and the respective layers were formed so as to be RhO—Pt—Au in this order with film thickness of 2,000 Å–3,000 Å–6,000 Å from the p-type semiconductor layer side.

(Protection Film Before Sticking First Supporting Substrate)

A resist film 67 with a thickness of 3 μm was formed so as to cover the entire surface of the wafer after formation of the p-side pad electrode 66.

Figure 16F:
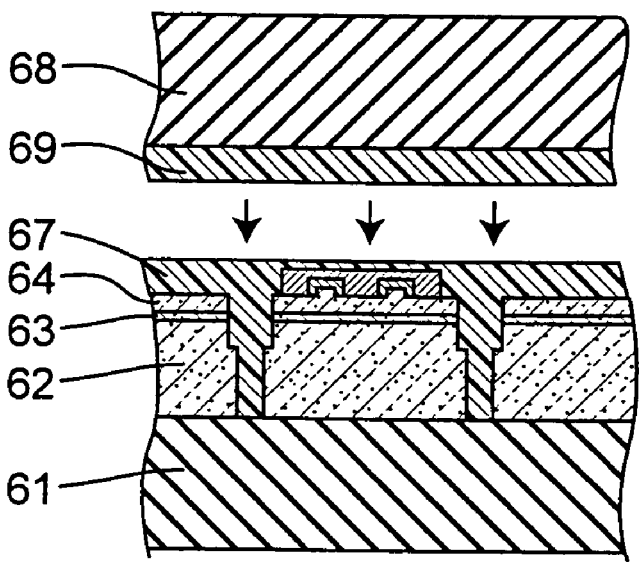

On the other hand, a first supporting substrate 68 was made ready. As the first supporting substrate 68, sapphire with a thickness of 425 μm was used. As shown in FIG. 16F), the sapphire and the p-type semiconductor layer side of the nitride semiconductor layers obtained in the above-mentioned manner were stuck to each other by inserting an epoxy type bonding sheet 69. In this case, the forgoing nitride semiconductor was stuck through the protection film formed after formation of the p-side pad electrode. Bonding was carried out by heating at about 150° C. for about 1 hour by a heating press.

(Separation of Substrate for Growing Nitride Semiconductor)

Figure 16G:
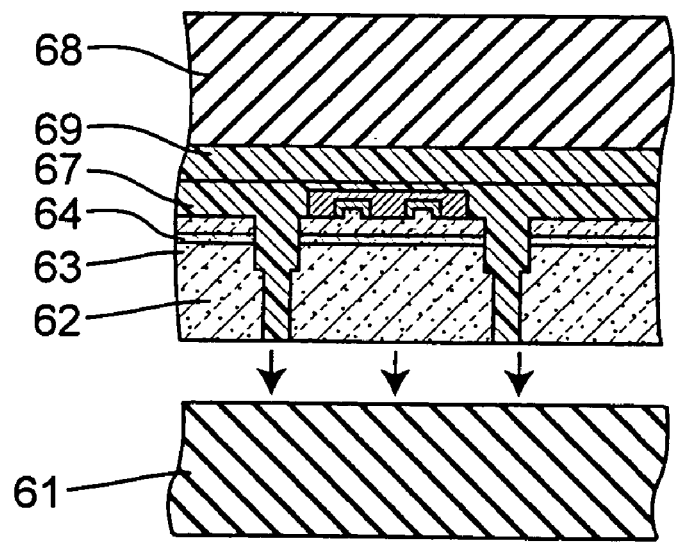

Next, as shown in FIG. 16G, the sapphire substrate 61, which was a substrate for growing nitride semiconductor, was removed by polishing. Further, polishing was continued until the n-type contact layer was exposed. The surface roughness was eliminated by chemical polishing using KOH and colloidal silica ($KSiO_3$).

(n-Side Electrode and n-side Metallizing Layer)

Figure 16H:
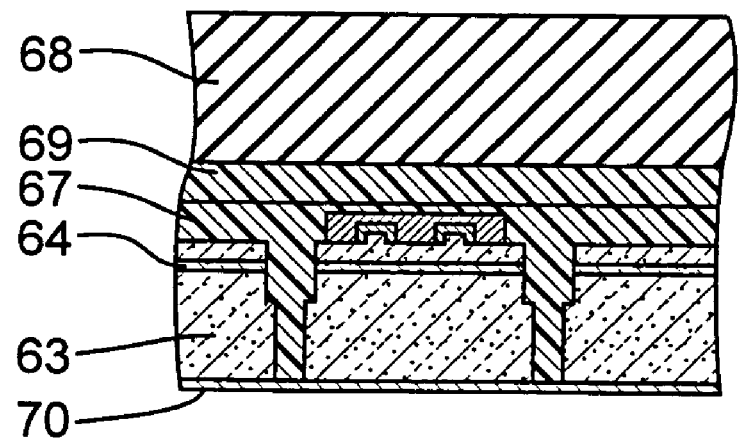

Next, as shown in FIG. 16H, an n-side metal layer 70 of Ti—Al—Ti—Pt—Sn in this order with thickness of 100 Å–2,500 Å–1,000 Å–2,000 Å–6,000 Å was formed on the foregoing n-type contact layer. The Ti—Al layer was an n-side electrode and the Ti—Pt—Sn thereon was a metallizing layer for eutectic formation.

On the other hand, a second supporting substrate 71 was made ready. A metallizing layer 72 of Ti—Pt—Au in this order with thickness of 2,000 Å–3,000 Å–12,000 Å was formed on the second supporting substrate 71 with a thickness of 200 μm and consisting of Cu 20% and W 80%.

(Sticking of Second Supporting Substrate)

Figure 16I:
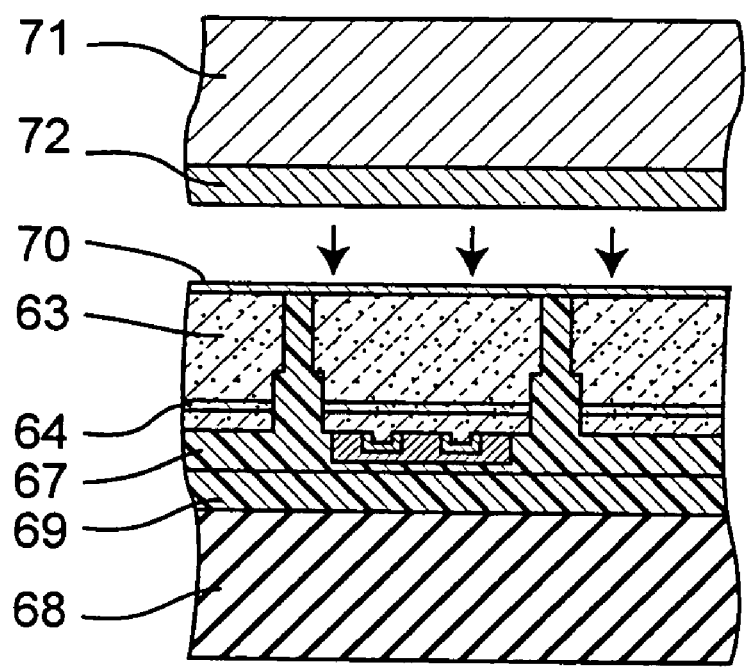

Next, as shown in FIG. 16I, the foregoing n-side metal layer 70 and the metallizing layer 72 of the second supporting substrate were set face to face and stuck to each other. Pressure was applied at 240° C. At that time, an eutectic was formed.

(Separation of First Supporting Substrate)

Figure 16J:
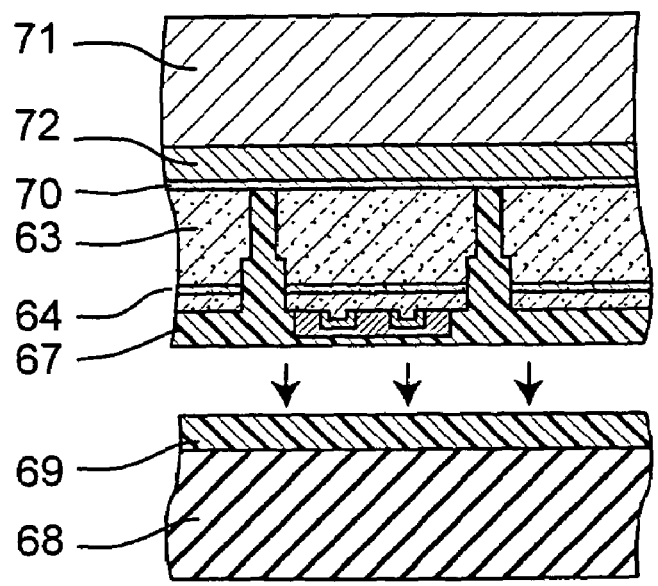

As described above, the wafer of nitride semiconductor layers sandwiched between the first supporting substrate 68 and the second supporting substrate 71 was heated to about 200° C. Accordingly, the adhesion strength of the epoxy type adhesion sheet 69 was decreased, so that the first supporting substrate 68 could be separated as shown in FIG. 16J. After the protection film (resist) 67 formed on the p-side pad electrode was removed shown in FIG. 16K, dicing was carried out to obtain chips.

Figure 16K:
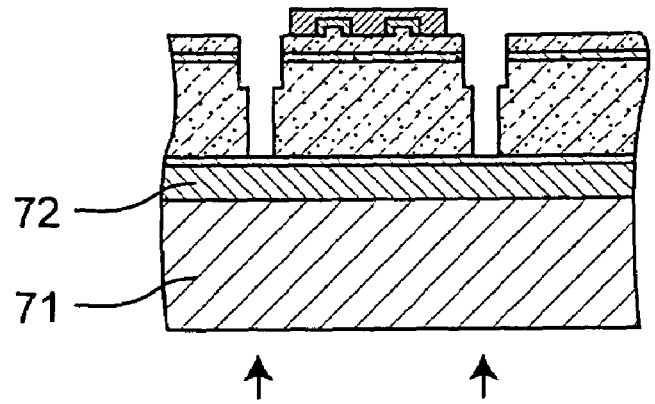
Figure 16L:
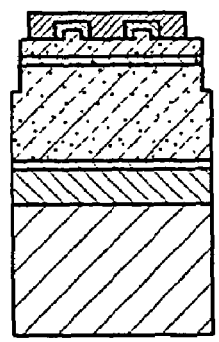

In such a manner as described above, a nitride semiconductor laser device shown in FIG. 16L was obtained. The laser device had a threshold current density of 1.5 $kA/cm^2$ and a threshold voltage of 3.5 V.

Example 24

In this Example, same processes to the second protection film formation of Example 23 were carried out.

(Filler)

As shown in FIG. 16F, a p-side pad electrode 66 composed of layering RhO—Pt—Au in this order was formed on the p-side ohmic electrode 65. The p-side pad electrode 66 was composed of a closely sticking layer, a barrier layer, and an eutectic layer and the respective layers were formed in thickness of 2,000 Å–3,000 Å–6,000 Å in RhO—Pt—Au order from the p-type semiconductor layer side. Next, a polyimide was applied to the groove parts formed by etching to make the entire body of the wafer flat.

On the other hand, a first supporting substrate 68 was made ready. As the first supporting substrate 68, sapphire with a thickness of 425 μm was used and as an adhesive, an eutectic material of AuSn was used. As shown in FIG. 16G, the eutectic material was stuck to the p-type semiconductor layer side of the nitride semiconductor layers obtained in the above-mentioned manner. In this case, the bonding was carried out through the protection film formed after formation of the p-side pad electrode. The bonding was carried out by heating at about 240° C. for about 10 minutes by a heating press.

(Separation of Substrate for Growing Nitride Semiconductor)

Next, as shown in FIG. 16G, the sapphire substrate 61, which was a substrate for growing nitride semiconductor, was removed by polishing. Further, polishing was continued until the n-type contact layer was exposed and the surface roughness was eliminated by chemical polishing using KOH and colloidal silica ($K_2SiO_3$).

(n-Side Electrode and n-side Metallizing Layer)

A Si oxide film formed as a second protection film was removed using hydrofluoric acid. Next, as shown in FIG. 16H, an n-side metal layer 70 of Ti—Al—Ti—Pt—Sn in this order with thickness of 100 Å–2,500 Å–1,000 Å–2,000 Å–6,000 Å was formed on the n-type contact layer.

On the other hand, a second supporting substrate 71 was made ready. A metallizing layer 72 of Ti—Pt—Pd in this order with thickness of 2,000 Å–3,000 Å–12,000 Å was formed on the second supporting substrate 71 with a thickness of 200 μm and consisting of Cu 20% and W 80%.

(Sticking of Second Supporting Substrate)

Next, as shown in FIG. 16I, the foregoing n-side metal layer 70 and the metallizing layer 72 of the second substrate were set face to face and stuck to each other. Pressure was applied at 240° C. At that time, an eutectic was formed.

(Separation of First Supporting Substrate)

As described above, the wafer of nitride semiconductor layers sandwiched between the first supporting substrate 68 and the second supporting substrate 71 was heated to about 200° C. Accordingly, the adhesion strength of the epoxy type adhesion sheet 69 was decreased, so that the first supporting substrate 68 could be separated as shown in FIG. 16J. After that, as shown in FIG. 16K, the protection film (the polyimide) formed on the p-side pad electrode was removed and then the polyimide packed-layer was removed by oxygen plasma and dicing was carried out.

The nitride semiconductor laser device obtained in such a manner had a threshold current density of 1.5 kA/cm$^2$ and a threshold voltage of 3.5 V.

Example 25

Figure 17A:
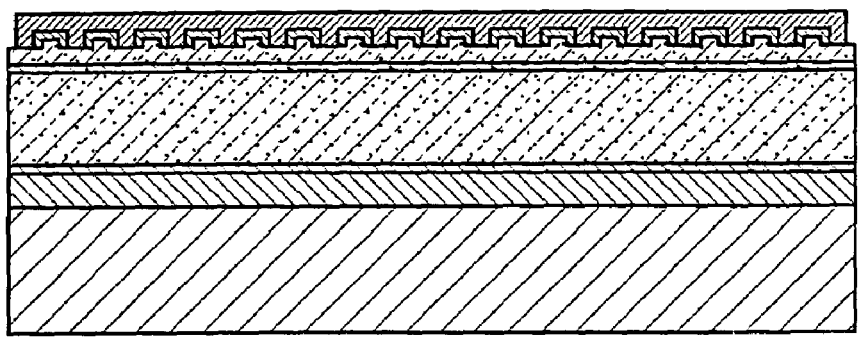
FIGS. 17A and 17B are schematic cross-sectional views showing a nitride semiconductor laser according to Example 23.

In this example, a multistripe type nitride semiconductor laser device having 30 ridges with 3 μm width at 60 μm intervals was fabricated. Other points were same as those of Example 23. FIG. 17A shows the multistripe type nitride semiconductor laser device. To simplify the drawing, the number of the ridges is 15 in FIG. 17A. In such a multistripe type, the lateral width (the width of the end face in the perpendicular direction to the ridges) becomes wider as the number of the ridges is increased more and the laser device becomes a bar-like laser device. Formation of a plurality of ridges in a given direction gives high output power. The nitride semiconductor laser obtained in this Example had a threshold current density of 1.5 kA/cm$^2$ and a threshold voltage of 3.5 V at a room temperature. In this case, laser beam is evenly oscillated from the respective stripes and the maximum output was 10 W.

Figure 17B:
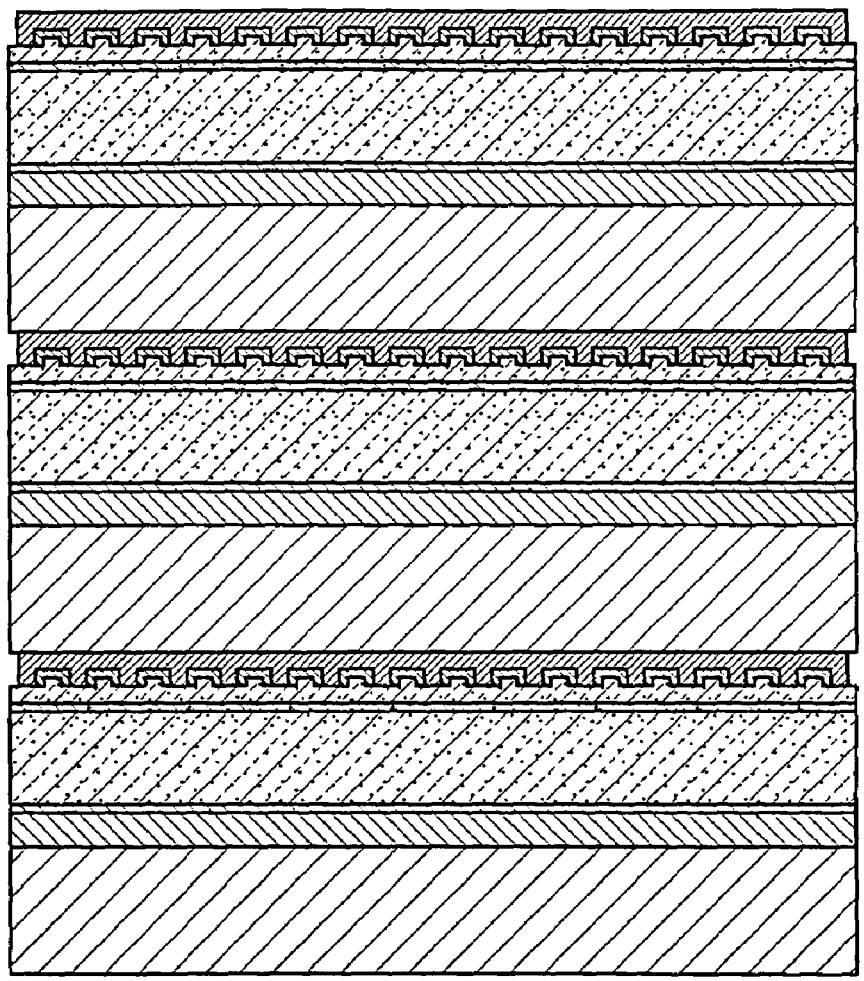
Figure 18:
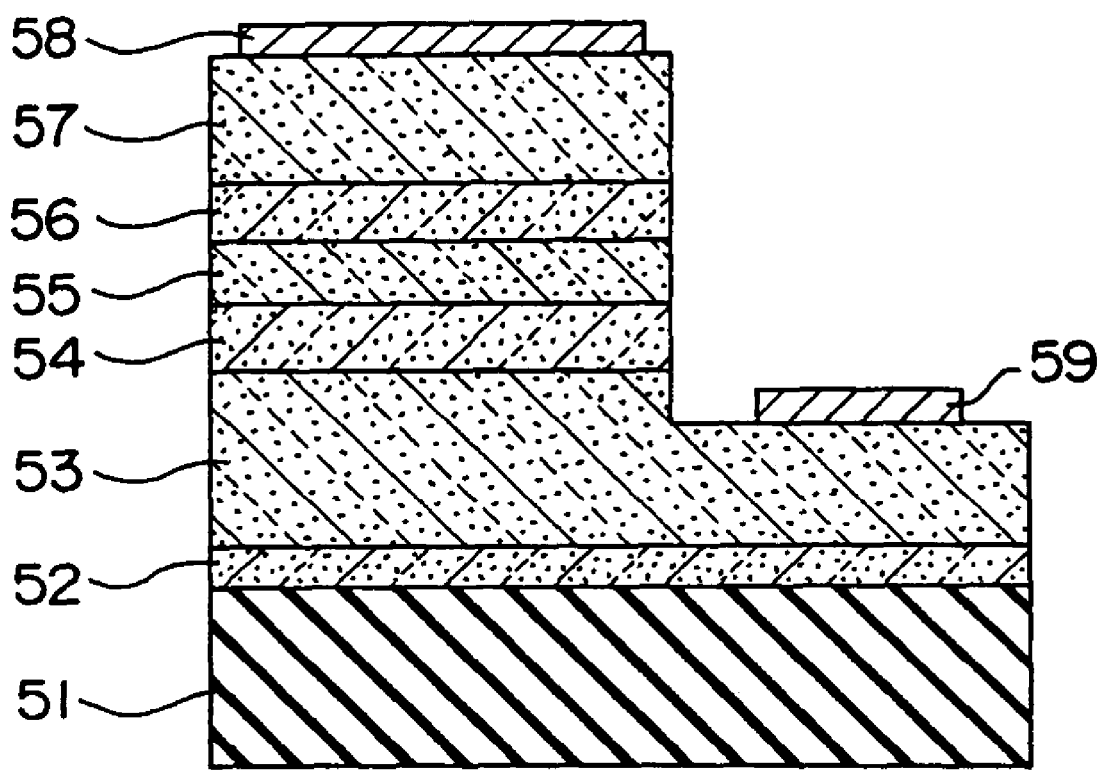
FIG. 18 is a schematic cross-sectional view showing the structure of a conventional nitride semiconductor device.

Further, the multistripe type nitride semiconductor laser device obtained in this Example can be used while being stacked. For example, as shown in FIG. 17B, bar-type laser devices are stacked so as to form a plurality of ridges in the two-dimensional directions and obtain a stack type semiconductor laser and consequently a semiconductor laser with a super high output can be obtained. Each of the multistripe type nitride semiconductor laser devices has the maximum output of 10 W and in the case of a stack type semiconductor laser obtained by stacking multistripe type semiconductor laser devices in 10 layers, the output power can be as super high as about 100 W. In this case, each laser device had a threshold current density 1.5 kA/cm$^2$ and a threshold voltage of 3.5 V at a room temperature and laser beam is evenly oscillated from the respective stripes.

What is claimed is:

1. A nitride semiconductor device comprising:
   a substrate having two opposed main faces and having a thermal expansion coefficient higher than that of a nitride semiconductor;
   a bonding layer placed on one main face of said substrate and comprising an eutectic layer;
   a p-electrode on said bonding layer;
   one or more p-type nitride semiconductor layers electrically connected to the p-electrode;
   an active layer comprising at least a well layer of $Al_aIn_bGa_{1-a-b}N$, ($0 \leq a \leq 1$, $0 \leq b \leq 1$, $a+b \leq 1$) and a barrier layer of $Al_cIn_dGa_{1-c-d}N$, ($0 \leq c \leq 1$, $0 \leq d \leq 1$, $c+d \leq 1$), the active layer being on said p-type nitride semiconductor layers; and
   one or more n-type nitride semiconductor layers on said active layer;
   a n-electrode electrically connected to one or more of said n-type nitride semiconductor layers;
   wherein said p-type nitride semiconductor layers, said active layer and said n-type nitride semiconductor layers are sandwiched between said p-electrode and said n-electrode, and
   wherein said n-type nitride semiconductor layers contain Al at least in a part of said n-type nitride semiconductor layers that is in contact with said n-electrode.

2. The nitride semiconductor device according to claim 1, wherein said substrate is conductive.

3. The nitride semiconductor device according to claim 1, wherein said substrate includes one or more metals selected from Ag, Cu, Au and Pt and one or more metals selected from W, Mo, Cr and Ni.

4. The nitride semiconductor device according to claim 1, wherein said substrate is made of a metal composite comprising two or more metals, wherein the two or more metals have substantially no solid solubility in each other.

5. The nitride semiconductor device according to claim 1, wherein said substrate is a composite of a metal and a ceramic.

6. The nitride semiconductor device according to claim 1, wherein said nitride semiconductor device comprises an n-electrode contacting with the surface of said n-type nitride semiconductor layers,
   and wherein said n-type nitride semiconductor layers comprising at least two layers; a first n-type nitride semiconductor layer doped with an n-type impurity as a layer contacting with said n-electrode and a second n-type nitride semiconductor layer un-doped or doped with an n-type impurity in a less amount than that of said first n-type nitride semiconductor layer near to said active layer side than said first n-type nitride semiconductor layer.

7. The nitride semiconductor device according to claim 1, wherein said p-type nitride semiconductor layers include a p-type contact layer of $Al_fGa_{1-f}N$, ($0 < f < 1$).

8. The nitride semiconductor device according to claim 7, wherein said p-type contact layer has a graded composition with a high p-type impurity concentration and a small mixed crystal ratio of Al in the substrate side.

9. The nitride semiconductor device according to claim 8, wherein said p-type contact layer is composed of two layers and said two layers are an $Al_gGa_{1-g}N$, ($0 < g < 0.05$) layer formed adjacent to said p-electrode and an $Al_hGa_{1-h}N$, ($0 < h < 0.1$) layer formed adjacent to the active layer side and said $Al_gGa_{1-g}N$, ($0 < g < 0.05$) layer has a higher p-type impurity concentration than that of said $Al_hGa_{1-h}N$, ($0 < h < 0.1$) layer.

10. The nitride semiconductor device according to claim 1, wherein said nitride semiconductor device is a light emitting device and comprises a coating layer containing a phosphor substance capable of absorbing light from said light emitting device and emitting luminescence with wavelength difference from that of the light emitting device and said coating layer is formed in at least a portion of the surface of said light emitting device.

11. A nitride semiconductor device comprising:
a substrate having two opposed main faces;
a bonding layer placed on one main face of said substrate and comprising an eutectic layer;
a p-electrode on said bonding layer;
one or more p-type nitride semiconductor layers electrically connected to the p-electrode;
an active layer comprising at least a well layer of $Al_aIn_bGa_{1-a-b}N$, ($0 \leq a \leq 1$, $0 \leq b \leq 1$, $a+b \leq 1$) and a barrier layer of $Al_cIn_dGa_{1-c-d}N$, ($0 \leq c \leq 1$, $0 \leq d \leq 1$, $c+d \leq 1$), the active being on said p-type nitride semiconductor layers; and
n-type nitride semiconductor layers on said active layer
an n-electrode electrically connected to one or more of said n-type nitride semiconductor layers;
wherein said p-type nitride semiconductor layers, said active layer and said n-type nitride semiconductor layers are sandwiched between said p-electrode and said n-electrode, and
wherein at least a part of said n-type nitride semiconductor layers, the part that is in contact with said n-electrode, is made of a nitride semiconductor which does not substantially absorb the light emitted from said active layer.

12. The nitride semiconductor device according to claim 11, wherein said nitride semiconductor device comprises an n-electrode contacting with the surface of said n-type nitride semiconductor layers
and wherein said n-type nitride semiconductor layers comprising at least two layers; a first n-type nitride semiconductor layer doped with an n-type impurity as a layer contacting with said n-electrode and a second n-type nitride semiconductor layer un-doped or doped with an n-type impurity in a less amount than that of said first n-type nitride semiconductor layer near to said active layer side than said first n-type nitride semiconductor layer.

13. The nitride semiconductor device according to claim 11, wherein said p-type nitride semiconductor layers include a p-type contact layer of $Al_fGa_{1-f}N$, ($0<f<1$).

14. The nitride semiconductor device according to claim 13, wherein said p-type contact layer has a graded composition with a high p-type impurity concentration and a small mixed crystal ratio of Al in the substrate side.

15. The nitride semiconductor device according to claim 14, wherein said p-type contact layer is composed of two layers and said two layers are an $Al_gGa_{1-g}N$, ($0<g<0.05$) layer formed adjacent to said p-electrode and an $Al_hGa_{1-h}N$, ($0<h<0.1$) layer formed adjacent to the active layer side and said $Al_gGa_{1-g}N$, ($0<g<0.05$) layer has a higher p-type impurity concentration than that of said $Al_hGa_{1-h}N$, ($0<h<0.1$) layer.

16. The nitride semiconductor device according to claim 11, wherein said nitride semiconductor device is a light emitting device and comprises a coating layer containing a phosphor substance capable of absorbing light from said light emitting device and emitting luminescence with wavelength difference from that of the light emitting device and said coating layer is formed in at least a portion of the surface of said light emitting device.

* * * * *